(12) United States Patent
Hutchings et al.

(10) Patent No.: US 9,494,967 B2
(45) Date of Patent: Nov. 15, 2016

(54) TRIGGER CIRCUITS AND EVENT COUNTERS FOR AN IC

(71) Applicant: Altera Corporation, San Jose, CA (US)

(72) Inventors: Brad Hutchings, Provo, UT (US); Jason Redgrave, Mountain View, CA (US); Dai Huang, Cupertino, CA (US); Steven Teig, Menlo Park, CA (US)

(73) Assignee: Altera Corporation, San Jose, CA (US)

( * ) Notice: Subject to any disclaimer, the term of this patent is extended or adjusted under 35 U.S.C. 154(b) by 113 days.

(21) Appl. No.: 14/279,159

(22) Filed: May 15, 2014

(65) Prior Publication Data

US 2014/0337660 A1 Nov. 13, 2014

Related U.S. Application Data

(63) Continuation of application No. 13/645,314, filed on Oct. 4, 2012, now Pat. No. 8,755,484, which is a continuation of application No. 13/021,702, filed on Feb. 4, 2011, now Pat. No. 8,295,428, which is a continuation of application No. PCT/US2008/088492, filed on Dec. 29, 2008.

(60) Provisional application No. 61/086,145, filed on Aug. 4, 2008, provisional application No. 61/098,732, filed on Sep. 19, 2008.

(51) Int. Cl.
*H03K 19/0175* (2006.01)
*G06F 1/04* (2006.01)
*G06M 3/00* (2006.01)
*H03K 19/177* (2006.01)

(52) U.S. Cl.
CPC .................. *G06F 1/04* (2013.01); *G06M 3/00* (2013.01); *H03K 19/17736* (2013.01); *H03K 19/017581* (2013.01); *H03K 19/1776* (2013.01); *H03K 19/17728* (2013.01); *H03K 19/17748* (2013.01); *H03K 19/17764* (2013.01)

(58) Field of Classification Search
None
See application file for complete search history.

(56) References Cited

U.S. PATENT DOCUMENTS

| 5,291,489 A | 3/1994 | Morgan et al. |
| 5,425,036 A | 6/1995 | Liu et al. |
| 5,578,946 A | 11/1996 | Carberry et al. |
| 5,650,734 A | 7/1997 | Chu et al. |

(Continued)

FOREIGN PATENT DOCUMENTS

| EP | 2174215 | 4/2010 |
| WO | WO 2009/002600 | 12/2008 |
| WO | WO 2009/039462 | 3/2009 |
| WO | WO 2010/016857 | 2/2010 |
| WO | WO 2011/035076 | 3/2011 |

OTHER PUBLICATIONS

U.S. Appl. No. 14/261,886, filed Apr. 25, 2014, Tabula, Inc.

(Continued)

*Primary Examiner* — Tuan T Lam

(57) ABSTRACT

Some embodiments provide an integrated circuit ("IC"). The IC includes multiple configurable circuits that configurably perform operations of a user design based on configuration data. The IC also includes a configurable trigger circuit that receives a set of configuration data that specifies an operational event. The configurable trigger circuit also determines whether the operational event has occurred during implementation of the user design of the IC. Additionally, the operational trigger event outputs a trigger signal upon determining that the operational trigger event has occurred.

14 Claims, 53 Drawing Sheets

(56) References Cited

U.S. PATENT DOCUMENTS

| | | |
|---|---|---|
| 5,654,650 A | 8/1997 | Gissel |
| 5,751,735 A | 5/1998 | Tobin et al. |
| 5,811,985 A | 9/1998 | Trimberger et al. |
| 5,822,217 A | 10/1998 | Shenoy et al. |
| 5,883,525 A | 3/1999 | Tavana et al. |
| 5,889,677 A | 3/1999 | Yasuda et al. |
| 5,920,712 A | 7/1999 | Kuijsten |
| 5,970,240 A | 10/1999 | Chen et al. |
| 6,002,861 A | 12/1999 | Butts et al. |
| 6,003,150 A | 12/1999 | Stroud et al. |
| 6,020,758 A | 2/2000 | Patel et al. |
| 6,038,392 A | 3/2000 | Ashar et al. |
| 6,107,821 A | 8/2000 | Kelem et al. |
| 6,152,612 A | 11/2000 | Liao et al. |
| 6,175,247 B1 | 1/2001 | Scalera et al. |
| 6,389,558 B1 | 5/2002 | Herrmann et al. |
| 6,421,784 B1 | 7/2002 | Chu et al. |
| 6,446,249 B1 | 9/2002 | Wang et al. |
| 6,460,148 B2 | 10/2002 | Veenstra et al. |
| 6,539,535 B2 | 3/2003 | Butts et al. |
| 6,546,464 B2 | 4/2003 | Fortuna et al. |
| 6,611,153 B1 | 8/2003 | Lien et al. |
| 6,629,308 B1 | 9/2003 | Baxter |
| 6,668,237 B1 | 12/2003 | Guccione et al. |
| 6,681,353 B1 | 1/2004 | Barrow |
| 6,684,348 B1 | 1/2004 | Edwards et al. |
| 6,691,266 B1 | 2/2004 | Winegarden et al. |
| 6,691,301 B2 | 2/2004 | Bowen |
| 6,701,494 B2 | 3/2004 | Giddens et al. |
| 6,704,889 B2 | 3/2004 | Veenstra et al. |
| 6,711,729 B1 | 3/2004 | McElvain et al. |
| 6,725,442 B1 | 4/2004 | Cote et al. |
| 6,731,133 B1 | 5/2004 | Feng et al. |
| 6,748,456 B1 | 6/2004 | Stanton et al. |
| 6,750,675 B2 | 6/2004 | Venkata et al. |
| 6,791,352 B2 | 9/2004 | Verdoorn et al. |
| 6,802,026 B1 | 10/2004 | Patterson et al. |
| 6,810,513 B1 | 10/2004 | Vest |
| 6,823,224 B2 | 11/2004 | Wood et al. |
| 6,829,751 B1 | 12/2004 | Shen et al. |
| 6,870,397 B1 | 3/2005 | Fox et al. |
| 6,889,368 B1 | 5/2005 | Mark et al. |
| 6,897,678 B2 | 5/2005 | Zaveri et al. |
| 6,937,681 B2 | 8/2005 | Watanabe |
| 6,954,916 B2 | 10/2005 | Bernstein et al. |
| 6,996,738 B2 | 2/2006 | Chiang |
| 7,010,667 B2 | 3/2006 | Vorbach et al. |
| 7,073,158 B2 | 7/2006 | McCubbrey |
| 7,085,858 B1 | 8/2006 | Fox et al. |
| 7,095,247 B1 | 8/2006 | Tang et al. |
| 7,120,883 B1 | 10/2006 | van Antwerpen et al. |
| 7,126,373 B1 | 10/2006 | Schmit et al. |
| 7,126,856 B2 | 10/2006 | Sun et al. |
| 7,143,329 B1 | 11/2006 | Trimberger et al. |
| 7,157,933 B1 | 1/2007 | Schmit et al. |
| 7,193,440 B1 | 3/2007 | Schmit et al. |
| 7,200,776 B2 | 4/2007 | Harris |
| 7,219,265 B2 | 5/2007 | Yee |
| 7,224,182 B1 | 5/2007 | Hutchings et al. |
| 7,230,869 B1 | 6/2007 | Redgrave et al. |
| 7,231,339 B1 | 6/2007 | Nemecek et al. |
| 7,233,169 B1 | 6/2007 | Vadi |
| 7,274,213 B1 | 9/2007 | Meyer et al. |
| 7,298,169 B2 | 11/2007 | Hutchings et al. |
| 7,308,564 B1 | 12/2007 | Jenkins, IV |
| 7,330,912 B1 | 2/2008 | Fox et al. |
| 7,353,489 B2 | 4/2008 | Dowling |
| 7,375,550 B1 * | 5/2008 | Redgrave ............... G06F 7/764 326/38 |
| 7,409,652 B1 | 8/2008 | Fox et al. |
| 7,412,343 B2 | 8/2008 | Stroud et al. |
| 7,424,655 B1 | 9/2008 | Trimberger |
| 7,443,196 B2 | 10/2008 | Redgrave et al. |
| 7,454,658 B1 | 11/2008 | Baxter |
| 7,467,335 B2 | 12/2008 | Otto et al. |
| 7,501,855 B2 | 3/2009 | Hutchings et al. |
| 7,512,850 B2 | 3/2009 | Redgrave et al. |
| 7,548,085 B2 | 6/2009 | Hutchings et al. |
| 7,550,991 B2 | 6/2009 | Redgrave et al. |
| 7,576,557 B1 | 8/2009 | Tseng et al. |
| 7,576,558 B1 | 8/2009 | Lysaght et al. |
| 7,579,867 B2 | 8/2009 | Hutchings et al. |
| 7,589,557 B1 | 9/2009 | Bergendahl et al. |
| 7,595,655 B2 | 9/2009 | Hutchings et al. |
| 7,620,883 B1 | 11/2009 | Carmichael et al. |
| 7,650,248 B1 | 1/2010 | Baxter |
| 7,652,498 B2 | 1/2010 | Hutchings et al. |
| 7,702,978 B2 | 4/2010 | Lewis et al. |
| 7,728,617 B2 | 6/2010 | Redgrave et al. |
| 7,737,740 B2 | 6/2010 | Millar et al. |
| 7,743,296 B1 | 6/2010 | Pierce et al. |
| 7,786,749 B1 | 8/2010 | Syu et al. |
| 7,788,478 B2 | 8/2010 | Redgrave et al. |
| 7,805,593 B1 | 9/2010 | Donlin |
| 7,839,162 B2 | 11/2010 | Hutchings |
| 7,886,247 B2 | 2/2011 | Fatemi et al. |
| 7,973,558 B2 | 7/2011 | Hutchings et al. |
| 8,037,340 B2 | 10/2011 | Kim et al. |
| 8,069,425 B2 | 11/2011 | Hutchings et al. |
| 8,072,234 B2 | 12/2011 | Fox |
| 8,115,510 B2 | 2/2012 | Redgrave et al. |
| 8,143,915 B2 | 3/2012 | Hutchings |
| 8,295,428 B2 | 10/2012 | Hutchings et al. |
| 8,412,990 B2 | 4/2013 | Hutchings et al. |
| 8,429,579 B2 | 4/2013 | Hutchings et al. |
| 8,433,891 B2 | 4/2013 | Redgrave et al. |
| 8,479,069 B2 | 7/2013 | Miller et al. |
| 8,525,548 B2 | 9/2013 | Hutchings et al. |
| 8,598,909 B2 | 12/2013 | Hutchings |
| 8,755,484 B2 | 6/2014 | Hutchings et al. |
| 2001/0033188 A1 | 10/2001 | Aung et al. |
| 2001/0037477 A1 | 11/2001 | Veenstra et al. |
| 2002/0089349 A1 | 7/2002 | Barbier et al. |
| 2002/0093371 A1 | 7/2002 | Atkinson |
| 2002/0194543 A1 | 12/2002 | Veenstra et al. |
| 2003/0033584 A1 | 2/2003 | Zaveri et al. |
| 2003/0110430 A1 | 6/2003 | Bailis et al. |
| 2003/0217345 A1 | 11/2003 | Rajsuman et al. |
| 2004/0041610 A1 | 3/2004 | Kundu |
| 2004/0225970 A1 | 11/2004 | Oktem |
| 2004/0236534 A1 | 11/2004 | Wheless, Jr. et al. |
| 2005/0046458 A1 | 3/2005 | Schroeder et al. |
| 2005/0132316 A1 | 6/2005 | Suaris et al. |
| 2005/0216671 A1 | 9/2005 | Rothman et al. |
| 2005/0246520 A1 | 11/2005 | Vadi et al. |
| 2006/0125517 A1 | 6/2006 | van Wageningen et al. |
| 2006/0176075 A1 | 8/2006 | Or-Bach |
| 2006/0220716 A1 | 10/2006 | Nicolaidis |
| 2006/0251416 A1 | 11/2006 | Letner et al. |
| 2007/0006053 A1 | 1/2007 | Otto et al. |
| 2007/0007999 A1 | 1/2007 | Graham et al. |
| 2007/0226541 A1 | 9/2007 | Brunot et al. |
| 2008/0028347 A1 | 1/2008 | Hiraoglu et al. |
| 2008/0046851 A1 | 2/2008 | Miczo |
| 2008/0122484 A1 | 5/2008 | Zhu et al. |
| 2008/0133866 A1 | 6/2008 | Dickenson |
| 2008/0276208 A1 | 11/2008 | Albrecht et al. |
| 2008/0304425 A1 | 12/2008 | Karaoguz |
| 2009/0172351 A1 | 7/2009 | Vorbach et al. |
| 2009/0213946 A1 | 8/2009 | Dick et al. |
| 2009/0237110 A1 | 9/2009 | Lunzer et al. |
| 2011/0029830 A1 | 2/2011 | Miller et al. |
| 2012/0112786 A1 | 5/2012 | Fox |
| 2014/0109028 A1 | 4/2014 | Hutchings et al. |

OTHER PUBLICATIONS

Portions of prosecution history of U.S. Appl. No. 11/375,562, Jun. 24, 2010, Redgrave, Jason, et al.

Portions of prosecution history of U.S. Appl. No. 12/870,779, Apr. 4, 2013, Redgrave, Jason, et al.

Portions of prosecution history of U.S. Appl. No. 11/375,363, Sep. 26, 2008, Redgrave, Jason, et al.

(56) References Cited

OTHER PUBLICATIONS

Portions of prosecution history of U.S. Appl. No. 12/235,581, Apr. 2, 2010, Redgrave, Jason, et al.
Portions of prosecution history of U.S. Appl. No. 12/754,603, Nov. 9, 2011, Redgrave, Jason, et al.
Portions of prosecution history of U.S. Appl. No. 11/375,370, Feb. 13, 2009, Redgrave, Jason, et al.
Portions of prosecution history of U.S. Appl. No. 11/375,369, Jan. 27, 2009, Redgrave, Jason, et al.
Portions of prosecution history of U.S. Appl. No. 14/261,886, Sep. 10, 2014, Tabula, Inc.
Portions of prosecution history of U.S. Appl. No. 11/375,561, Jan. 30, 2009, Hutchings, Brad, et al.
Portions of prosecution history of U.S. Appl. No. 11/769,680, Nov. 4, 2011, Hutchings, Brad, et al.
Portions of prosecution history of U.S. Appl. No. 13/291,087, Mar. 22, 2013, Hutchings, Brad, et al.
Portions of prosecution history of U.S. Appl. No. 13/864,507, Aug. 28, 2014, Tabula, Inc.
Portions of prosecution history of U.S. Appl. No. 11/769,683, Nov. 30, 2012, Hutchings, Brad, et al.
Portions of prosecution history of U.S. Appl. No. 11/769,686, May 15, 2009, Hutchings, Brad, et al.
Portions of prosecution history of U.S. Appl. No. 11/769,706, May 21, 2009, Hutchings, Brad, et al.
Portions of prosecution history of U.S. Appl. No. 11/769,703, Dec. 17, 2008, Hutchings, Brad, et al.
Portions of prosecution history of U.S. Appl. No. 11/769,702, Oct. 8, 2010, Hutchings, Brad.
Portions of prosecution history of U.S. Appl. No. 12/952,177, filed Mar. 5, 2012, Hutchings, Brad, et al.
Portions of prosecution history of U.S. Appl. No. 13/367,351, Nov. 7, 2013, Hutchings, Brad.
Portions of prosecution history of U.S. Appl. No. 11/769,701, Sep. 4, 2009, Hutchings, Brad, et al.
Portions of prosecution history of U.S. Appl. No. 12/637,745, Jun. 1, 2011, Hutchings, Brad, et al.
Portions of prosecution history of U.S. Appl. No. 12/679,305, Jul. 28, 2014, Miller, Marc, et al.
Portions of prosecution history of U.S. Appl. No. 12/728,194, Feb. 26, 2013, Miller, Marc, et al.
Portions of prosecution history of U.S. Appl. No. 12/785,484, Oct. 28, 2011, Fox, Brian.
Portions of prosecution history of U.S. Appl. No. 13/291,095, Sep. 4, 2014, Fox, Brian.
Portions of prosecution history of U.S. Appl. No. 13/057,477, Aug. 2, 2013, Hutchings, Brad, et al.
Portions of prosecution history of U.S. Appl. No. 13/021,702, Jun. 12, 2012, Hutchings, Brad, et al.
Portions of prosecution history of U.S. Appl. No. 13/645,314, Feb. 14, 2014, Tabula, Inc.
International Search Report and Written Opinion for PCT/US2008/061072, Sep. 15, 2008 (mailing date), Tabula, Inc.
International Preliminary Report on Patentability for PCT/US2008/061072, Jan. 14, 2010 (mailing date), Tabula, Inc.
Portions of prosecution history of EP 08746482.2, Nov. 27, 2013 (mailing date), Tabula, Inc.
International Search Report and Written Opinion for PCT/US2008/077141, Dec. 18, 2008 (mailing date), Tabula, Inc.
International Preliminary Report on Patentability for PCT/US2008/077141, Mar. 24, 2010 (issuance date), Tabula, Inc.
International Search Report and Written Opinion for PCT/US2008/088492, Mar. 20, 2009 (mailing date), Tabula, Inc.
International Preliminary Report on Patentability for PCT/US2008/088492, Feb. 8, 2011 (issuance date), Tabula, Inc.
International Search Report and Written Opinion for PCT/US2010/049198, Nov. 15, 2010 (mailing date), Tabula, Inc.
International Preliminary Report on Patentability for PCT/US2010/049198, Mar. 27, 2012 (issuance date), Tabula, Inc.
Altera Corp., "Section V. In-System Design Debugging," Quartus II Handbook, May 2007, pp. 1-150.
Barker, Robert, "QuickSilver ACM SilverStream Design Methodology with the Inspire SDK Tool Set," A Technology Application Whitepaper, Jan. 26, 2004, pp. 1-8, QuickSilver Technology, Inc., San Jose, California.
Butts, M., "Future Directions of Dynamically Reprogrammable Systems," IEEE 1995 Custom Integrated Circuits Conference, May 1995, pp. 487-494.
Deokar, R.B., et al., "A Graph-theoretic Approach to Clock Skew Optimization," Month Unknown, 2004, 4 pages.
Graham, P., "Instrumenting Bitstreams for Debugging FPGA Circuits", Proceedings of the 9th Annual IEEE Symposium on Field-Programmable Custom Computing Machines, Apr. 29-May 2, 2001, pp. 41-50, Washington DC.
Graham, P., "Logical Hardware Debuggers for FPGA-Based Systems," A Dissertation Submitted to the Faculty of Brigham Young University in Partial Fulfillment of the Requirements for the Degree of Doctor of Philosophy in Brigham Young University, Dec. 2001, pp. i-246.
Hanono, S., "InnerView Hardware Debugger: A Logic Analysis Tool for the Virtual Wires Emulation System," Submitted to the Department of Electrical Engineering and Computer science in Partial Fulfillment of the Requirements for the Degree of Master of Science at the Massachusetts Institute of Technology, Feb. 1995, pp. 1-59.
Huang, A.S., "Tao: An Architecturally Balanced Reconfigurable Hardware Processor," Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology, May 23, 1997, pp. 1-86, 107-109.
Hutchings, B., et al., "A CAD Suite for High-Performance FPGA Design," Proceedings of the Seventh Annual IEEE Symposium on Field-Programmable Custom Computing Machines, Apr. 1999, pp. 1-13.
Hutchings, B., et al., "Designing and Debugging Custom Computing Applications," IEEE Design & Test of Computers, Jan. 2000, pp. 20-28.
Hutchings, B., et al., "Unifying Simulation and Execution in a Design Environment for FPGA Systems," IEEE Transactions on Very Large Scale Integration (VLSI) Systems, Feb. 2001, pp. 201-205, vol. 9, No. 1.
Quicksilver Technology, Inc., "Adapt2000 ACM System Platform," Apr. 2004, pp. 1-39, QuickSilver Technology, Inc., San Jose, California, USA.
Quicksilver Technology, Inc., "InSpire SDK Tool Set," Product Brief, 2004 Month N/A, 4 pages, QuickSilver Technology, Inc., San Jose, California, USA.
Slade, A.L., et al., "Reconfigurable Computing Application Frameworks," 11th Annual IEEE Symposium on Field-Programmable Custom Computer Machines, Apr. 9-11, 2003, 10 pages.
Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56-69.
Xilinx, Inc., "ChipScope ProSoftware and Cores User Guide," Jan. 10, 2007, pp. 1-206, Xilinx Inc.

* cited by examiner

| 17 | 16 | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|---|
| Opcode | | | | | | Data | | | | | | | | | | | | |
| 0 | 0 | 0 | 0 | 0 | 1 | 0 | Reserved | | | | | | | | | | | Read |
| 0 | 0 | 0 | 0 | 1 | 1 | 1 | Reserved | | | | | | | | | | | Read Increment |
| 0 | 0 | 0 | 1 | 0 | 0 | 0 | Write Data | | | | | | | | | | | Write |
| 0 | 0 | 0 | 1 | 0 | 1 | 1 | Write Data | | | | | | | | | | | Write Increment |
| 0 | 0 | 1 | 0 | 0 | 0 | 0 | Type | | X Coordinate | | | | | | | | | Tile X |
| 0 | 0 | 1 | 0 | 0 | 0 | 0 | Type | | Y Coordinate | | | | | | | | | Tile Y |
| 0 | 1 | 1 | 0 | 0 | 0 | 0 | Reserved | | Address | | | | | | | | | Load Address |
| 0 | 1 | 1 | 1 | 0 | 0 | 0 | Reserved | | | | | | | | | | | Stream |

*Fig. 12*

TRIGGER CIRCUITS AND EVENT COUNTERS FOR AN IC

CLAIM OF BENEFIT TO PRIOR APPLICATIONS

This application is a continuation application of U.S. patent application Ser. No. 13/645,314, filed Oct. 4, 2012, now published as U.S. Publication 2013/0156146. U.S. patent application Ser. No. 13/645,314 is a continuation of U.S. patent application Ser. No. 13/021,702, filed Feb. 4, 2011, now issued as U.S. Pat. No. 8,295,428. U.S. patent application Ser. No. 13/021,702 is a continuation of PCT Application PCT/US2008/088492, entitled "Trigger Circuits and Event Counters for an IC," filed Dec. 29, 2008, now published as WO 2010/016857. PCT Application PCT/US2008/088492 claims the benefit of U.S. Provisional Patent Application 61/086,145, entitled "GUI for Tracking Data Values in an IC," filed Aug. 4, 2008 and U.S. Provisional Patent Application 61/098,732, entitled "Trigger Circuits and Event Counters for a Monitoring Network of a Configurable IC," filed Sep. 19, 2008. U.S. patent application Ser. No. 13/645,314, now published as U.S. Publication 2013/0156146, U.S. Pat. No. 8,295,428, U.S. Provisional Patent Applications 61/086,145 and 61/098,732 and PCT Application PCT/US2008/088492, published as WO 2010/016857, are incorporated herein by reference.

FIELD OF THE INVENTION

The present invention is directed towards efficiently debugging an IC using a secondary network of the IC.

BACKGROUND OF THE INVENTION

Configurable integrated circuits ("ICs") are programmable and can be used to implement multiple circuit designs created by users ("user designs") without having to fabricate a new IC for each design. However, many such user designs include various design bugs, design defects, or unexpected runtime behavior that pass unseen through design and testing. Therefore, it is common for ICs to include debug functionality to aid designers and other users in identifying and correcting such bugs, defects, and behavior. Debug functionality typically includes software and hardware components that collectively or separately are referred to as the debug network of the IC.

In some cases, the debug network is implemented by sharing the configurable circuits of the IC with a primary circuit structure of the IC. The primary circuit structure uses the same circuits to implement the logic functionality specified within a user design. In such cases, a more complicated debug network consumes greater resources of the IC, leaving fewer resources for implementing the user design. As a result, user designs become less sophisticated. Additionally, a change to either the core logic functionality of the primary circuit structure or the functionality of the debug network could cause the entire IC design to have to be recompiled, downloaded, and loaded onto the IC. This is due to the fact that changes to a design, even when made on a small scale to localized circuits, could have a design-wide impact affecting the overall circuit routing or timing of the design. These changes also create the risk that the circuit logic, including seemingly unrelated logic, may be "broken" due to errors in implementing the new functional change. Because of this risk, extensive regression testing and verification of the logic of the primary circuit structure and debug network is required.

In other cases, the debug network is fixed-function circuitry that exists exclusively for debugging purposes. However, implementing the debugging circuitry as fixed-function circuitry also has several drawbacks. For instance, resources are dedicated to performing debug functionality whether or not the user has a need for such debug functionality. A user design that has undergone extensive regression testing and verification before implementation may require only a minimal set of debug functionality. Similarly, a user design that is only an incremental upgrade to an already existing and verified design would have little use for the debug network. Therefore, the dedicated resources of the debug network go unused and are effectively wasted as these resources cannot be modified to complement the functionality of the primary circuit structure that implements the user design.

The fixed-function implementation of the debug network required system designers to predict what functionality had to be included within the debug network. System designers had to anticipate what statistical monitoring or debug functionality was needed in advance of designing the debug network and deploying the IC. Unanticipated usage, behavior, or operating conditions in the field could pose issues beyond the debugging scope of the programmed debug network, forcing users to have to employ third party tools or other means to perform the additional debug functionality needed to handle the unanticipated usage, behavior, or operating conditions.

A further issue prevalent in traditional debug networks is the inability of the networks to provide meaningful debug data to the users. Debug networks often blindly report data at a debug point within the user design. In many instances, the reported data has to be manually parsed or stepped through to find relevant data points at which an error occurs. As a result, users waste time in deciphering the debug data.

Therefore, there is a need in the art to provide an IC that includes a configurable primary circuit structure and a mutually non-interfering configurable secondary/debug network. There is further a need for the secondary circuit structure to provide custom debugging functionality of the primary circuit structure that is tailored to the needs of the designer. Such custom debugging functionality filters out irrelevant data while presenting user defined relevant data to the designer.

SUMMARY OF THE INVENTION

Some embodiments provide different methods of tracking data values in an integrated circuit ("IC") by using a secondary network (also referred to as a "secondary circuit structure") that is separate from a data routing fabric used to implement a user design. A method of some such embodiments allows a user to select a set of resources to monitor. In some embodiments, signals corresponding to these selected resources are continuously read onto the secondary circuit structure. The method of some embodiments then allows the user to define a trigger event that defines which of these signals will be captured for viewing by the user. The method also allows the user to define a trigger mode that specifies a time window, or a set of time windows, of the signals of the selected set of user resources to capture for viewing by the user.

In some embodiments, the method allows a user to set a qualifier that further filters the captured signals once the trigger event occurs. In some embodiments, this qualifier is a condition that is evaluated on-chip (i.e., the same IC die as the selected resources). The method of some embodiments then runs the IC and captures the signals that correspond to the selected set of resources and the conditions described above (i.e., the trigger event and the qualification). In some embodiments, these signals are stored at an on-chip trace buffer.

As mentioned above, some embodiments allow a user to specify a trigger mode that specifies a set of time windows of the selected set of user signals to track. Some embodiments provide a "multiple capture" mode that allows a user to specify a time window to capture upon each occurrence of the event. In some embodiments, more than one of these time windows are able to be stored in the trace buffer at once. Thus, multiple capture mode allows efficient use of the trace buffer because the trace buffer can hold a focused, relevant amount of data for multiple occurrences of an event, as opposed to a large amount of data for a single event.

In some embodiments, the IC includes a trigger circuit for evaluating the selected signals and outputting a trigger signal ("firing a trigger") when the trigger event occurs. In some embodiments, the evaluation includes performing one or more comparisons. These comparisons may include logical comparisons (e.g., greater than, less than, equal to, etc.) on different variables. In some embodiments, these variables are signals received through the secondary circuit structure. The trigger circuit of some embodiments may be configured to compare different widths of variables (e.g., the trigger circuit may be configured to compare 8-bit variables to each other, 16-bit variables to each other, 32-bit variables to each other, etc.). The trigger circuit of some embodiments is also able to compare variables of different widths (e.g., a four-bit variable may be compared to an 8-bit variable). The trigger circuit of some embodiments may also be configured to simultaneously perform multiple comparisons on multiple input values (e.g., a AND b OR c).

In some embodiments, the trigger event mentioned above is a sequential trigger event. A sequential trigger requires a sequence of events relating to a set of user-specified resources to occur before a trigger fires. Conceptually, in some embodiments, a sequential trigger event is a multi-state state machine of trigger events. In some embodiments, the sequential trigger is fired by a trigger circuit that is on the same IC die as the user-specified resources to which the sequence of events relates. In such embodiments, the determination of whether the sequence of events has occurred is performed on the same IC die as the user-specified resources.

Some embodiments provide an IC with one or more event counters. An event counter of some embodiments receives a signal indicating whether an event relating to a set of user-specified resources has occurred. In some embodiments, the event counter counts the number of times this event has occurred. The event counter of some embodiments may be configured to count only the number of consecutive occurrences of an event. The event counter of some embodiments may be configured to count the number of overall occurrences (including non-consecutive occurrences) of an event. In some embodiments, this number is readable via the secondary circuit structure. In some embodiments, these event counters are located on the same IC die as the user-specified resources to which the events relate. In such embodiments, the determination of whether the event has occurred is performed on the same IC die as the user-specified resources.

In some embodiments, the event counter outputs an event signal that indicates that an event has occurred a predetermined number of times. This predetermined number may be specified by writing a value to the event counter over the secondary circuit structure. The abovementioned event signal may be used in a definition of a trigger event that indicates when a trigger fires.

Some embodiments allow the monitoring, through the secondary circuit structure, of resources of the IC that operate on multiple different clocks. In some embodiments, one or more of the clocks of a specified set of resources that is being debugged operates on a clock that is asynchronous with the clock of the secondary circuit structure. In other words, there is no known phase relationship between the two clocks. Some embodiments hold the values that correspond to the specified set of resources for a period of time long enough for the secondary circuit structure to sample the values. In some embodiments, the secondary circuit structure's clock is at least twice as fast as the clock of the specified set of resources. In some embodiments, these values are held in a set of user design state ("UDS") elements. In some embodiments, these UDS elements are unused UDS elements (i.e., they are not assigned to implement the user design of the IC). As is apparent from the discussion above, the monitoring of the specified set of resources on an asynchronous clock is performed entirely on a single IC die.

Some embodiments allow a user to actively debug an IC. In other words, a user may iteratively "step through" clock cycles of the IC and examine values stored by various circuits of the IC (e.g., circuits that implement the user's design). The method of some embodiments allows a user to select a number of clock cycles to run the IC. The method then runs the IC for the specified number of cycles, and then stops the IC. In some embodiments, the number of clock cycles is counted by an on-chip clock control counter. The clock control counter counts the number of clock cycles that have occurred and stops the clock of the IC once the designated number of cycles have occurred. The method allows the user to examine the values of various circuits (e.g., UDS elements, block memories, etc.) of the IC while the IC is stopped. In some embodiments, these values are read through a secondary circuit structure of the IC that is separate from the primary circuit structure of the IC used to implement the user design.

Some embodiments provide chained clock control circuits for selectively disabling more than one clock of the IC. In some embodiments, a clock disable signal disables a clock of the IC. In some embodiments, a clock control circuit receives a clock disable signal. This clock disable signal causes the clock control circuit to disable a clock that is associated with the clock control circuit. In some embodiments, the clock control circuit receives one or more other clock disable signals that correspond to other clock control circuits. In some embodiments, when one or more of the other clock disable signals is true (i.e., a clock associated with the one or more clock disable signals is disabled), then the clock control circuit outputs a clock disable signal. In some embodiments, this clock disable signal is provided to one or more other clock control circuits and causes the one or more other clock control circuits to stop their associated clocks. In this way, the clock control circuits are said to be "chained" together.

BRIEF DESCRIPTION OF THE DRAWINGS

The novel features of the invention are set forth in the appended claims. However, for purpose of explanation, several embodiments of the invention are set forth in the following figures.

FIG. 12 illustrates examples of types of frames that may be used in packets of some embodiments.

DETAILED DESCRIPTION OF THE INVENTION

Figure 1:
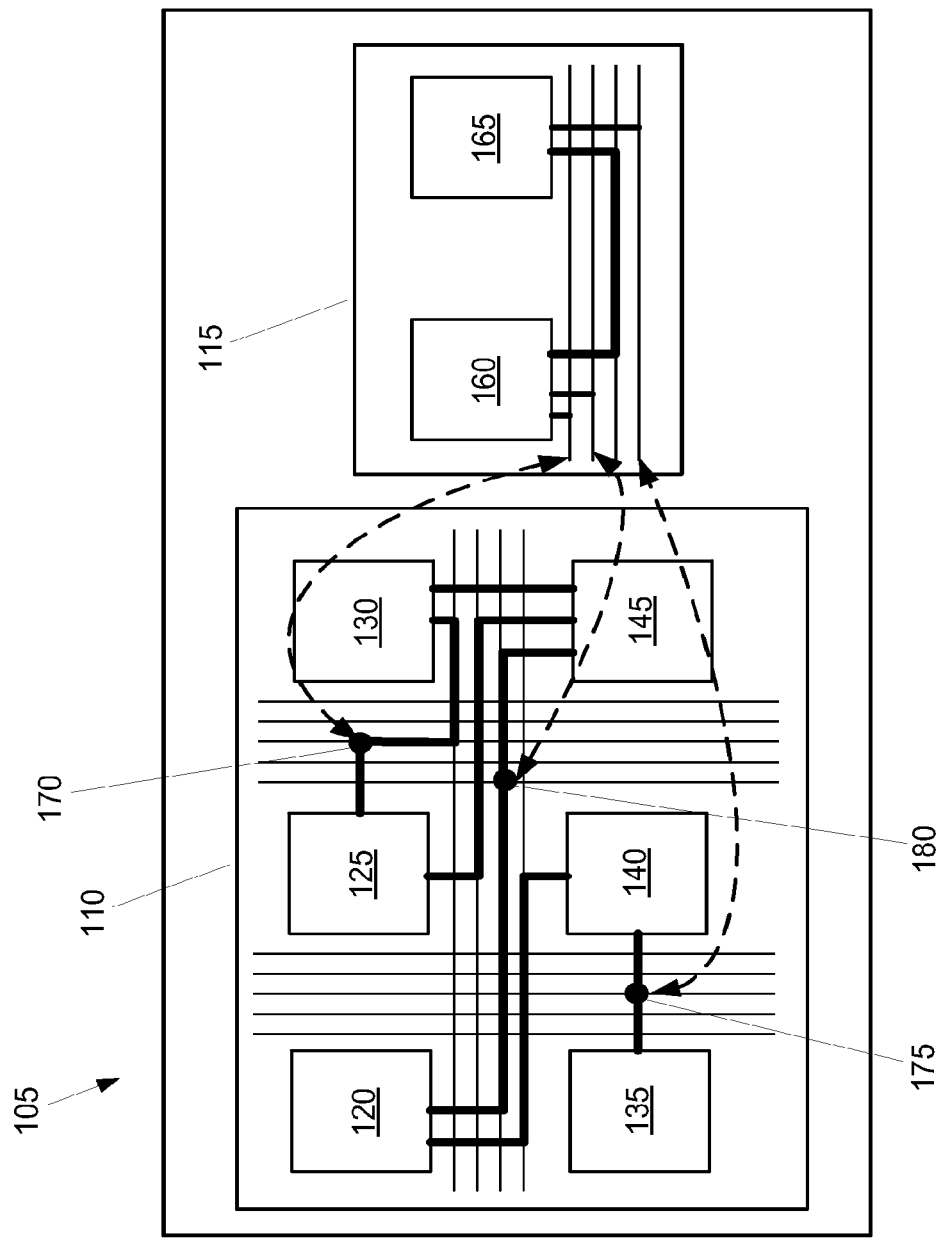
FIG. 1 illustrates the dynamic routing of user signals from the primary circuit structure to the secondary circuit structure through a set of shared resources.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. Overview

Some embodiments provide different methods of tracking data values in an integrated circuit ("IC") by using a secondary circuit structure that is separate from a data routing fabric used to implement a user design. A method of some such embodiments allows a user to select a set of resources to monitor. In some embodiments, signals corresponding to these selected resources are continuously read onto the secondary circuit structure. The method of some embodiments then allows the user to define a trigger event that defines which of these signals will be captured for viewing by the user. The method also allows the user to define a trigger mode that specifies a time window, or a set of time windows, of the signals of the selected set of user resources to capture for viewing by the user.

In some embodiments, the method allows a user to set a qualifier that further filters the captured signals once the trigger event occurs. In some embodiments, this qualifier is a condition that is evaluated on-chip (i.e., the same IC die as the selected resources). The method of some embodiments then runs the IC and captures the signals that correspond to the selected set of resources and the conditions described above (i.e., the trigger event and the qualification). In some embodiments, these signals are stored at an on-chip trace buffer.

As mentioned above, some embodiments allow a user to specify a trigger mode that specifies a set of time windows of the selected set of user signals to track. Some embodiments provide a "multiple capture" mode that allows a user to specify a time window to capture upon each occurrence of the event. In some embodiments, more than one of these time windows are able to be stored in the trace buffer at once. Thus, multiple capture mode allows efficient use of the trace buffer because the trace buffer can hold a focused, relevant amount of data for multiple occurrences of an event, as opposed to a large amount of data for a single event.

In some embodiments, the IC includes a trigger circuit for evaluating the selected signals and outputting a trigger signal ("firing a trigger") when the trigger event occurs. In some embodiments, the evaluation includes performing one or more comparisons. These comparisons may include logical comparisons (e.g., greater than, less than, equal to, etc.) on different variables. In some embodiments, these variables are signals received through the secondary circuit structure. The trigger circuit of some embodiments may be configured to compare different widths of variables (e.g., the trigger circuit may be configured to compare 8-bit variables to each other, 16-bit variables to each other, 32-bit variables to each other, etc.). The trigger circuit of some embodiments is also able to compare variables of different widths (e.g., a four-bit variable may be compared to an 8-bit variable). The trigger circuit of some embodiments may also be configured to simultaneously perform multiple comparisons on multiple input values (e.g., a AND b OR c).

In some embodiments, the trigger event mentioned above is a sequential trigger event. A sequential trigger requires a sequence of events relating to a set of user-specified resources to occur before a trigger fires. Conceptually, in some embodiments, a sequential trigger event is a multi-state state machine of trigger events. In some embodiments, the sequential trigger is fired by a trigger circuit that is on the same IC die as the user-specified resources to which the sequence of events relates. In such embodiments, the determination of whether the sequence of events has occurred is performed on the same IC die as the user-specified resources.

Some embodiments provide an IC with one or more event counters. An event counter of some embodiments receives a signal indicating whether an event relating to a set of user-specified resources has occurred. In some embodiments, the event counter counts the number of times this event has occurred. The event counter of some embodiments may be configured to count only the number of consecutive occurrences of an event. The event counter of some embodiments may be configured to count the number of overall occurrences (including non-consecutive occurrences) of an event. In some embodiments, this number is readable via the secondary circuit structure. In some embodiments, these event counters are located on the same IC die as the user-specified resources to which the events relate. In such embodiments, the determination of whether the event has occurred is performed on the same IC die as the user-specified resources.

In some embodiments, the event counter outputs an event signal that indicates that an event has occurred a predetermined number of times. This predetermined number may be specified by writing a value to the event counter over the secondary circuit structure. The abovementioned event signal may be used in a definition of a trigger event that indicates when a trigger fires.

Some embodiments allow the monitoring, through the secondary circuit structure, of resources of the IC that operate on multiple different clocks. In some embodiments, one or more of the clocks of a specified set of resources that is being debugged operates on a clock that is asynchronous with the clock of the secondary circuit structure. In other words, there is no known phase relationship between the two clocks. Some embodiments hold the values that correspond to the specified set of resources for a period of time long enough for the secondary circuit structure to sample the values. In some embodiments, the secondary circuit structure's clock is at least twice as fast as the clock of the specified set of resources. In some embodiments, these values are held in a set of user design state ("UDS") elements. In some embodiments, these UDS elements are unused UDS elements (i.e., they are not assigned to implement the user design of the IC). As is apparent from the discussion above, the monitoring of the specified set of resources on an asynchronous clock is performed entirely on a single IC die.

Some embodiments allow a user to actively debug an IC. In other words, a user may iteratively "step through" clock cycles of the IC and examine values stored by various circuits of the IC (e.g., circuits that implement the user's design). The method of some embodiments allows a user to select a number of clock cycles to run the IC. The method then runs the IC for the specified number of cycles, and then stops the IC. In some embodiments, the number of clock cycles is counted by an on-chip clock control counter. The clock control counter counts the number of clock cycles that have occurred and stops the clock of the IC once the designated number of cycles have occurred. The method allows the user to examine the values of various circuits (e.g., UDS elements, block memories, etc.) of the IC while the IC is stopped. In some embodiments, these values are read through a secondary circuit structure of the IC that is separate from the primary circuit structure of the IC used to implement the user design.

Some embodiments provide chained clock control circuits for selectively disabling more than one clock of the IC. In some embodiments, a clock disable signal disables a clock of the IC. In some embodiments, a clock control circuit receives a clock disable signal. This clock disable signal causes the clock control circuit to disable a clock that is associated with the clock control circuit. In some embodiments, the clock control circuit receives one or more other clock disable signals that correspond to other clock control circuits. In some embodiments, when one or more of the other clock disable signals is true (i.e., a clock associated with the one or more clock disable signals is disabled), then the clock control circuit outputs a clock disable signal. In some embodiments, this clock disable signal is provided to one or more other clock control circuits and causes the one or more other clock control circuits to stop their associated clocks. In this way, the clock control circuits are said to be "chained" together.

Several more detailed embodiments of the invention are described in the sections below. Section II describes an IC architecture for the primary and secondary circuit structures of some embodiments. Section III provides an overview of user-cycles and sub-cycles. Next, Section IV describes a transport network of some embodiments that facilitates communications between the primary and secondary circuit structures of the IC. Section V describes the circuitry and functionality of the secondary circuit structure in accordance with some embodiments. Section VI then describes a debugging tool that makes use of software and hardware components of some embodiments. Next, Section VII describes the monitoring of asynchronous clock domains. Section VIII describes a system for an electronics device that has an IC which implements some of the embodiments of the invention. Lastly, Section IX describes a software tool for dynamically tracking data in an IC.

II. Integrated Circuit with Configurable Elements

An integrated circuit ("IC") is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an IC that has configurable circuits. A configurable circuit is a circuit that can "configurably" perform a set of operations. Specifically, a configurable circuit receives a configuration data set that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable ICs configurable circuits) to implement the IC design, also referred to as the user design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of manners. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). It should be apparent to one of ordinary skill in the art that in addition to configurable circuits, a configurable IC also typically includes non-configurable circuits (e.g., non-configurable logic circuits, interconnect circuits, memories, etc.).

The configurable interconnect circuit passes signals through a routing fabric of the configurable IC. The routing fabric provides a communication pathway for routing signals to and from source and destination circuits or components. In some embodiments, the routing fabric includes storage elements in addition to the various routing circuits, the wire segments (e.g., the metal or polysilicon segments) that connect to the routing circuits, and vias that connect to these wire segments and to the terminals of the routing circuits. These storage elements include latches and registers distributed across the routing fabric that provide one or more different means for storing signals in the routing fabric. U.S. patent application Ser. No. 11/754,299, filed on May 27, 2007, provides a detailed description for some such storage elements.

In some of these embodiments, the routing fabric also includes buffers for achieving one or more objectives (e.g., maintaining the signal strength, reducing noise, altering signal delay, etc.) vis-a-vis the signals passing along the wire segments. In conjunction with, or instead of, these buffer circuits, the routing fabric of some embodiments might also include one or more non-configurable circuits (e.g., non-configurable interconnect circuits).

In some embodiments, the configurable resources (e.g., configurable logic resources, routing resources, memory resources, etc.) are grouped in conceptual configurable tiles that are arranged in several rows and columns. Together, this arrangement forms a primary circuit structure of the IC that implements the user design logic.

In addition to this primary circuit structure of the IC, some embodiments further provide a secondary IC network that is "on-chip." In some embodiments, the on-chip secondary circuit structure is a network of resources that is located on the same physical wafer as the resources of the primary circuit structure. In some embodiments, the on-chip secondary circuit structure is a network of resources that is located on a different physical wafer or layer than the primary circuit structure, but wherein the wafers or layers for both the primary and secondary circuit structure are included within the same physical package enclosing the IC as a single chip. Accordingly, the below described functionality of the secondary circuit structure is implemented and performed on the same physical chip as the primary circuit structure. In some embodiments, the secondary circuit structure is an optical network, while the primary circuit structure is an electrical network.

In some embodiments, the secondary circuit structure is a different network than the primary circuit structure implementing the user design. Specifically, in some embodiments, the user design is not mapped to the secondary circuit structure. Rather, the secondary circuit structure of some embodiments is a configuration network and a debug network that provides functionality extended beyond traditional debug functionality.

When providing configuration functionality, the secondary circuit structure is the means through which configuration data that is streamed into the IC is routed to the appropriate tiles and ultimately to the appropriate configurable circuits of the primary circuit structure that configure to perform operations in accordance with the user design. When providing debug functionality, the secondary circuit structure can be used to diagnose and isolate issues within the primary circuit structure. Such functionality may operate independent of, and/or complement the functionality of, the user design implemented by the primary circuit structure. In each instance, the secondary circuit structure operates in a non-interfering manner with the operations of the primary circuit structure.

The secondary circuit structure interfaces with the primary circuit structure through a set of bitlines that pass through and are shared amongst various tiles of configurable circuits of the primary circuit structure. In some embodiments, relevant user signals are dynamically routed over the bitlines from the primary circuit structure to the secondary circuit structure and from the secondary circuit structure to the primary circuit structure such that there is no impact to the user circuits (e.g., the configurable circuits implementing the user design) configured in the primary circuit structure. Accordingly, there is no impact to the functionality configured within the primary circuit structure (i.e., the user design).

In some embodiments, the secondary circuit structure is initially configured via an external interface into the IC. In some embodiments, the external interface includes Joint Test Action Group ("JTAG") interface, flash, slave peripheral port, or through other means of communications with the IC, such as the I/O buffers of the IC. Also, in some embodiments, these various external interfaces may be used to perform read-back from the secondary circuit structure to the external interfaces. In addition to providing access to the secondary circuit structure from outside of the IC, some embodiments of the IC include a "fabric port," through which a user circuit, or user logic, of the primary circuit structure accesses the secondary circuit structure. Such a fabric port is explained further below with reference to FIG. 8. In some embodiments, the user circuit includes logic that is not implemented on either the primary or secondary circuit structure, but may include logic in the same package or IC of a System-On-Chip ("SoC") implementation defined with reference to FIG. 53 below.

FIG. 1 conceptually illustrates the dynamic routing of user signals from the primary circuit structure to the secondary circuit structure in some embodiments. As shown, an integrated circuit ("IC") 105 includes the primary circuit structure 110 and the secondary circuit structure 115 with various interconnects 170-180 that allow for intercommunications between the two networks.

The primary circuit structure 110 includes blocks of configurable circuits 120-145 that represents tiles of the IC. The various interconnects within the primary circuit structure 110 connect the block 120-145 to one another. Additionally, these interconnects also include bitlines for passing signals to the secondary circuit structure. For instance, a communication pathway between the primary circuit structure 110 and secondary circuit structure 115 exists at locations 170-180. These locations may include unused storage elements within the routing fabric or routing circuits from which signals passing through the primary circuit structure 110 reach the circuits of the secondary circuit structure 115.

As such, signals may pass from the primary circuit structure to the secondary circuit structure in a manner that does not interfere with the operation of the primary circuit structure. As shown, the secondary circuit structure 115 includes circuits 160-165 with a separate set of interconnects over which signals from the communication bitlines with the primary circuit structure pass into the circuits 160-165 of the secondary circuit structure.

In order to illustrate the conceptual difference between the primary and secondary circuit structures, the primary circuit structure 110 and the secondary circuit structure 115 are shown as being separate in this figure. However, in some embodiments, the circuits and bitlines of the secondary circuit structure are physically interspersed with the circuits and bitlines of the primary circuit structure. In other words, the secondary circuit structure may be thought of as an "overlay" network with regard to the primary circuit structure.

Figure 2:
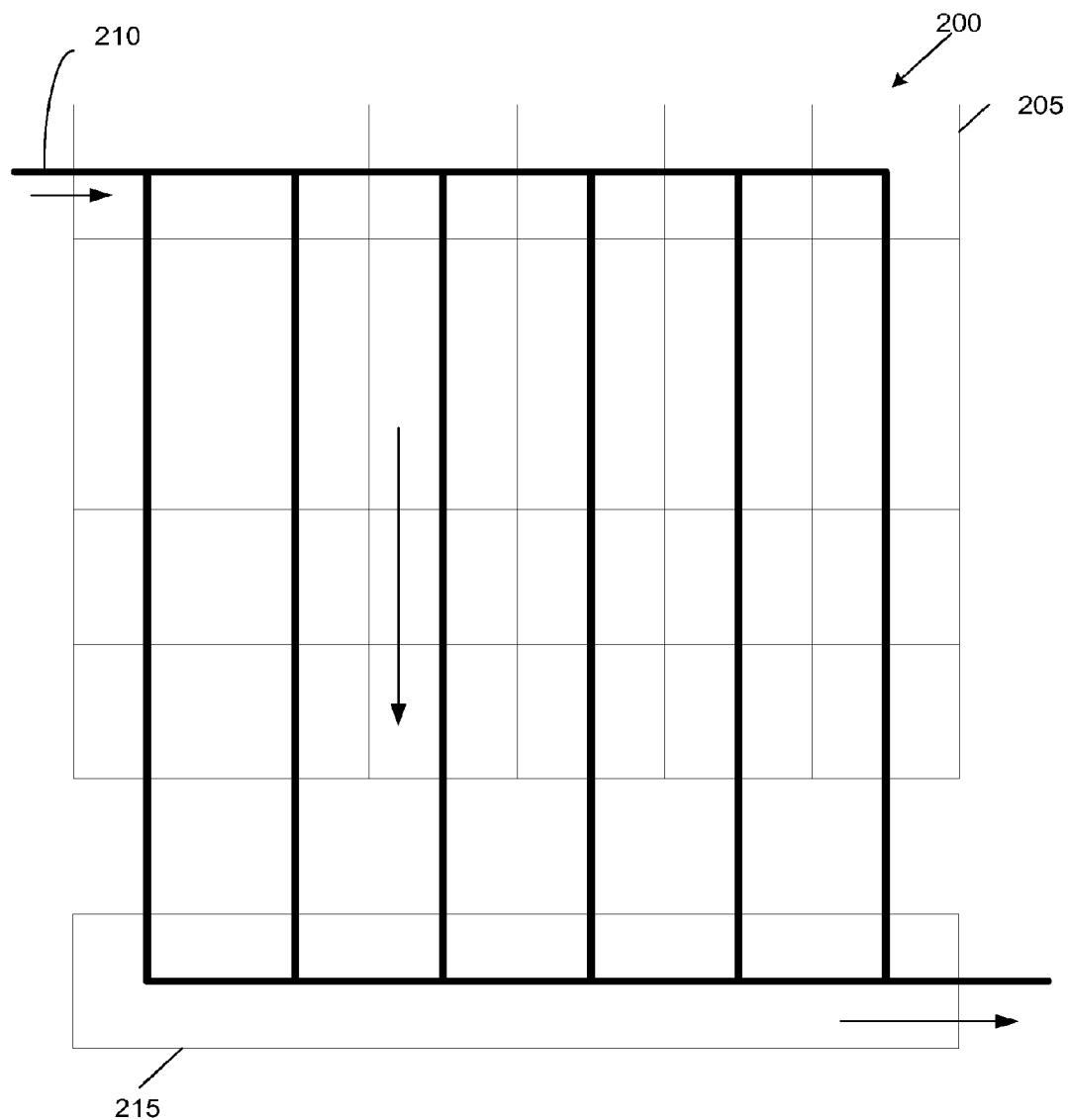
FIG. 2 illustrates an example of an IC that includes numerous configurable tiles of a primary circuit structure and a communication pathway for facilitating the interactions between the primary circuit structure and the secondary circuit structure.

FIG. 2 conceptually illustrates an example of a configurable IC 200 that includes numerous configurable tiles 205. The configurable tiles 205 communicate with each other through the routing fabric of the IC. As mentioned above, these configurable tiles 205 form a primary circuit structure of the IC. Each configurable tile 205 receives a set of lines 210 that are part of the secondary circuit structure. The lines 210 pass debug data, configuration data, or other data (e.g., resource state data, assertions, logic computations, etc.) on to transport network 215 of the secondary circuit structure, which in turn passes the data on to other components of the secondary circuit structure (not shown). In some embodiments, the lines 210 also pass data from the secondary circuit structure to the primary circuit structure.

In some embodiments, the set of lines 210 are a uniform set of lines distributed throughout the primary circuit structure, through every set of tiles. The set of lines 210 may include 18 lines, six of which are used to provide control signals and twelve of which are used to provide data signals. The six control signals serve as an opcode (operation code), while the twelve signals serve as the operand (i.e., data argument) associated with the opcode. Some examples of opcodes and operands are further discussed below. While this specification discusses specific examples with respect to the width of bitlines and data packets (e.g., 18-bit bitlines, 18-bit data frames, six-bit opcodes, twelve-bit operands, etc.), a person of ordinary skill in the art would recognize that these are merely illustrative examples, and that any other number of bits can be used without departing from the spirit of the invention.

In some embodiments, there is an unused area of the IC between the configurable tiles 205 and the transport network 215. Having the transport network 215 be separate from the main set of configurable circuits allows multiple generations of the configurable IC to use different designs for the transport network 215 without disrupting the design of the fabric of the primary circuit structure. Some embodiments use a packet switching technology to route data to and from the resources in the configurable tiles. Hence, over the lines 210, these embodiments can route variable length data packets to each configurable tile in a sequential or random access manner. Additionally, the packet switching allows the lines 210 to be shared by all tiles and circuits of the primary circuit structure in communications with the secondary circuit structure. Several embodiments of the packet switched secondary circuit structure operating in conjunction with the primary circuit structure of the IC will now be given.

Data packets routed according to the packet switching functionality of some embodiments include one or more data frames. In some embodiments, an initial set of frames (e.g., first one or two frames) of the packet identifies configurable tiles for routing the remaining frames of the data packet. In other words, the initial set of frames specifies one or more destinations for receiving the data packet. Some embodiments allow tiles to be individually addressed, globally addressed, or addressed based on their tile types. The remaining frames can then contain configuration, debug, or other data for performing one or more overlay applications of the secondary circuit structure. A more detailed description of the data packet structure is provided below with reference to FIG. 12, below.

Figure 3:
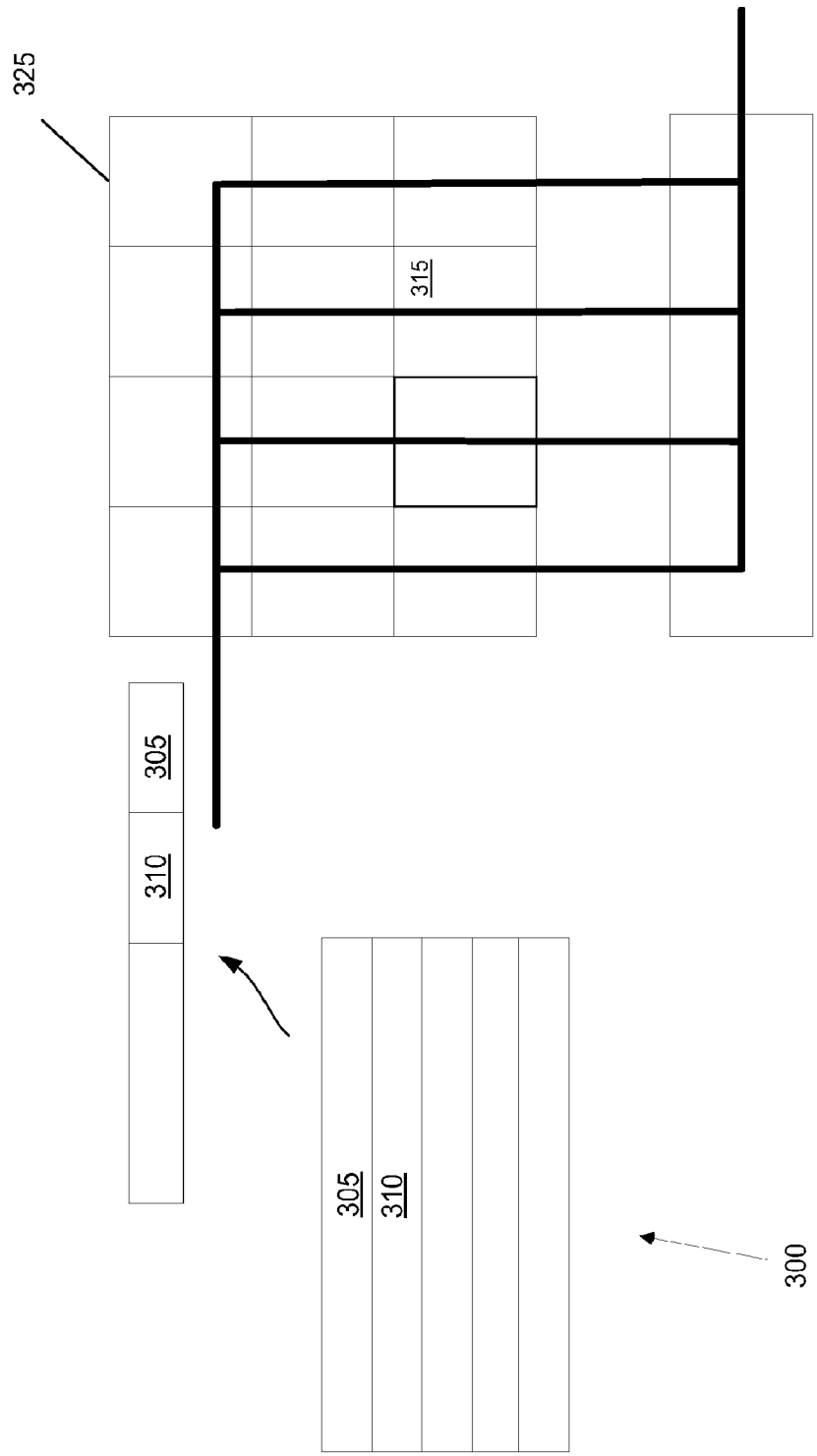
FIGS. 3-5 illustrate an example of how an initial set of frames in a packet might specify the routing of a packet to a configurable tile.
Figure 4:
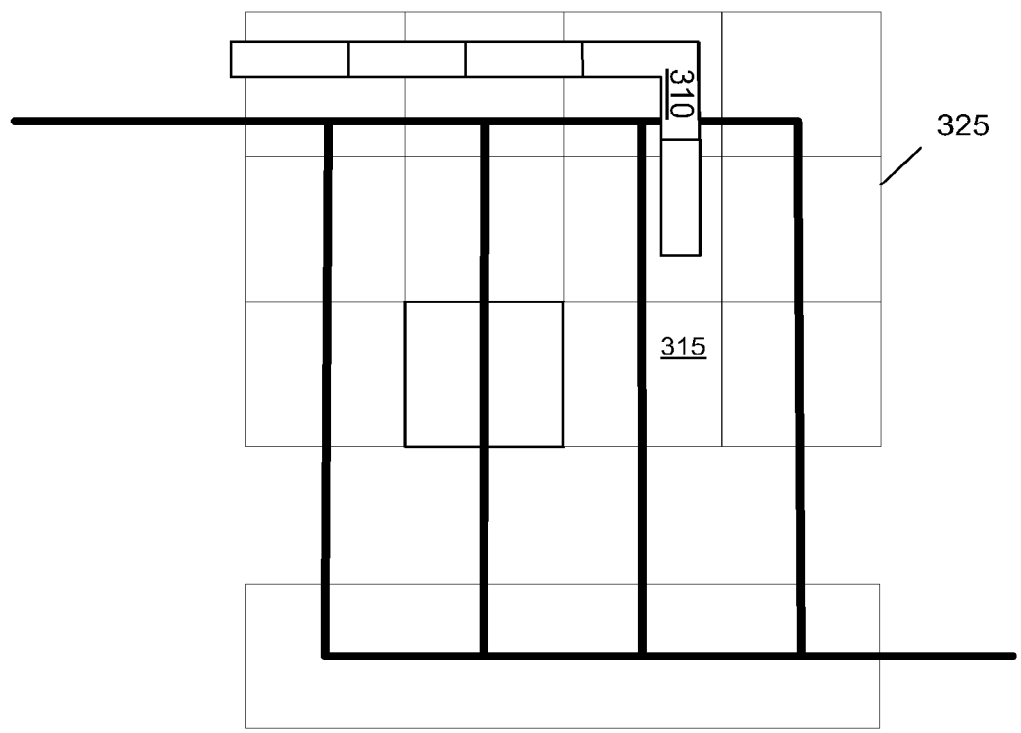
Figure 5:
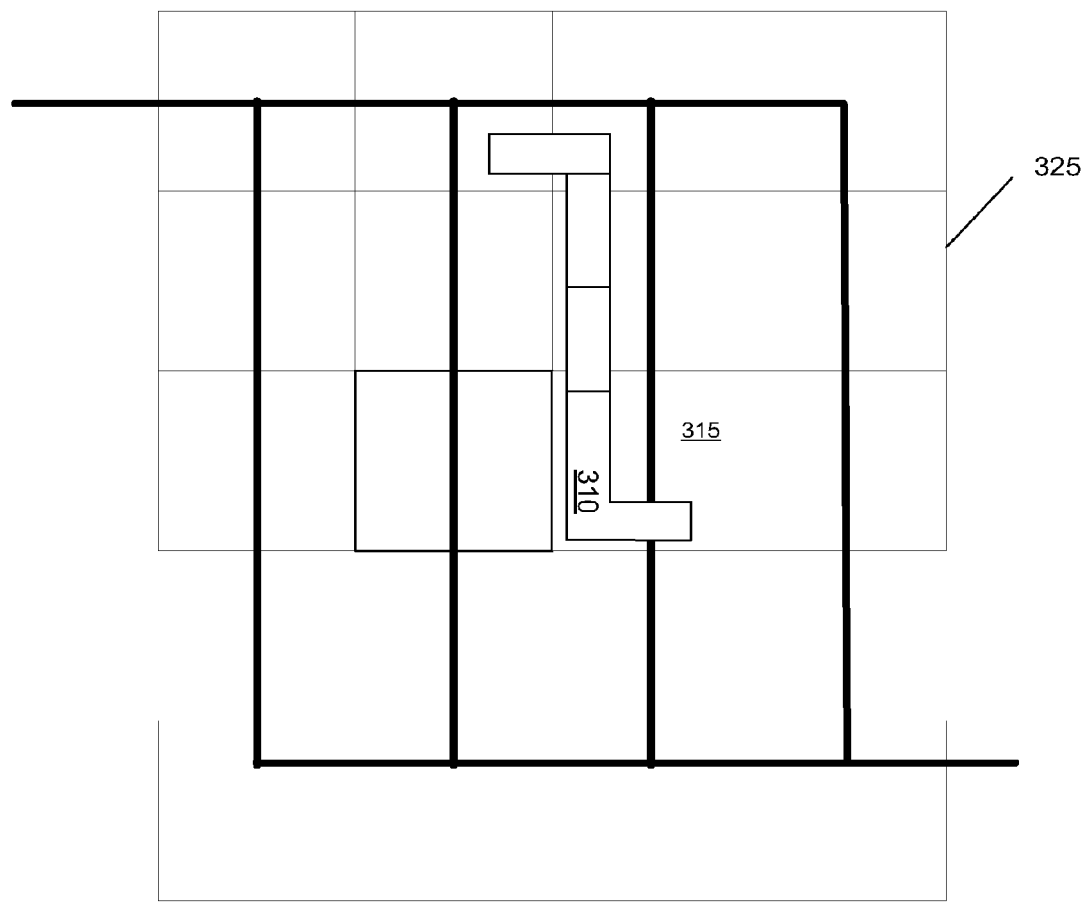

FIGS. 3, 4, and 5 illustrate an example of how an initial set of frames in a packet might specify the routing of a packet to a configurable tile 315. In this example, the first two frames 305 and 310 of the packet 300 respectively identify the column and then the row of the configurable tile 315 to be configured. As shown in FIG. 4, the column-identifying frame 305 is used by a column selector (described below with respect to FIG. 13) at the top of the configurable tile array 325 to route a packet down the column of the addressed configurable tile 315. The tile-identifying frame 310 then allows a tile selector (described below with respect to FIG. 13) in the configurable tile 315 to determine that the packet of data being routed down its column is addressed to its tile 315. Hence, as shown in FIG. 5, the tile selector of tile 315 extracts the remaining data frames in the packet 300.

Figure 6:
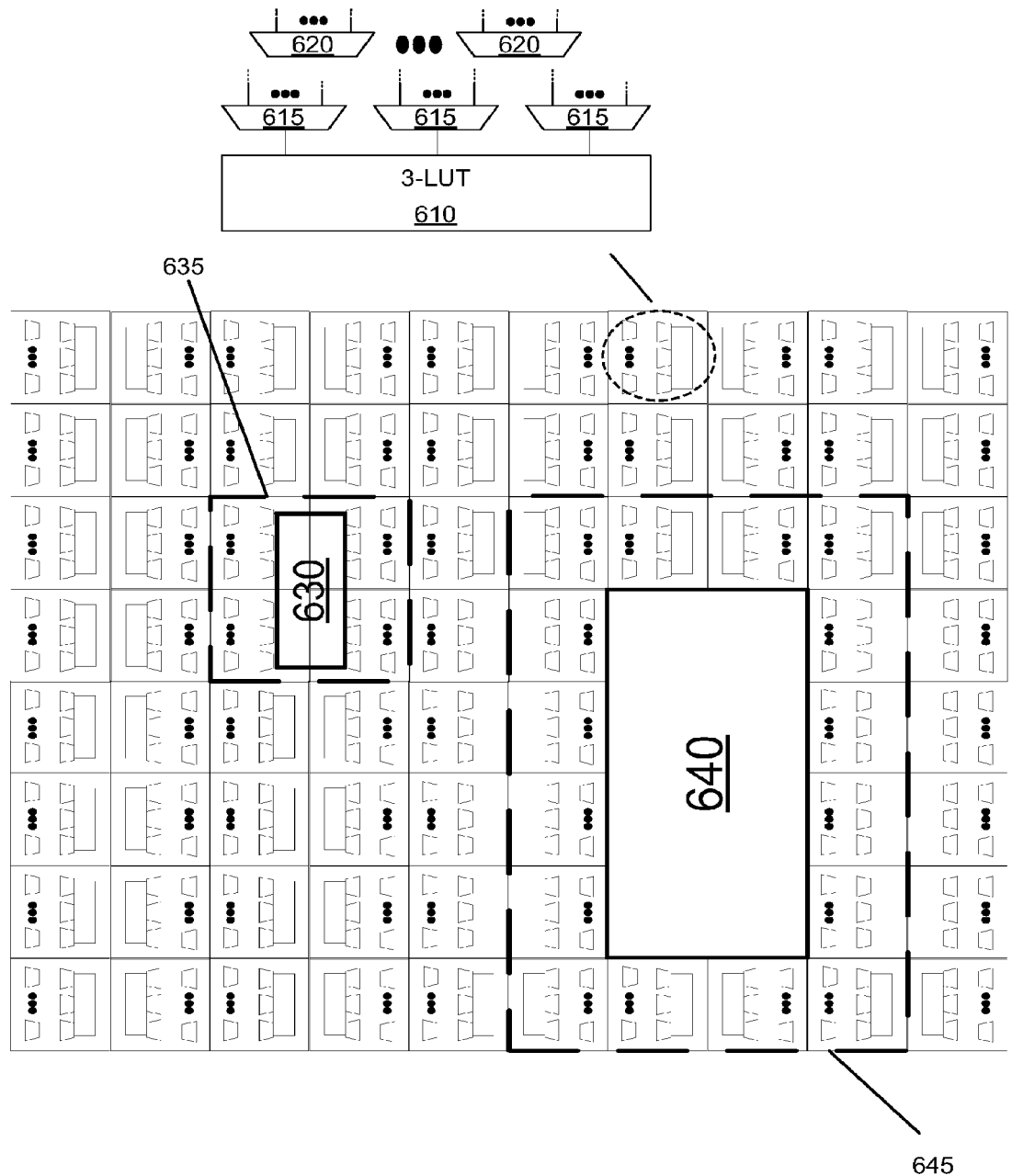
FIG. 6 illustrates an example of an IC of some embodiments with an array of configurable tiles with memory embedded within the array.

FIG. 6 illustrates the configurable circuit architecture of some embodiments of the invention. As shown in FIG. 6, this architecture is formed by numerous configurable conceptual tiles that are arranged in an array with multiple rows and columns. It should be noted that in some embodiments a "conceptual tile" (or "tile" for short) does not denote any physically distinct object, but is rather a way of referring to groups of circuitry in a repeated or nearly repeated pattern. In such embodiments, the lines around individual tiles represent conceptual boundaries, not physical ones.

In FIG. 6, each configurable tile is a configurable logic tile, which, in this example, includes one configurable three-input logic circuit 610, three configurable input-select interconnect circuits 615, and eight configurable routing interconnect circuits 620. For each configurable circuit, the configurable IC 600 includes a set of storage elements for storing a set of configuration data. In some embodiments, the logic circuits are look-up tables (LUTs) while the interconnect circuits are multiplexers. In this specification, many embodiments are described as using multiplexers. It will be clear to one of ordinary skill in the art that other embodiments can be implemented with input selection circuits other than multiplexers. Therefore, any use of "multiplexer" in this specification should be taken to also disclose the use of any other type of input selection circuits.

In FIG. 6, an input-select multiplexer ("IMUX") 615 is an interconnect circuit associated with the LUT 610 that is in the same tile as the input select multiplexer. One such input select multiplexer (1) receives several input signals for its associated LUT, and (2) based on its configuration, passes one of these input signals to its associated LUT.

In FIG. 6, a routing multiplexer ("RMUX") 620 is an interconnect circuit that connects other logic and/or interconnect circuits. The interconnect circuits of some embodiments route signals between logic circuits, to and from I/O circuits, and between other interconnect circuits. Unlike an input select multiplexer of some embodiments (which provides its output to only a single logic circuit, i.e., which has a fan-out of only 1), a routing multiplexer of some embodiments is a multiplexer that (1) can provide its output to several logic and/or interconnect circuits (i.e., has a fan-out greater than 1), or (2) can provide its output to other interconnect circuits. The RMUX receives several inputs and based on its configuration, selects the input to pass along the output.

In the architecture illustrated in FIG. 6, each configurable logic tile includes one three-input LUT, three input-select multiplexers, and eight routing multiplexers. Other embodiments, however, might have a different number of LUTs in each tile, different number of inputs for each LUT, different number of input-select multiplexers, and/or different number of routing multiplexers. Other embodiments might also use different types of logic circuits and/or interconnect circuits. Several such architectures are further described in the U.S. application Ser. No. 11/082,193, filed on Mar. 15, 2005.

Some of the configurable logic tiles of FIG. 6 together conceptually form configurable memory tiles, which are (1) tiles with blocks of memory, or (2) tiles that are adjacent to blocks of memory. FIG. 6 illustrates two examples of configurable memory tiles. The first example is a memory tile 635 that is formed by a set of four aligned tiles that have a memory block 630 in place of their four LUTs. In the second example, a memory tile 645 is formed by 16 tiles that neighbor a memory block 640. In the configurable logic tiles of the memory tiles 635 and 645, the input select and routing interconnects serve as configurable ports of the memory blocks.

In some embodiments, the examples illustrated in FIG. 6 represent the actual physical architecture of a configurable IC. However, in other embodiments, the examples presented in FIG. 6 topologically illustrate the architecture of a configurable IC (i.e., they show arrangement of tiles, without specifying a particular physical position of the circuits). In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture.

In some embodiments, the secondary circuit structure shares one or more resources with the primary circuit structure to facilitate one or more of the interfaces with the primary circuit structure. These resources include user design state ("UDS") elements. UDS elements are elements that store values. At any particular time, the values stored by the UDS elements define the overall user-design state of the primary circuit structure at that particular time. In some embodiments, a UDS element is capable of continuously outputting the value it stores. Examples of such elements include traditional latches, registers, user flip-flops, and memory structures. U.S. Pat. No. 7,224,181, issued May 29, 2007; U.S. patent application Ser. No. 11/754,300, filed May 27, 2007, and U.S. Provisional Patent Application 61/097, 798, filed Sep. 17, 2008, describe other user-design state elements that include routing multiplexers ("RMUXs") that can serve as storage elements, RMUXs that have storage elements in feedback paths between their outputs and inputs, and storage elements at other locations in the routing fabric (e.g., between RMUXs).

More specifically, some embodiments have RMUXs where at least some of the RMUXs have state elements integrated at the output stage of the RMUX itself. Such RMUXs are referred to as routing circuit latches or RCLs. For instance, some RMUXs use complementary passgate logic ("CPL") to implement a routing multiplexer. Some of these embodiments then implement a routing multiplexer that can act as a latch by placing cross-coupled transistors at the output stage of the routing multiplexer. Such an approach is further described in U.S. patent application Ser. No. 11/081,859, filed Mar. 15, 2005. In the discussion below, routing multiplexers that can serve as latches are referred to as routing-circuit latches ("RCLs").

In conjunction or instead of such RCLs, other embodiments utilize other storage elements for storing UDS data at other locations in the configurable routing fabric of a configurable IC. For instance, in addition to or instead of having a storage element in the input and/or output stage of an RMUX, some embodiments place a storage element (e.g., latch or register) in a feedback path between the output and input of the RMUX.

Some such UDS elements operate as transparent latches referred to as "time vias" ("TVs") or clock driven latches referred to as "conduits." When a TV is "open," the TV's output value immediately assumes the TV's current input value. In other words, the TV acts as a wire (with some additional delay). When the TV closes, it captures and holds the current output value (i.e., the output no longer follows the input).

Some or all of these TVs can be accessed via the secondary circuit structure in one of two modes: active mode and passive (or trace) mode. Active mode allows users to read and write stored values in any circuit of the IC, including closed TVs (open TVs do not store values) while the circuit is stopped. Passive mode continuously transmits TV values to the secondary circuit structure in real time. These modes are further described below. In some embodiments, this transmission of TV values occurs at the maximum user clock rate. Once received by the secondary circuit structure, these signal values can be stored in a trace buffer for later display and analysis.

Conduits, unlike TVs, introduce delay when performing a storage operation. In some embodiments, conduits are implemented as single edge-triggered flip-flops. In some embodiments, multiple conduits are chained together to provide longer delays, as necessary. In some embodiments, conduits are accessed in the same manner as TVs. In some embodiments, conduits are readable, writeable, and/or stream-able from the secondary circuit structure.

In some embodiments, some or all of the latches, registers, TVs, or conduits are separate from the RMUXs of the routing fabric and are instead at other locations in the routing fabric (e.g., between the wire segments connecting to the outputs and/or inputs of the RMUXs). For instance, in some embodiments, the routing fabric includes a parallel distributed path for an output of a source routing circuit to a destination circuit. A first path of the parallel distributed path, directly routes the output of the source routing circuit to a first input of the destination circuit. A second path running in parallel with the first path passes the output of the source routing circuit through a UDS element before reaching a second input of the destination circuit. The storage element stores the output value of the routing circuit when enabled. In some embodiments, the second path connects to a different destination component than the first path. When the routing fabric includes buffers, some of these embodiments utilize these buffers as well to build such latches, registers, TVs, or conduits.

In some embodiments, the secondary circuit structure connects to some or all of the UDS elements (e.g., latches, registers, memories, etc.) of the primary circuit structure to establish the communication pathway between the two networks. In some embodiments, the secondary circuit structure has a streaming mode that can direct various circuits in one or more configurable tiles of the primary circuit structure to stream out their data during the operation of the configurable IC. In some embodiments, the determination of which circuits are to stream out their data is made before runtime of the IC. As discussed below, in some such embodiments, configuration data is loaded into the IC that identifies these circuits that are identified for streaming. Accordingly, in some embodiments where the secondary circuit structure connects to some or all of the UDS elements, the secondary circuit structure can be used in a streaming mode to stream out data from the UDS elements of the tiles, in order to identify any errors in the operation of the IC. In other words, the streaming of the data from the UDS elements can be used to debug the operation of the configurable IC.

In various places in this specification, signals or data are described as going to the secondary circuit structure from logic circuits, RMUXs, and/or IMUXs of the primary circuit structure. In some embodiments, such data goes directly from the indicated circuits of the primary circuit structure to the secondary circuit structure without any further intervening circuits. In other embodiments, data can be sent from logic circuits, RMUXs or IMUXs of the primary circuit structure through some type of intervening circuit (e.g., a state element). It will be clear to one of ordinary skill in the art that references to data going to the secondary circuit structure from a circuit encompass both data going directly to a secondary circuit structure and data going to a secondary circuit structure through intervening circuits.

In some embodiments, the signals from circuits or tiles of the primary circuit structure are conveyed in real time to various circuit elements or circuit blocks of the secondary circuit structure such that the secondary circuit structure is able to always observe the primary circuit structure during operation of the primary circuit structure. For instance, a secondary circuit structure that collects statistics regarding the performance of the primary circuit structure will receive the signals at one or more counters of the secondary circuit structure that measure the activity of the routed signals in the primary circuit structure.

III. Overview of User-Cycles and Sub-Cycles

In some embodiments, some of the configurable circuits (e.g., configurable LUTs, configurable multiplexers, etc.) of the primary and secondary circuit structures are reconfigurable circuit elements. In some of these embodiments, the IC is a reconfigurable IC that stores multiple sets of configuration data for its sub-cycle reconfigurable circuit elements, so that the reconfigurable circuit elements can use a different set of configuration data in each different reconfiguration cycle. In other words, a reconfigurable IC has configuration data that tells it how to reconfigure in every cycle.

In some embodiments, an IC may operate on a user-cycle basis with a particular number of sub-cycles per user cycle. At one level of abstraction, the IC has a user-design calling for a particular number of operations to be performed in a particular number of user-cycles. This user design is translated into a physical configuration with circuit elements that can each perform one operation per sub-cycle, thus allowing multiple operations per element per user cycle. One advantage of this is that it allows user designs with a greater number of operations per user cycle than the number of physical elements in the IC. Sub-cycle reconfigurable circuit elements are described in U.S. Pat. No. 7,295,037, issued Nov. 13, 2007. The contents of this Patent, namely U.S. Pat. No. 7,295,037, are herein incorporated by reference.

For example, a user-design may call for four separate logic gate functions to be performed by four separate logic gates (in different locations on the user-design IC) during a particular user cycle. The physical configuration may implement such a user-design by having all four logic gate functions performed by a single LUT that reconfigures itself according to stored configuration data in successive user cycles.

In summary, ICs that reconfigure during run time may be referred to as "reconfigurable ICs." Some reconfigurable ICs are capable of reconfiguring in each sub-cycle. These may be called "sub-cycle reconfigurable ICs," though they may still be referred to as "reconfigurable ICs" for short.

IV. Secondary Network Transport

A. Overview

In some embodiments, the secondary circuit structure is a configuration/debug network. In some such embodiments, the secondary circuit structure operates in non-invasive manner to the operations of the primary circuit structure. Specifically, a non-invasive secondary circuit structure operation is one which does not need to use circuits that would otherwise be used to implement the user's design. In some embodiments, the secondary circuit structure does not change any values of resources of the primary circuit structure while the secondary circuit structure monitors the primary circuit structure. Some advantages of a non-invasive secondary circuit structure of some embodiments are that the non-invasive secondary circuit structure: 1) has the advantage of not requiring a spread out implementation of the user design in the primary circuit structure and 2) does not require restructuring the physical implementation of the user design in the primary circuit structure in order to retrieve data from different parts of the circuit.

In some embodiments, non-invasive secondary circuit structures are not allowed to use circuits that are assigned to implement the user design in the primary circuit structure, but the non-invasive secondary circuit structures of some embodiments are allowed to use "leftover" circuits, for example, configurable interconnect circuits. Therefore, once a user design circuit has been implemented on the primary circuit structure, such configurable circuit elements of the primary circuit structure that are not used to implement the user design circuit may be put to use to support the secondary circuit structure and transport network.

Figure 7:
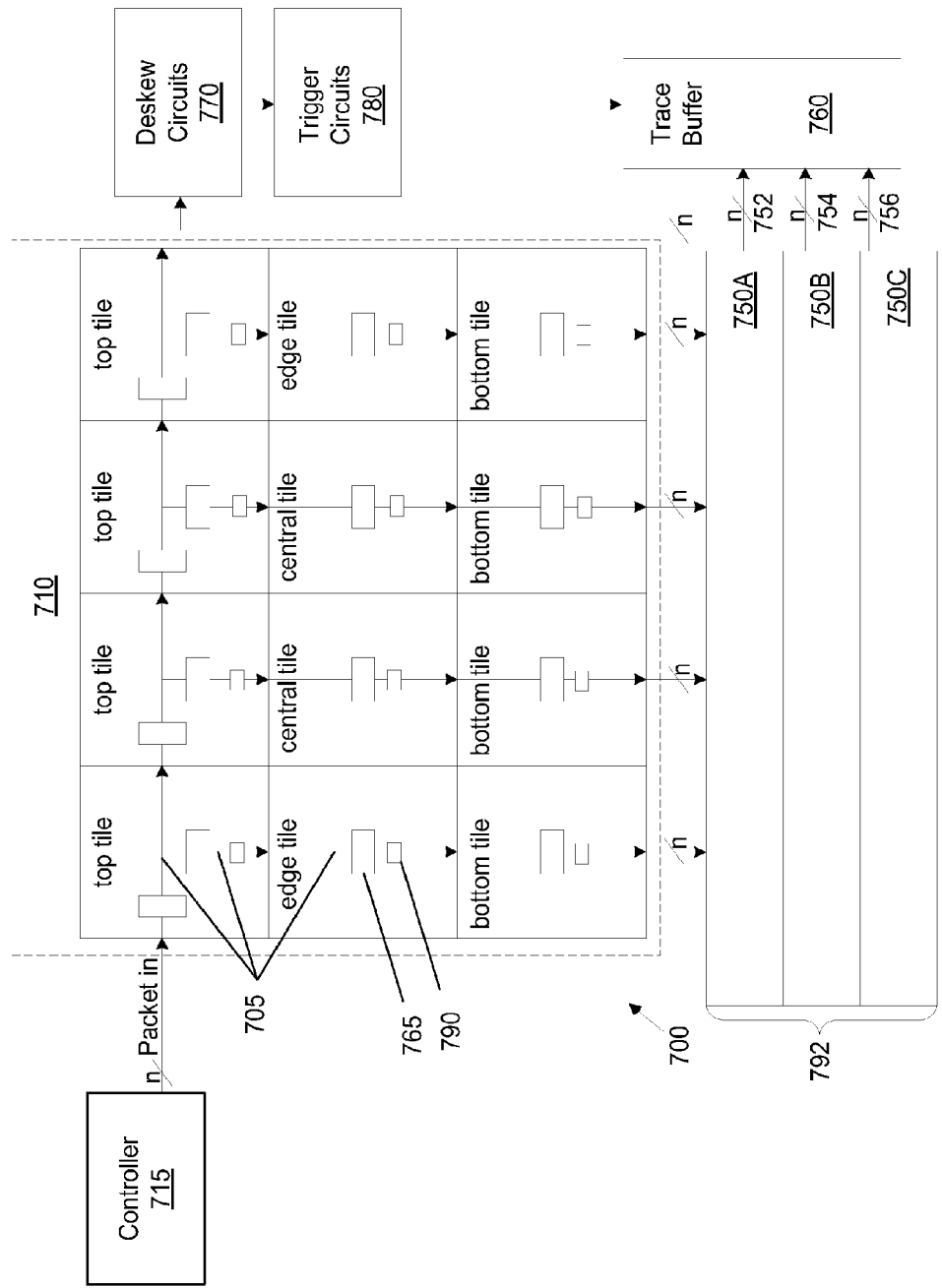
FIG. 7 illustrates circuitry of the secondary circuit structure of some embodiments.

FIG. 7 provides an overview of a secondary circuit structure of some embodiments interfacing with a primary circuit structure. As shown in this figure, this secondary circuit structure includes a bus 705 and a controller 715. FIG. 7 also shows a tile array 710 that includes multiple tiles. Each tile includes one or more sets of decoders 790 and a pipeline register 765. This figure also shows three layers 750A-C of a transport network 792, bitlines 752, 754, and 756, a trace buffer 760, deskew circuitry 770, and trigger circuitry 780.

The bus 705 passes through each tile of the tile array 710 of the primary circuit structure, so that the controller 715 can route packets to the tiles of the tile array 710. In some embodiments, the controller 715 is a microprocessor or some other circuit (e.g., a set of configurable circuits of the IC configured as a controller that is capable of performing the operations described below). In some embodiments, the controller 715 includes an interface (e.g., JTAG, or some other interface) to an external set of resources (e.g., memory, a workstation that runs software, etc.). In some embodiments, as further described below, the controller 715 receives data from outside of the IC, formulates the above-mentioned data packets based on the received data, and routes the data packets to the tiles of the tile array 710 over the bus 705. In some embodiments, also as further described below with respect to FIG. 8, the controller 715 receives data from within the IC, formulates the abovementioned data packets based on the received data, and routes the data packets to the tiles of the tile array 710 over the bus 705.

The data packet is routed through multiple tiles, and passes out of the bottom tiles into the transport network 792. In some embodiments, the transport network 792 is an example of the transport network 215 described above with respect to FIG. 2. In some embodiments, one or more of the transport network layers 750A-C are implemented as partial crossbars. The partial crossbars of some embodiments are described with reference to FIG. 9, below. In other embodiments, other types of circuits may be used for routing data. As shown in FIG. 7, the secondary circuit structure circuitry of the configurable IC includes a trace buffer 760, deskew circuitry 770, and trigger circuitry 780.

Additionally, each of the configurable tiles includes one or more pipeline registers 765 that buffer the signals passing through the bus 705 of the secondary circuit structure. Specifically, these pipeline registers 765 act to isolate the lines such that data passing over the bus 705 from a first configurable tile does not interfere with data passing over the bus 705 from a second configurable tile. The tiles at the top of the tile array 710 of FIG. 7 each have two pipeline registers 765—one of which is for passing signals "down" a column, while another is for passing signals "across" a column. Because of these pipeline registers 765, the secondary circuit structure is said to be fully "pipelined." In other words, more than one set of data can be present within the secondary circuit structure at any given time by virtue of these pipeline registers 765.

In FIG. 7, the tile array 705 includes four types of tiles: top, edge, central, and bottom. Central and edge tiles have a similar circuit structure, except that, in some embodiments, edge tiles store more configuration bits as they control the configurable I/Os of the configurable IC and may contain different programmable resources (e.g., the east/west tiles might contain LUTs, while the north/south tiles might not). Some example structures of these different tile types are discussed below with respect to FIGS. 13-20.

Each tile also includes a set of decoders 790. The set of decoders 790 includes a tile selector (discussed below) that evaluates each packet received through the data bus of the secondary circuit structure and determines, based on the contents of the packet (i.e., the opcode and operand) whether that packet was addressed for that tile. The set of decoders 790 also includes first and second decoders that determine, based on the contents of the packet, which resources within the tile are addressed, and the operation specified by the packet to perform at the addressed resources (e.g., read, write, etc.). The set of decoders 790 is further described below with respect to FIG. 13.

The top tiles have a network circuit structure that allows packets to pass along the top tile row through the pipeline registers 765. The top tiles also include a column selector (i.e., in some embodiments, the column selector 1330 described below with respect to FIG. 13) that can route a particular packet down a particular column that is addressed by the packet. This column selector routes frames of a packet down each column that identify which tiles are addressed by the packet. These frames include tile X and tile Y frames, which are described below.

The tile X frame is routed down each column, as it serves as (1) a column enable signal for each column that contains an addressed tile, and (2) a column disable signal for each column that included a previously addressed tile. As mentioned above, the network circuit structure of each tile also includes a set of decoders 790 that allows a tile to detect that a packet is addressed to it. A properly addressed packet that is received by a tile can then be used by the tile to populate the packet with various data residing within the tile. The tile can then forward the populated packet back to the secondary circuit structure in real time. Additionally, a properly addressed packet that is received by a tile can contain data from the secondary circuit structure for use by the primary circuit structure. In some instances, the data within the packets sent from the secondary circuit structure can be used to change user state values, change the configuration bits of tiles or circuits, or change values of one or more other storage elements in the primary circuit structure.

The bus lines exit the bottom tiles and enter the transport network 792. In some embodiments, the transport network 792 of FIG. 7 includes a set of transport network layers 750A-C. The transport network layers 750A-C route the data to and from the primary circuit structure 700 along data buses 752, 754 and 756 to the trace buffer 760 and the deskew circuits 770. As further described below, the deskew circuits 770 pass deskewed data to the trigger circuits 780.

In some embodiments, data sent from the configurable circuits via the primary circuit structure is passed to each transport network layer 750A-C. In such embodiments, each transport network layer 750A-C has the same incoming data. The configuration of the circuits in each transport network layer 750A-C determine which bits of that data will be passed along by that layer to the secondary circuit structure. In some embodiments, the configuration of circuits in each transport layer 750 may also determine when to pass along the received data. In some embodiments, the number of transport network layers 750 is higher or lower than the number shown in FIG. 7. As mentioned above, some embodiments may use different types of transport networks 792. In some embodiments, the transport network 792 has multiple layers (such networks may be called "multi-layer transport networks"), with each layer capable of receiving and passing along data from the tile array 710. In some such embodiments (described below), one or more of these layers may send data to a trigger circuit (e.g., trigger circuit 780) that triggers a trace buffer (e.g., trace buffer 760) to stop recording new data.

In FIG. 7, and in some other figures of this specification, data lines are represented with a slash through them and the letter "n" (or a number) next to the slash. These symbols indicate that the line represents multiple data lines, but is represented as one line rather than render the figure difficult to understand by having a separate line for each bit of width of the line. It will be clear to those of ordinary skill in the art that: 1) other values of n can be used in other embodiments, and 2) multiple instances of "slash n" in a particular figure do not necessarily represent the same width as each other even within that particular figure.

For instance, in some embodiments illustrated by FIG. 7, data buses 752, 754 and 756 do have the same widths (n bits wide) as the data bus 705. Other embodiments may use different widths of data buses 752, 754, and 756. In some embodiments, the widths of the data buses 752, 754, and 756 are the same as each other but different from the widths described here. In other embodiments, the widths of the data buses may be different from each other. Furthermore, when the text or context indicates that a line without a "slash n" is a multiple line bus, the absence of the "slash n" should not be taken to mean that a line is a single bit data line.

In some embodiments, the primary circuit structure 700 has a known latency through each of the tiles of the tile array 710. Two implications of this known latency in each tile are that: 1) two signals that pass through different numbers of tiles may take different amounts of time to arrive at the transport network 792; and 2) the amount of time it takes for a signal to pass through a set of tiles can be predicted from the path through the tiles. More specifically, the amount of time necessary for a read message to reach an intended tile from the controller 715, and for the data from that tile to reach the transport network layers 750A-C depends on the location of the tile in the array 710.

This raises the issue of how to compare data that comes from different parts of the configurable IC (e.g., different tiles in the tile array 710). The deskew circuitry 770 compensates for the variance in delays caused by bits arriving from different physical locations. In some embodiments, the deskew circuitry 770 also compensates for other delays. Other delays may include those incurred in compensating for congestion of the secondary circuit structure and those caused by retiming of the configured circuit. The deskewing operation of the deskew circuitry 770 allows the trigger circuits 780 to operate on data that is adjusted to appear properly simultaneous. In some embodiments, circuitry of the secondary circuit structure thus performs a mask and merge operation, as further described below, such that the data passing through the secondary circuit structure is not disjointed.

In some embodiments, the bandwidth (i.e., the amount of data during a given time) that the bus 705 can carry to the transport network 792 is limited by the width of the bus 705. In some circumstances, it is desirable to collect more data bits from a given column than the width of the bus in that column would allow. In some embodiments, this problem is solved by using the routing fabric of the tiles to send the additional data bits to tiles in one or more other columns. In other words, if the demand from a particular column is higher than the capacity in that column, then the routing fabric can redirect the signal to another column with excess capacity (i.e., a set of configurable circuits that are not assigned to the user design). Examples of routing fabric, such as wiring and interconnects that connect the configurable logic circuits are disclosed in U.S. Pat. No. 7,295,037, issued Nov. 13, 2007. Moreover, a more detailed discussion for the various components illustrated in FIG. 7 and for other components of the primary and secondary circuit structures described herein is provided for in U.S. patent application Ser. No. 11/769,680, filed Jun. 27, 2007, and U.S. Pat. No. 7,375,550, issued May 20, 2008. This application and this Patent, namely and U.S. Pat. No. 7,375,550, are incorporated herein by reference.

In this specification, the figures show the data flowing "down" the secondary circuit structure, then along the transport network 792 from left to right, then into a trace buffer 760 to the right of the transport network 792 and into trigger circuits 780 above the transport network 792. However, it will be clear to one of ordinary skill in the art that other orientations of components other than the particular orientations illustrated are possible within the scope of the invention. For example, the primary circuit structure might send data "up" to a transport network 792 above the tile array, or data might flow from "right" to "left" to reach trigger circuits and/or trace buffers on the left instead of the right, etc.

As mentioned above, the controller 715 includes an interface to the primary circuit structure of the IC. In some embodiments, such an interface is provided through a fabric port. In some embodiments, a fabric port provides an interface between the controller 715 of the secondary circuit structure and the primary circuit structure (also referred to as the "user design"). Thus, the fabric port provides a mechanism for the user design to access and control resources of the secondary circuit structure (e.g., configuration bits within the secondary circuit structure). Through the fabric port, the primary circuit structure is able to interact with the secondary circuit structure in an internal manner that is similar to external mechanisms (e.g., external software communicating with the secondary circuit structure through a JTAG or some other interface).

Figure 8:
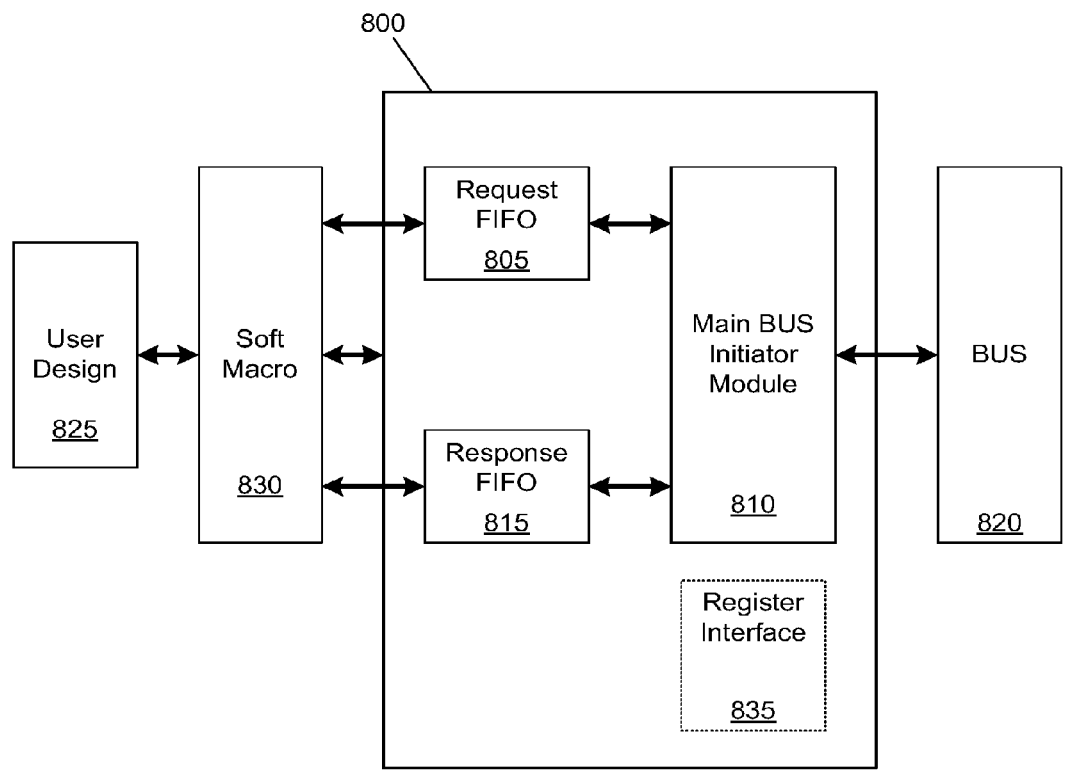
FIG. 8 illustrates a fabric port of some embodiments.

FIG. 8 illustrates such a fabric port 800 of some embodiments. As shown, the fabric port 800 includes a request FIFO 805, a main bus initiator module 810, and a response FIFO 815. The main bus initiator module 810 is communicatively coupled to the request FIFO 805, the response FIFO 815, and the main bus 820 of the secondary circuit structure. In some embodiments, this main bus is the bus 705 of FIG. 7. In some embodiments, the request FIFO 805 and the response FIFO 815 are communicatively coupled to the user design 825 through a soft macro 830. The soft macro 830 provides a layer of abstraction between the user design 825 and the FIFOs 805 and 815. In some embodiments, the soft macro 830 is instantiated in the routing fabric of the primary circuit structure. In some embodiments, this instantiation occurs by configuring a portion of the primary circuit structure to implement the soft macro 830. In some embodiments, in addition to, or in lieu of the soft macro 830, a microprocessor (not shown) is used to perform these functions.

The fabric port 800 composes user logic requests (e.g. control, data, etc.) from the user design 825 by accumulating data from the request FIFO 805. Similarly, in some embodiments, the fabric port 800 decomposes user logic request completions into one-byte chunks and pushes them into the user design 825 through the response FIFO 815. In addition, the fabric port includes a register interface 835 for permitting user design read/write register access.

In some embodiments, the fabric port 800 is used to partially reconfigure the configurable circuits of the IC by sending packets based on data from the user design 825 through the fabric port into the main bus 820 and direct the packets to the secondary circuit structure. In some of these embodiments, the fabric port 800 allows the user design 825 to check the results of the reconfiguration through the fabric port 800. In other words, the primary circuit structure is able to receive (i.e., read) data from the secondary circuit structure through the fabric port 800. In some embodiments, the primary circuit structure is able to receive data pertaining to the data of the secondary circuit structure itself through the fabric port 800. In some embodiments, this data includes event count values, trigger event signals, etc., as further described below.

B. Transport Network

Figure 9:
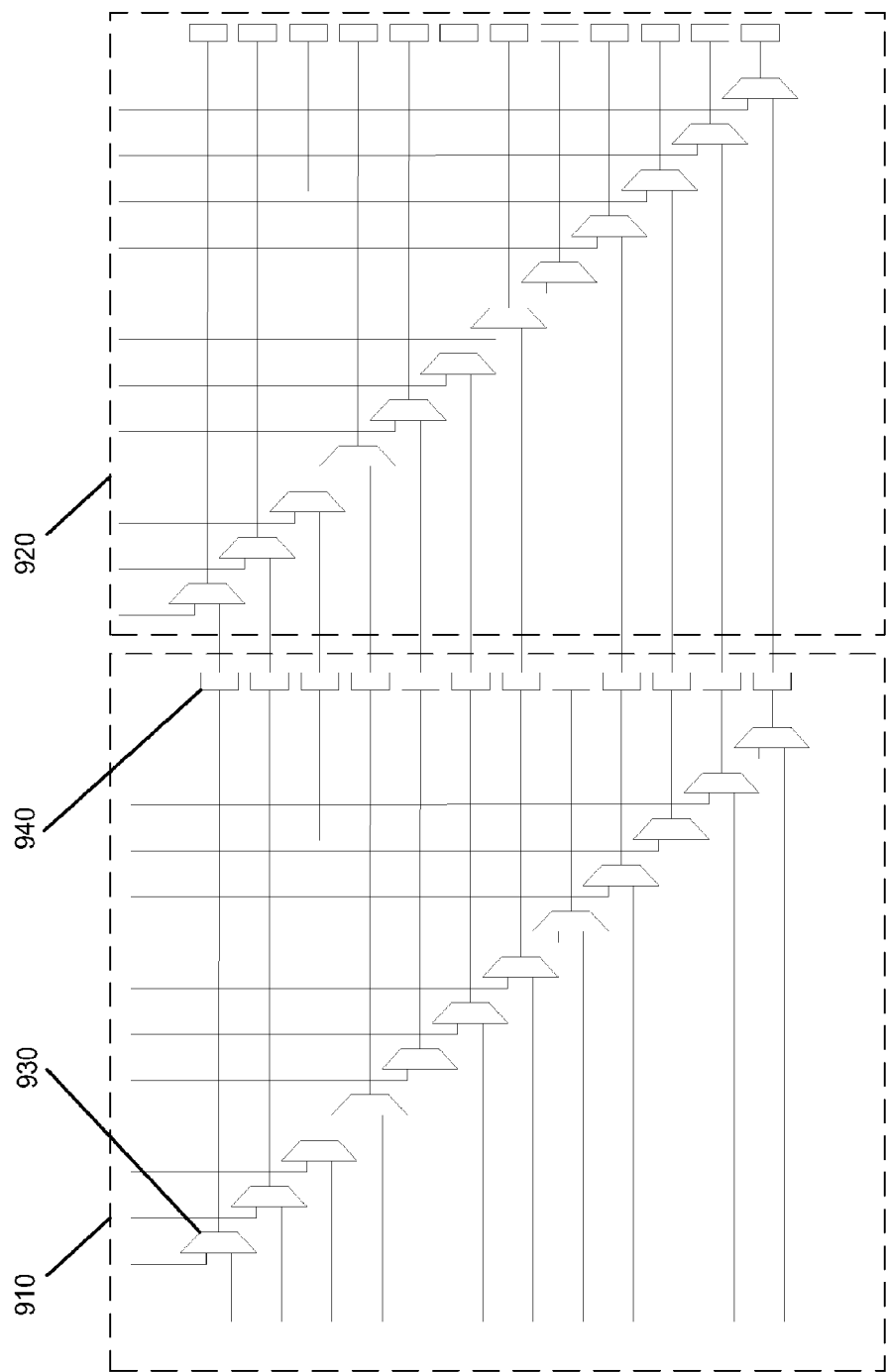
FIG. 9 illustrates partial crossbars of some embodiments.

The secondary circuit structure of some embodiments passes out of the main tile array 710 and enters into the transport network layers 750A-C of the transport network 792. In some embodiments, one or more of the transport layers 750A-C include a set of multiplexers implemented as a partial crossbar, as shown in FIG. 9. FIG. 9 illustrates two partial crossbars 910 and 920 that each include multiple multiplexers 930 and storage elements 940. Each multiplexer 930 can be set, during the operation of the secondary circuit structure, to pass on data from the column above it, or from the immediately previous section of the partial crossbar (i.e., the output of the storage element 940 that provides one of the inputs of the multiplexer 930). It will be clear to one of ordinary skill in the art that, in some embodiments, the "first" column (e.g., the leftmost column) in the chain does not receive inputs from a "preceding" column, as the first column has no preceding column. Additionally, in some embodiments, the storage elements 940 provide a delay. In some such embodiments, these storage elements 940 hold and transmit a value once every sub-cycle. In some embodiments, these storage elements 940 hold signals that arrive from the tile array at a congested sub-cycle until a free sub-cycle is available. While FIG. 9 illustrates an exemplary partial crossbar structures of a transport layer of some embodiments, other embodiments implement crossbars of transport layers differently. In other words, one layer of the transport network 792 (e.g., layer 750A) may be physically different from another layer (e.g., layer 750B) of the transport network 792.

Figure 10:
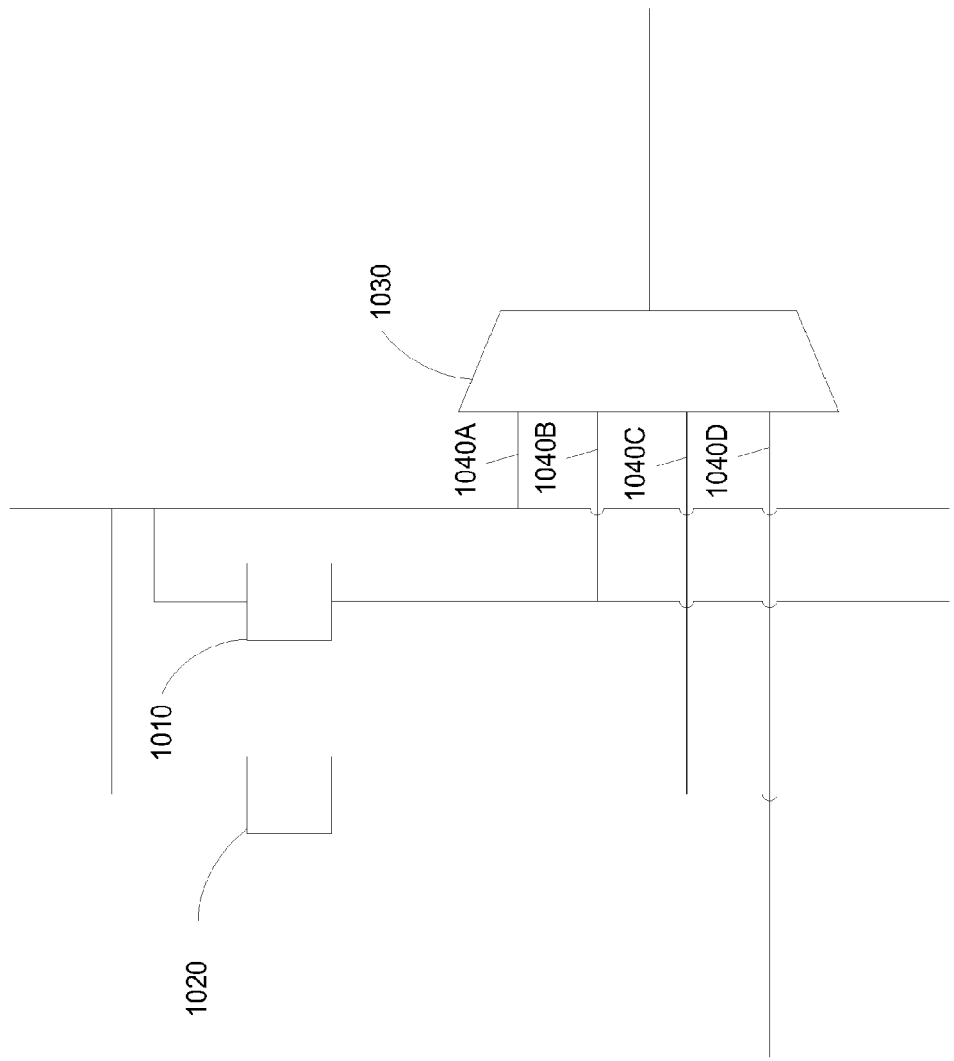
FIGS. 10 and 11 illustrate elements of a transport network layer of some alternative embodiments.

FIG. 10 illustrates elements of an alternate embodiment of a transport layer. FIG. 10 includes storage elements 1010 and 1020 and a multiplexer 1030. In some embodiments, the multiplexer 1030 is one of the multiplexers 930 shown in FIG. 9. The multiplexer 1030 has four inputs, 1040A-D. Input 1040A comes directly from the secondary circuit structure (e.g., another layer of the transport network or from a bottom tile). Input 1040D comes from a multiplexer to the left (not shown). In some embodiments, the multiplexer to the left is a multiplexer of the same transport layer as the multiplexer 1030. Inputs 1040B and 1040D come from the outputs of storage elements 1010 and 1020 respectively. Storage elements 1010 and 1020 receive input from the secondary circuit structure. The storage elements of some embodiments either "hold" the value of a previously received input, or pass the value of the input as it comes in. A "held" value is available at the output of the storage element until the storage element is switched back to pass. In some embodiments, switching from pass to hold (or vice versa) is commanded by a signal on a control line (not shown). In other embodiments, the storage element can be pre-programmed to switch in a given sub-cycle. In some embodiments, these storage elements 1010 and 1020 are any type of storage element (e.g., UDS elements, RCLs, registers, etc.).

For this specification, combinations of circuit elements such as the one illustrated in FIG. 10 will be called "delay select multiplexers." The "delay select multiplexers" of some embodiments have multiple inputs that receive data on multiple data lines. The multiple data lines branch from a single data line, with at least some of the data lines having a storage element or other configurable delaying circuit element after the branch but before the input. Such delay select multiplexers can be used in place of the two input multiplexers described in relation to the partial crossbar of FIG. 9. In some embodiments, the delay select multiplexers are provided in a chain of multiple delay select multiplexers.

Figure 11:
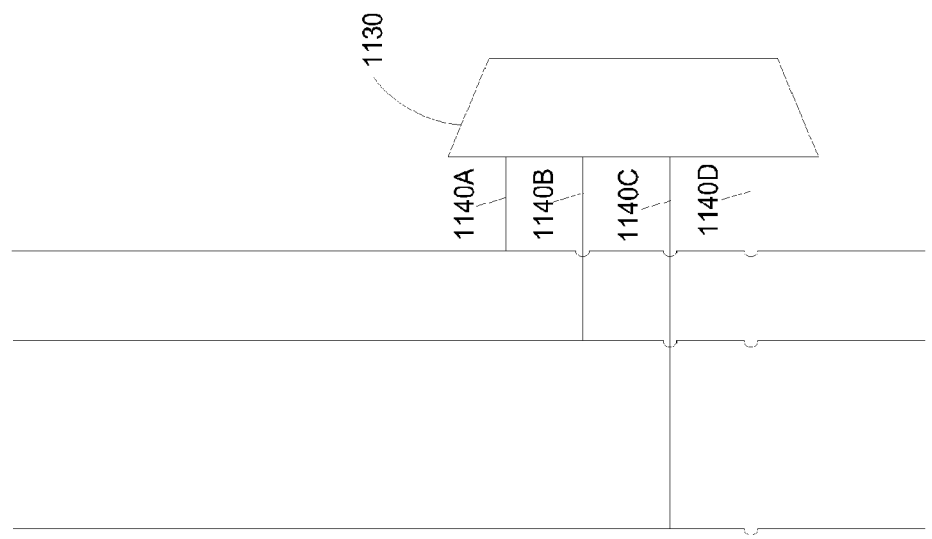

FIG. 11 illustrates another example of some embodiments of circuitry of a transport layer. FIG. 11 illustrates a multiplexer 1130 and input lines 1140A-D for the multiplexer 1130. The input lines 1140A-C of the secondary circuit structure are received from "above" the transport layer of the circuitry of FIG. 11 (e.g., from a "higher" layer or from a bottom tile). The input line 1140D is received from another multiplexer (not shown) of the same transport layer to the left of the multiplexer 1130.

In some embodiments, a combination of multiple different circuits (e.g., the circuits described in FIGS. 10 and 11) may be used within the same transport layer. In some embodiments, these different circuits are used within the same partial crossbar of a transport layer (such as the partial crossbar illustrated in FIG. 9). One of ordinary skill in the art would recognize that these different implementations of transport layer circuitry allow different signals to be passed through the various transport layers of the transport network 792 with varying amounts of delay. The result of these multiple implementations of transport layer circuitry is that there is great flexibility in which sub-cycle and on which connection a bit of data reaches the trace buffer 760.

C. Accessing the Primary Circuit Structure Through the Secondary Circuit Structure In some embodiments, some or all of the elements within the primary circuit structure of the IC are available to the secondary circuit structure. As noted above, examples of such elements include UDS elements (such as RCLs and other storage elements in the routing fabric, memory cells, register cells, etc.), LUTs, configuration memory elements, and/or other circuit elements that connect to the secondary circuit structure. As the elements are accessible through the secondary circuit structure, this network can be used to access (i.e., read from or write to) the elements in any sequential or random access manner. Random access in this context means that the elements can be accessed through the secondary circuit structure and the data packets as desired by a user or debugger, rather than in a particular set sequence.

Moreover, as the elements are accessible through the secondary circuit structure, this network can read out the state (e.g., the value of UDS elements) of the configurable IC while the IC is operating. The secondary circuit structure can also write values to these elements. The ability to read and write to the elements of the primary circuit structure is highly advantageous for performing various operations, including debugging, during the operation of the configurable IC.

a. Packet-Switch Secondary Circuit Structure

In some embodiments, the accessing of memory elements of the primary circuit structure is performed through packet switching. In some embodiments, data used to read and/or write to the primary circuit structure is received by the controller 715, which formulates packets to transmit through the secondary circuit structure. A data packet may include one or more frames. In some embodiments, each frame is 18 bits wide. These frames have a six-bit opcode and a twelve-bit operand in some embodiments. Other embodiments include different widths of frames, opcodes, and/or operands. In some embodiments, each frame is as wide as the data bus of the secondary circuit structure. In some embodiments, different data packets have a different number of frames. In other words, some embodiments allow the controller of the secondary circuit structure to transmit variable-width packets.

FIG. 12 conceptually illustrates examples of types of frames with different opcodes that are used in some embodiments. These frames include:

(1) Tile X, which has its lower eight bits identify the column associated with a tile and its higher four bits identify a tile type (i.e., top, bottom, edge, or central), (2) Tile Y, which has its lower eight bits identify the row associated with a tile and its higher four bits identify a tile type, (3) Load Address, which provides an address of a resource within a tile that was previously addressed by a Tile X and/or a Tile Y frame, thus causing the tile to store the address in an address register of the tile, (4) Read, which directs the addressed tile to provide the output of a particular resource (e.g., a UDS element that was identified by a Load Address frame), (5) Read Increment, which directs the addressed tile to provide the output of a particular resource and to increment the address stored in the address register, (6) Write, which directs the addressed tile to write to a particular resource that is identified by the address in the address register, (7) Write Increment, which directs the addressed tile to write to a particular resource that is identified by the address in the address register and to increment the address stored in the address register, and (8) Stream, which directs the addressed tile to provide the output of a resource, where the resource was previously identified by configuration data.

b. Network Structure of Tiles

Figure 13:
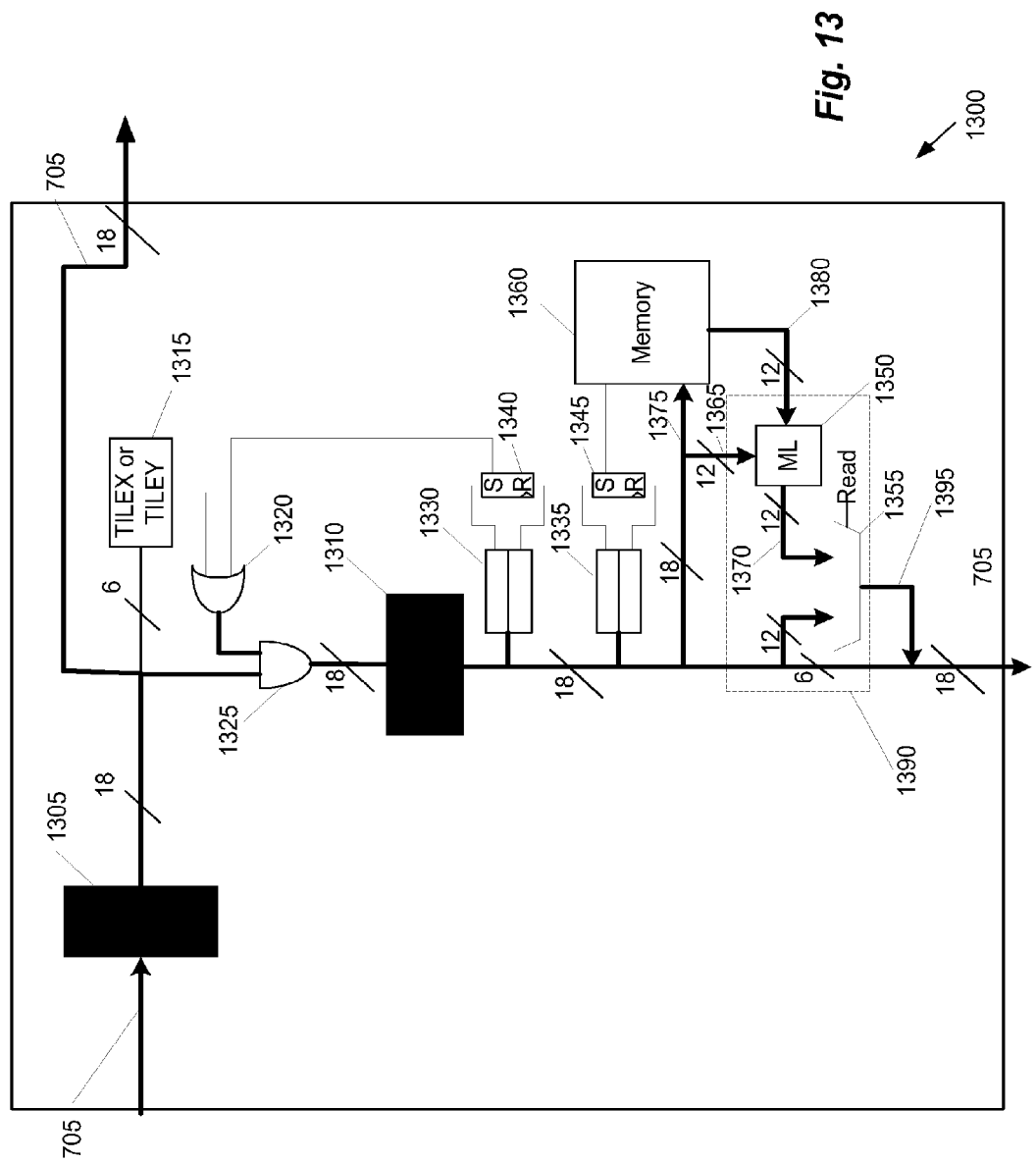
FIG. 13 illustrates a top tile of some embodiments.

Each of the abovementioned packets are received by several tiles. In some embodiments, the tiles at the top of the tile array 710 (i.e., "top tiles," as mentioned above) of FIG. 7 receive each packet transmitted by the controller 715. FIG. 13 illustrates secondary circuit structure circuitry of such a top tile 1300 of some embodiments. This secondary circuit structure circuitry allows the top tile to perform the top tile functionality discussed above (i.e., column selection), as well as the functionality that other types of tiles perform (e.g., row selection, reading/writing data based on received packets, etc.). As shown in this figure, these circuits include two 18-bit wide sets of storage elements (e.g., latches) 1305 and 1310, one tile X/tile Y decoder 1315, an OR gate 1320, an AND gate 1325, a column selector 1330, a row selector 1335, two set and reset registers 1340 and 1345, a conceptual memory block 1360, and a masking circuit 1390, which includes masking logic 1350 and multiplexer 1355. Several bitlines (e.g., bitlines 1365, 1370, 1375, and 1380) communicatively couple several of these circuits together, as described below.

In FIG. 13, the sets of storage elements 1305 and 1310 connect to the 18-bit wide bus 705 (i.e., the bus shown in FIG. 7, in some embodiments) to receive 18-bit frames. In some embodiments, each of the set of storage elements 1305 and 1310 is an example of a pipeline register 765 shown in FIG. 7. In some embodiments, on each edge of the clock of the IC, the set of storage elements 1305 stores 18 bits of data (i.e., a frame) that appears on the bus 705 and outputs the 18 bits of data (i.e., the frame) that it latched on the prior clock edge. Each set of 18 bits (i.e., each frame) that the storage element set 1305 outputs is routed to the next top tile along the 18-bit wide bus 705. The 18 bits output from the last top tile (i.e., the tile to which there is not an adjacent tile to which the frame can be routed) are discarded in some embodiments.

The tile X/tile Y decoder 1315 receives six bits (e.g., the highest six bits) of each 18 bits (i.e., each frame) that is output from the storage element set 1305. This decoder examines these six bits to determine whether these six bits represent a tile X or tile Y opcode. If not, the decoder 1315 outputs a "0" in some embodiments.

Alternatively, when the six-bit opcode is a "Tile X" or "Tile Y" opcode, the decoder 1310 outputs a "1" in some embodiments, which causes the OR gate 1320 to output a "1" along its 18 output lines. These outputs of the OR gate 1320, in turn, allow the 18 bits that are output from the storage element set 1305 to pass through the 18 bit-wide AND gate 1325 (i.e., cause the AND gate to output 18 bits that are identical to the 18 bits that it receives from the storage element set 1305).

The storage element set 1310 receives the 18-bit wide output of the AND gate 1325. On the next clock edge, the storage element set 1310 outputs the 18 bits. The column selector 1330 receives the output of the storage element set 1310. The column selector 1330 determines whether the frame is a tile X frame (i.e., whether the received six bits represent a tile X opcode). If so, the column selector 1330 determines whether the operand of the received tile X frame matches the type or the x-address of the tile 1300. As mentioned above, in some embodiments, the lower eight bits of a tile X frame provide the x-address (i.e., the column address) of a tile, while its next four bits provide the type of the tile.

The column selector 1330 directs the register 1340 to assert a reset signal (i.e., a "0" in this case) when the column selector 1330 receives a tile X frame (i.e., the 18 bits output from the storage element set 1310) that has an operand that matches neither the type nor the x-address of the tile 1300. On the other hand, when the received frame is a tile X frame with an operand that matches the type or x-address of the tile 1300, the column selector 1330 directs the register 1340 to assert a set signal (i.e., a "1" in this case). A set signal causes the OR gate's 1320 outputs to remain high even after the decoder 1315 pulls its output low when this decoder 1315 no longer detects a tile X or tile Y opcode (i.e., no longer receives a tile X or tile Y frame). By keeping the OR gate outputs high, the AND gate 1325 continues to route frames down the column of tile 1300, until the time that the column selector 1330 receives a tile X frame whose operand does not match the type or the x-address of the tile 1300. Once the column selector 1330 receives such a tile X frame, it directs the register 1340 to reset its output (i.e., to output a "0"). At this point, when the tile X/tile Y decoder 1315 does not output a "1," the OR gate 1320 will output a "0" (i.e., will prevent the AND gate 1325 from routing any more frames down the column of tile 1300) until the tile X/tile Y decoder 1315 detects another tile X or Y frame.

The row selector 1335 also receives the output of the storage element set 1310. The row selector 1335 determines whether the received frame is a tile Y frame (i.e., whether the higher six bits output from the storage element set 1310 indicate a tile Y opcode), and if so, whether the operand (i.e., the lower 12 bits output from the storage element set 1310) of the received tile Y frame matches the type or the y-address of the tile 1300. As mentioned above, in some embodiments, the lower eight bits of a tile Y frame provide the y-address (i.e., the row address) of a tile, while its next four bits provide the type of the tile.

The row selector 1335 directs the register 1345 to assert a reset signal (i.e., a "0" in this case) when it receives a tile Y frame with an operand that matches neither the type nor the y-address of the tile 1300. On the other hand, when the received frame is a tile Y frame with an operand that matches the type or the y-address of the tile 1300, the row selector 1335 directs the register 1345 to assert a set signal (i.e., a "1" in this case). A set signal from the register 1345 activates the decoder logic associated with the conceptual memory block 1360 of the tile 1300, while the reset signal from the register 1345 deactivates this decoder logic. This decoder logic is further described below with respect to FIG. 14.

The conceptual memory block 1360 conceptually represents tile 1300's (1) storage elements that store configuration data, (2) RCLs (i.e., routing multiplexers that can serve as latches), (3) storage elements (e.g., latches, and/or registers) that store mode bits that define one or more operational modes of the resources within the tile 1300, (4) storage elements (e.g., memory cells) in a memory array, (5) UDS elements, and/or (6) any other memory structure.

The storage elements of the conceptual memory block 1360 are not actually physically organized in a contiguous block in some embodiments. However, in some embodiments, groups of storage elements (e.g., configuration cells), RCLs, UDS elements, and/or registers can be enabled at one logical "row" time for a read or write operation. In some embodiments, groups of such storage elements can be enabled individually. For instance, in some embodiments, groups of twelve configuration storage elements, groups of twelve or four RCLs, and groups of twelve one-bit registers can be enabled at one time. The decoder logic for addressing these groups of storage elements and RCLs will be further described below with respect to FIG. 14.

Through a set of bitlines 1375, the conceptual memory block 1360 also receives the 18-bit output of the storage element set 1310 (i.e., connects to the 18 bit-wide bus 705 and receives the frame output from the storage element set 1310). Through this connection, data can be written to any storage element of the tile. These storage elements include RCLs, UDS elements, configuration storage elements, registers, memory cells, and/or any other storage elements in the block 1360, as further discussed below with respect to FIG. 14.

c. Reading from and Writing to Storage Elements of a Tile

Figure 14:
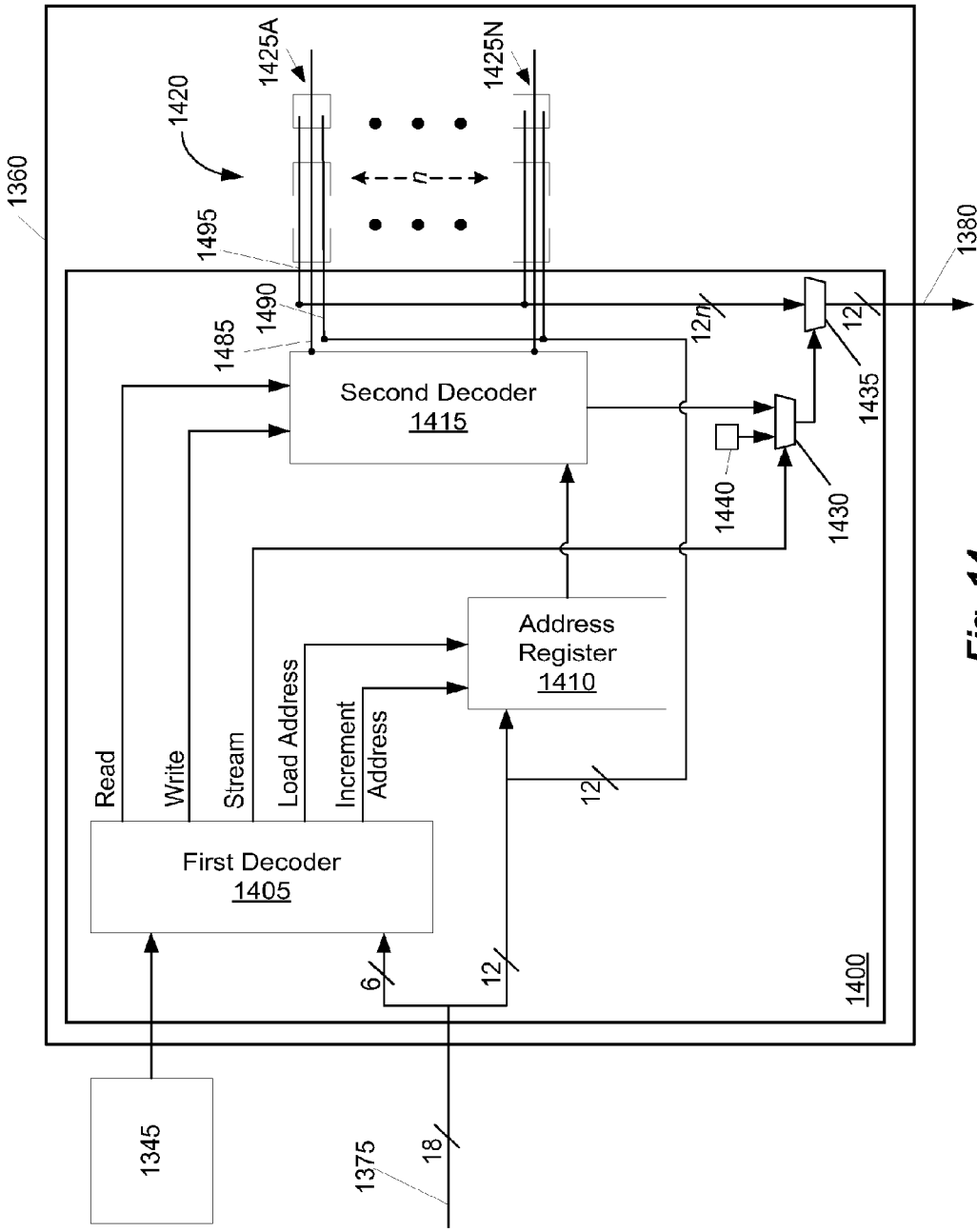
FIG. 14 illustrates decoder logic of a conceptual memory block of some embodiments.

FIG. 14 illustrates a conceptual memory block 1360 of some embodiments. The memory block 1360 includes a set 1420 of storage elements (e.g., UDS elements, configuration memory cells, etc., or some combination thereof). The set 1420 of storage cells includes n logical rows 1425A-N of storage elements. In some embodiments, each logical row 1425 of storage elements includes 12 one-bit storage elements. The conceptual memory block 1360 also includes decoder logic 1400 that is used to read from and write to the set 1420 of storage elements (e.g., UDS elements, configuration storage elements, etc.). In some embodiments, this decoder logic 1400 is included in the conceptual set of decoders 790 mentioned above. As shown in FIG. 14, the decoder logic 1400 includes first and second decoders 1405 and 1415, an address register 1410, multiplexers 1430 and 1435, and a set of storage elements for storing configuration data 1440.

The conceptual memory block 1360 receives 18 bits (i.e., a six-bit opcode and a twelve-bit operand) of input over a set of lines 1375 from the storage element set 1310. The first decoder 1405 receives the six-bit opcode of the received 18 bits. The first decoder 1405 also receives the output of the set/reset register 1345. When the output of the register 1345 is active (i.e., is set), the decoder 1405 decodes the opcode that it receives to determine whether to assert a Read signal, a Write signal, a Stream signal, a Load Address signal, and/or an Increment Address signal on its output.

The first decoder 1405 asserts a Read signal when the opcode specifies a Read, Read Increment, or Stream. It asserts a Write signal when the opcode specifies a Write or Write Increment. It asserts a Load Address signal when it receives a Load Address opcode. It asserts an Increment Address signal when it receives a Read Increment or Write Increment opcode, and it causes a read or write operation to be performed, based on the opcode. The Load Address and Increment address signals are supplied to the address register 1410. The address register 1410 also receives the 12-bit operand of the frame output (i.e., within the 18-bit output) of the storage element set 1310. When the Load Address signal is active (i.e., is asserted by the decoder), the address register 1410 loads in the address specified by the 12-bit operand. The Stream signal directs the operation of the multiplexer 1430, which is described below. When the Increment Address signal is active, the address register 1410 increments the address that is currently stored in the address register 1410. In some embodiments, the first decoder 1405 does not output an Increment Address signal. In some of these embodiments, the address increment functionality is performed by the controller of the secondary circuit structure.

The address register 1410 outputs the address that it stores to the second decoder 1415, which is responsible for enabling a set of blocks 1420 that represent storage elements (e.g., the configuration cells, register cells, memory cells, UDS elements, RCLS, etc.) of the tile 1300. In some embodiments, each address that the second decoder 1415 receives can identify a conceptual "row" 1425 of up to 12 storage elements (e.g., configuration cells, register cells, memory cells, UDS elements, etc.). In some embodiments, this maximum number (i.e., 12 in this case) is dependent on the number of bits of the operand of the data packet.

When the Write signal output by the first decoder 1405 is active, the second decoder enables (through the enable line 1485) the addressed row 1425. The 12-bit operand data is written to the blocks enabled by the second decoder 1415 over a write data line 1490. During a read operation, the data from an addressed row 1425 (e.g., a row 1425 specified by configuration data 1440 or an address output by the second decoder 1415) is read over the set of read data lines 1495. In some embodiments, a row 1425 that is addressed for a read or write operation also receives an enable signal over the enable line 1485. The data that is read out from the addressed row 1425 is output onto the output lines 1380 of the memory block 1360.

In some embodiments, a write operation writes data to an entire logical row 1425 of storage elements. In some embodiments, a portion of a row may be written by first (1) reading the row, (2) storing these read values (e.g., in another set of storage elements that are addressable by the secondary circuit structure, in a memory of the controller of the secondary circuit structure, etc.), and (3) writing back the read values with the new portion. For instance, a row 1425 may contain the following 12 bits: 0 1 1 0 1 1 1 0 1 0 1 1. In order to write a value of 0 0 0 0 to the least significant four bits (i.e., the rightmost bits), a Read packet would cause the 12 bits to be read. These 12 bits would then be stored (e.g., in another set of storage elements, in a memory of the controller, etc.). A new Write packet would then be generated by the controller for that row 1425 that includes the following 12 bits (with the new four least significant bits): 0 1 1 0 1 1 1 0 0 0 0 0.

In some embodiments, some or all of the rows 1425 of storage elements, including storage elements that are not addressed (e.g., by a Read frame) continuously output their stored values over read lines 1495. In some embodiments, these values output by the addressed and non-addressed storage elements are received by a multiplexer 1435. The multiplexer 1435 conceptually illustrates the concept of selecting between various outputs of the set 1420 of storage elements. In some embodiments, the multiplexer 1435 outputs the values stored by one row 1425 of storage elements over bitline 1380. In some embodiments, this bitlines 1380 is received by the masking logic 1350, as shown in FIG. 13.

One of ordinary skill will realize that other embodiments might not utilize an actual multiplexer structure for the multiplexer 1435, but instead use a tri-state approach. For instance, several different conceptual rows 1425 of storage elements might share a particular set of twelve-bit lines (not shown) to provide their output. To do this, each conceptual row 1425 of storage elements has a set of tri-stateable drivers (not shown) that output their stored values onto the particular shared set of 12-bit read lines. When a particular conceptual row 1425 of storage elements is not being read, its associated set of drivers are tri-stated. On the other hand, when the conceptual row 1425 is read, its associated set of drivers are used to drive the stored values of the conceptual row 1425 onto the particular shared set of 12-bit lines. In some such embodiments, the tri-stateable drivers for the set of storage elements being read are activated by the output of the multiplexer 1430.

The multiplexer 1430, whose output is received as the selection bit of the conceptual multiplexer 1435, receives a set of configuration data 1440 as one input. The other input of the multiplexer 1430 is an address signal from the second decoder 1415. In some embodiments, this address signal corresponds to one of the rows 1425 of storage elements. In some embodiments, the set of configuration data 1440 also corresponds to (i.e., addresses) one of the rows 1425 of storage elements. In some embodiments, the configuration data 1440 is loaded during configuration time of the IC. The configuration data 1440 is illustrated as being separate from the other storage elements 1420 of the memory block 1360. However, in some embodiments, the configuration data 1440 is stored in one of the storage elements 1420.

The multiplexer 1430 selects between the configuration data 1440 and the address signal based on a Stream signal received from the first decoder 1405. As mentioned above, when the first decoder 1405 receives a Stream opcode (thus indicating that the secondary circuit structure is in streaming mode in some embodiments), the first decoder 1405 outputs a true Stream signal. When receiving a true Stream signal at its select bit, the multiplexer 1430 outputs the configuration data 1440 to the select line of the multiplexer 1435, thus causing the multiplexer 1435 to output, over the bitlines 1380, the values of a row 1425 of storage cells addressed by the configuration data 1440. Otherwise, the multiplexer 1430 outputs the address from the second decoder 1415 to the select line of the multiplexer 1435, thus causing the values of a row 1425 of storage cells addressed by a packet (e.g., a previous packet with a Load Address frame) to be output over the bitlines 1380. Thus, as made apparent by the discussion of the multiplexer 1430, when in streaming mode, the reading out of storage elements 1425 over the secondary circuit structure is controlled by configuration data 1440. When not in streaming mode, the reading out of storage elements 5225 over the secondary circuit structure is controlled by addresses specified by frames of packets sent through the secondary circuit structure (e.g., by the controller 715 of FIG. 7). Reading and writing to addressed rows 1425 of storage elements, as mentioned above, is described in more detail with respect to FIG. 15.

Figure 15:
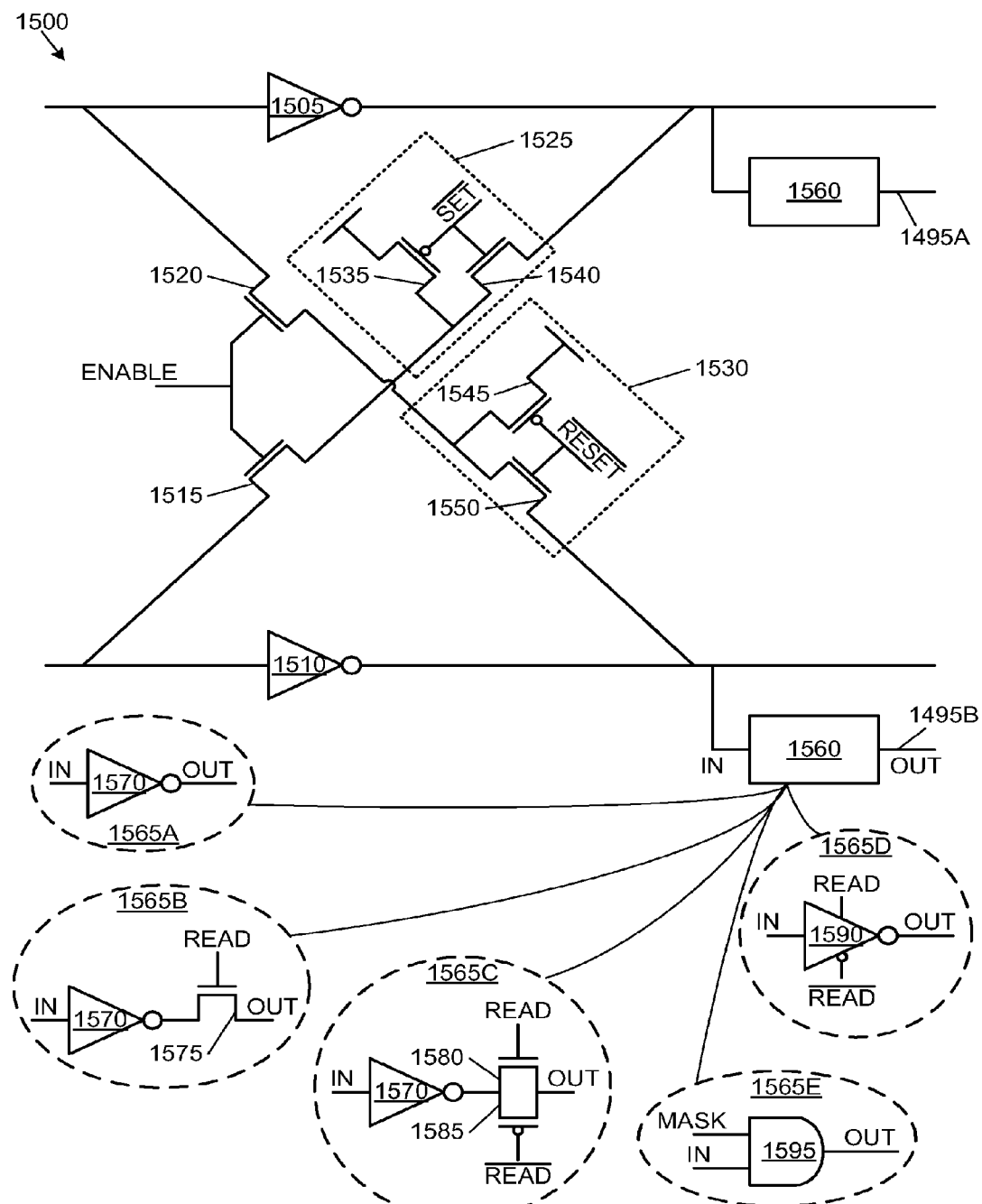
FIG. 15 illustrates a storage element of some embodiments.

FIG. 15 illustrates a storage element of some embodiments which can be read and written to in the manner described above. In some embodiments, the storage elements of the rows 1425 have a complementary pass logic design. In other words, a logical bit is represented as two complementary bits. In some embodiments, this storage element is located at the input of a configurable circuit (e.g., a configurable RMUX). In some embodiments, this storage element is located at the output of a configurable circuit. In this example, this storage element is a transparent latch 1500. Such a transparent latch 1500 is described in more detail in U.S. Provisional Patent Application 61/097,798, filed Sep. 17, 2008. However, a brief description is provided below.

The transparent latch 1500 includes two output buffers 1505 and 1510 that are cross-coupled by two transistors 1515 and 1520 (i.e., one transistor connects the input of the first buffer to the output of the second buffer, while the other transistor connects the input of the second buffer to the output of the first buffer). These two transistors 1515 and 1520, when enabled, cause the transparent latch 1500 to latch (i.e., continuously output its stored value).

To write to the transparent latch 1500 through the secondary circuit structure, some embodiments insert a set-enable circuit 1525 and a reset-enable circuit 1530 in series with each of the cross-coupling transistors 1515 and 1520, as shown in FIG. 15. This figure illustrates that in some embodiments, the set-enable circuit 1525 includes one NMOS pass transistor 1540 and one PMOS pull-up transistor 1535. The NMOS pass transistor 1540 is connected in series with one cross-coupling transistor 1515. The PMOS pull-up transistor 1535 connects, at its drain, to the node between the two transistors 1515 and 1540, and connects, at its source, to the supply voltage.

The gates of transistors 1535 and 1540 are both tied to the complement of the SET signal, which is high when a logic high value has to be written into the latch. When the ENABLE and SET signals are high (and RESET is low), the transistor 1540 is off, and the transistor 1535 is on, thus driving the node between the two transistors 1515 and 1540 to a logical high. Since transistor 1515 is on, the value at the output of inverter 1510 is driven to a logical low. The value at the output of inverter 1510 is then passed through transistors 1550 and 1520 to the input of inverter 1505, thus driving the output of inverter 1505 to a logical high. When SET's complement is brought back to a logical high, transistor 1540 is turned on and transistor 1535 is turned off, connecting the output of inverter 1505 to the input of inverter 1510, so that the cross-coupled inverters reinforce each other's value.

FIG. 15 further illustrates that in some embodiments the reset-enable circuit 15305 includes one NMOS pass transistor 1550 and one PMOS pull-up transistor 1545. The NMOS pass transistor 1550 is connected in series with one cross-coupling transistor 1520. The PMOS pull-up transistor 1545 connects, at its drain, to the node between the two transistors 1520 and 1540, and connects at its source to the supply voltage. The gates of transistors 1545 and 1550 are both tied to the complement of the RESET signal, which is high when a logic low value has to be written into the latch.

When the ENABLE and RESET signals are high (and SET is low), the transistor 1550 is off, and the transistor 1545 is on, thus driving the node between the two transistors 1520 and 1550 to a logic high. Since transistor 1520 is on, the value at the output of inverter 1505 is driven to a logic low. The value at the output of inverter 1505 is then passed through transistors 1540 and 155 to the input of inverter 1510, thus driving the output of inverter 1510 to a logic high. When RESET's complement is brought back to a logic high, transistor 1550 is turned on and transistor 1545 is turned off, connecting the output of inverter 1510 to the input of inverter 1505, so that the cross-coupled inverters reinforce each other's value. Note that during normal operation, either SET or RESET (or both) must be logic low at all times. Note also, that if ENABLE is logic low, both SET and RESET must be at logic low.

To read from such a storage cell through the secondary circuit structure, some embodiments insert read-enable circuits 1560 at the outputs of the inverters 1505 and 1510. Exploded views 1565A-1565E illustrate several possible embodiments of the read-enable circuit 1560. As shown in exploded view 1565A, some embodiments of the read-enable circuit contain a single output buffer 1570, which takes the value at the input of the read-enable circuit (IN) and provides IN's complement at the output of the read-enable circuit (OUT). In some embodiments, as shown in exploded view 1565b, the output buffer 1570 is placed in series with an NMOS pass transistor 1575. In these embodiments, when the READ signal is high, the pass transistor 1575 is turned on, and the value at the output of the buffer 1570 is passed to the output of the read-enable circuit (OUT). In some embodiments, as shown in exploded view 1565c, the output buffer 1570 is placed in series with a CMOS transmission gate made up of an NMOS transistor 1580 and a PMOS transistor 1585 connected in parallel. In these embodiments, when READ is high (and its complement is low), the transmission gate is turned on, and the value at the output of the buffer 1570 is passed to the output of the read-enable circuit (OUT). In some embodiments, as shown in exploded view 1565d, an output buffer 1590 is placed between the input (IN) and output (OUT) of the read-enable circuit 1560. In these embodiments, the output buffer 1590 may be enabled by bringing READ to a logic high and READ's complement to a logic low. In some of these embodiments, the output buffer 1590 may receive a single enable signal (not shown). In some embodiments, as shown in exploded view 1565e, the data at the input (IN) of the read-enable circuit 1560 is ANDed with a MASK input. In these embodiments, if MASK is high, the output (OUT) will be at the same logic level as the input (IN). In these embodiments, if MASK is low, the output (OUT) will be at a logic lo regardless of the value at the input (IN).

In some embodiments, although not shown, the ENABLE signal may be connected to the enable line 1485 of FIG. 14. Also, although not shown, in some embodiments, the SET and RESET signals may be generated externally by some logical combination of ENABLE, a WRITE_ENABLE signal, and the write signal 1490 of FIG. 14 (illustrated in FIG. 14 as true and complement signals 1490A and 1490B, respectively). For instance, SET may be the logical AND of ENABLE, WRITE_ENABLE, and 1490A, while RESET may be the logical AND of ENABLE, WRITE_ENABLE, and 1490B. As shown in FIG. 15, in some embodiments, the outputs of the read-enable circuits 1560 are connected to the read lines 1495 of FIG. 14 (illustrated in FIG. 15 as true and complement lines 1495A and 1495B, respectively). As mentioned above, the data read out of the storage element is supplied to masking logic in some embodiments.

Figure 16:
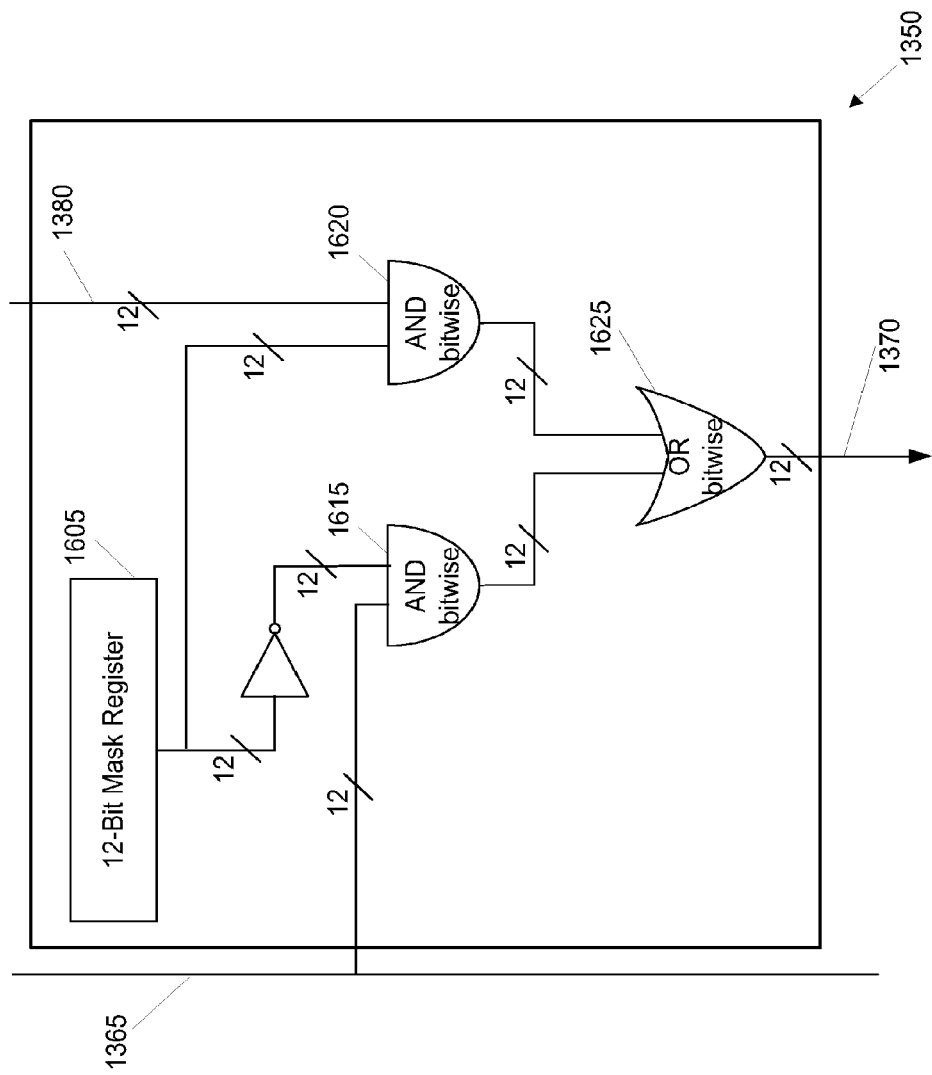
FIGS. 16 and 17 illustrate different embodiments of masking logic.

FIG. 16 conceptually illustrates some embodiments of the masking logic 1350 of the top tile 1300. As shown in this figure, the masking logic 1350 includes a mask register 1605, two bitwise AND gates 1615 and 1620, and a bitwise OR gate 1625. The bitwise AND gates 1615 and 1620 and the bitwise OR gate 1625 are twelve bits wide each in some embodiments.

The masking logic 1350 receives twelve bits of input over a set of bitlines 1380. In some embodiments, these twelve bits are the output of twelve storage elements (e.g., a row 1325 of storage elements, as shown in FIG. 14). The mask register 1605 contains the masking data, which can mask (eliminate) certain data bits received on the bitlines 1380 while letting other data bits through. In some embodiments, the masking data is written into the mask register before the operation of the masking logic (e.g., during configuration of the IC). The output of the mask register 1605 is supplied to a bitwise AND gate 1620. The output of the mask register 1605 is also inverted and then supplied to the bitwise AND gate 1615. The bitwise AND gate 1615 also receives the operand of the received frame (e.g., for tile 1300, the lower twelve bits output from the storage element set 1310 over the lines 1365). The twelve-bit wide outputs of the two bitwise AND gates 1615 and 1620 are supplied to the bitwise OR gate 1625, which performs an OR function on these two outputs and supplies its output over a set of bitlines 1370.

In some embodiments, this set of bitlines 1370 is provided as input to the multiplexer 1355 (shown in FIG. 13) that also receives the twelve bits of the operand of the packet as input (i.e., the lower twelve bits output by the storage element set 1310). The select line of the multiplexer 1355 is tied to the Read output of the first decoder 1405 of the decoder logic 1400. When the first decoder outputs a Read signal, the multiplexer 1355 outputs the output of the memory masking logic 1350 (i.e., the values output on the set of bitlines 1370). Otherwise, the multiplexer 1355 outputs the original twelve bits of the operand of the packet stored by storage element 1310.

When the output of the memory block is not to be masked, the masking register contains all "1s," which results in the AND gate 1620 passing through all the signals output by the multiplexer 1610 and the AND gate 1615 not passing through any of the signals on the bus 1405. On the other hand, when the output of the memory block is to be masked, the mask register 1605 contains a particular pattern of "1s" and "0s" that results in the bitwise AND gates 1615 and 1620 passing through a desired combination of bits from the bus 1365 and the memory block 1360.

Essentially, the two 12-bit wide bitwise AND gates 1615 and 1620 and the 12-bit wide bitwise OR gate 1625 form a 12-bit wide two-to-one multiplexer. This multiplexer receives for its two 12-bit inputs the 12-bit output of the multiplexer 1610 and the 12-bit output of the storage element set 1310. The 12-bit select lines of this multiplexer receives the output of the 12-bit mask register. Each mask bit value then selects between the corresponding bit value from the output of the multiplexer 1610 and the corresponding bit value from the output of the storage element set 1310.

Also, as mentioned above, the configuration/debug network of some embodiments is used in a reconfigurable IC (e.g., a sub-cycle reconfigurable IC). In some such embodiments, the mask register 1605 stores different mask values (e.g., different 12-bit mask values) for different reconfiguration cycles (e.g., different sub-cycles) of the reconfigurable IC. In this manner, different masking operations can be performed in different reconfiguration cycles (e.g., different sub-cycles) to maximize the number of bits that are read from different tiles.

Figure 17:
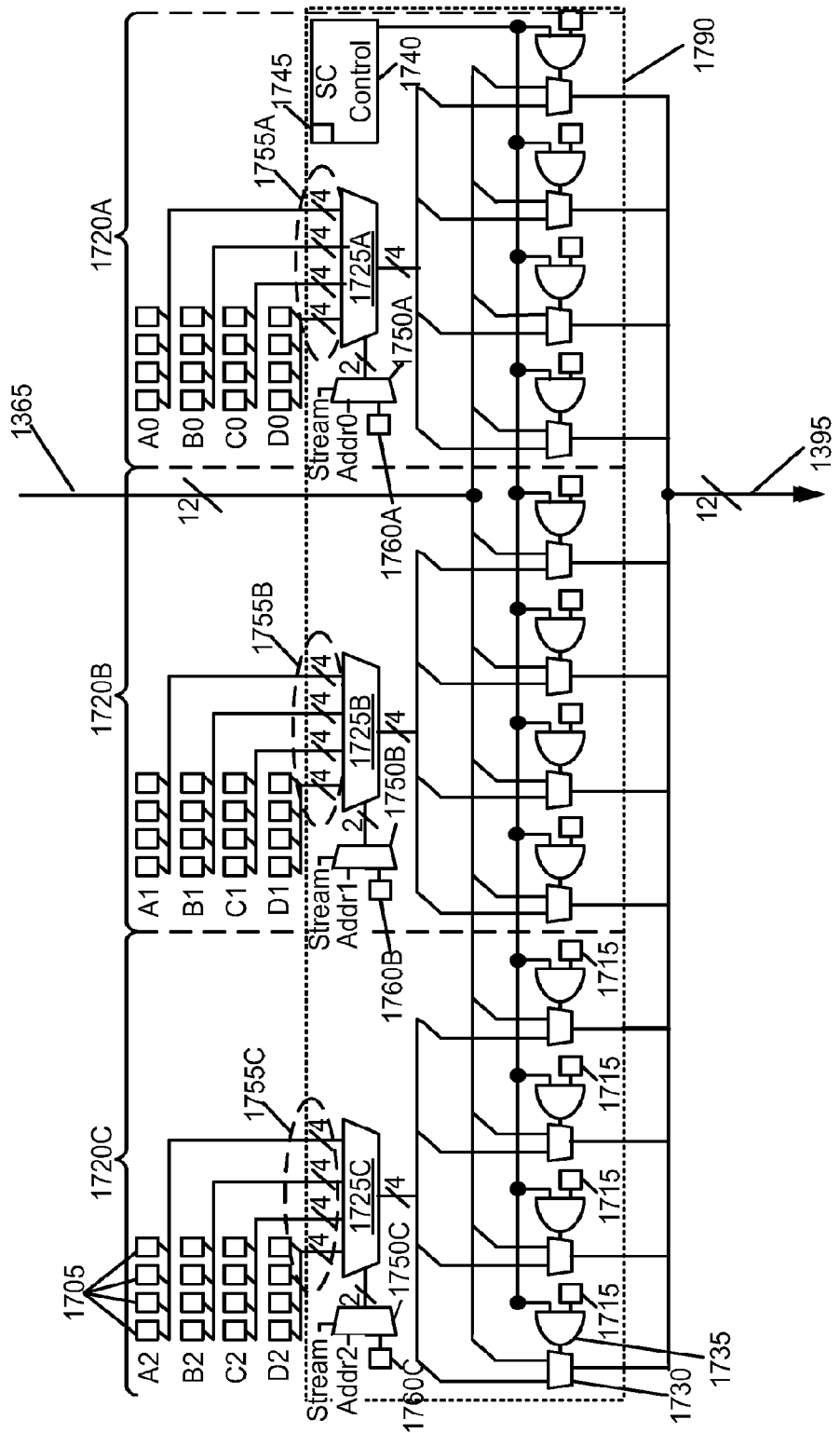

FIG. 17 conceptually illustrates alternate masking circuitry 1790 of some embodiments that replaces the masking circuitry 1390 (i.e., the masking logic 1350 and the multiplexer 1355) of FIG. 13. FIG. 17 illustrates several one-bit storage elements 1705 (e.g., UDS elements, configuration cells, RCLs, etc.) of a tile (e.g., the top tile 1300 described above), and masking circuitry 1790. The storage elements 1705 are grouped in three different conceptual "slices" 1720A, 1720B, and 1720C. In some embodiments, the tile includes a different number of slices (e.g., more or less than three). Each slice 1720 includes four conceptual rows of four storage elements 1705, a row select multiplexer 1725 with input lines 1755, mask multiplexers 1730, AND gates 1735, and multiple configuration data storage elements 1710 and 1715. In some embodiments, each conceptual row of 12 storage elements 1705 (e.g., row A formed by A0, A1, and A2 in slices 1720A, 1720B, and 1720C, respectively) represents a conceptual row 1425 of FIG. 14. The tile further includes a sub-cycle control circuit 1740, which is controlled by configuration data 1745. Together, the sets of input lines 1755A-C form the input lines 1380 shown in FIG. 13 that are provided to the masking circuitry 1790.

The masking operation performed by the masking circuitry 1790 of FIG. 17 is similar to that of the masking operation performed by the masking circuitry 1390 of FIG. 13 with two main differences. First, because each conceptual row of storage elements 1705 is conceptually broken into three slices 1720A-C, more flexibility is provided in the reading of storage elements. In other words, different four-bit portions (or "nibbles") of different rows may be read using the masking logic shown in FIG. 17. For instance, in one slice 1720A, four storage elements 1705 of row A (i.e., four-bit nibble A0) may be read, while in another slice 1720B, four storage elements 1705 of row B may be read (i.e., four-bit nibble B1), while in the other slice 1720C, four storage elements 1705 of row C may be read (i.e., four-nibble C2). Thus, the 12 bits that are read (A0 B1 C2) include data from three different rows. One of ordinary skill in the art would recognize that other examples are possible using the same or similar circuitry (e.g., A0 A1 A2, B0 A1 B2, C0 B1 A2, etc.).

Second, through the configurable sub-cycle control 1740, the masking can be turned on and off on a sub-cycle basis. The sub-cycle control 1740 stores a configuration data set 1745 that enables or disables the masking operation on different sub-cycles, thus providing further flexibility in the IC design (i.e., the use of this sub-cycle control 1740 may eliminate the need for other sub-cycle reconfiguration operations in some embodiments).

As mentioned above, FIG. 17 shows each slice 1720 containing 16 storage elements 1705, arranged in four conceptual rows of four. In some embodiments, any number of storage elements can be arranged in any number of conceptual rows (e.g, four conceptual rows of eight storage elements, eight conceptual rows of eight storage elements, eight conceptual rows of eight storage elements, etc.). Each conceptual row of storage elements provides an input to a sixteen-to-four row select multiplexer 1725, which is controlled by a multiplexer 1750. The multiplexer 1750 is similar to the multiplexer 1430 of FIG. 14 in that the multiplexer 1750 selects between a (1) portion of an address provided by an address decoder (e.g., the second address decoder 1415 of FIG. 14) and (2) configuration data 1760.

d. Reading from and Writing to Block Memory

In some embodiments, the secondary circuit structure accesses (i.e., reads and/or writes) user block memory. In some embodiments, this block memory is a block memory within a tile arrangement, such as block memories 630 and 640 shown in FIG. 6. In some embodiments, sets of storage elements (e.g., UDS elements, transparent latches, etc.) are present at the input and/or the output pins (e.g., address, data, etc.) of a block memory. In some embodiments, some or all of these storage elements are addressable resources of a tile, such as the storage elements 1425 of described above with respect to FIG. 14. For instance, through (1) a frame with a "Read" opcode and (2) a frame with a "Load Address" opcode, the controller 715 can effectively read the values written into and read out of a block memory.

Figure 18:
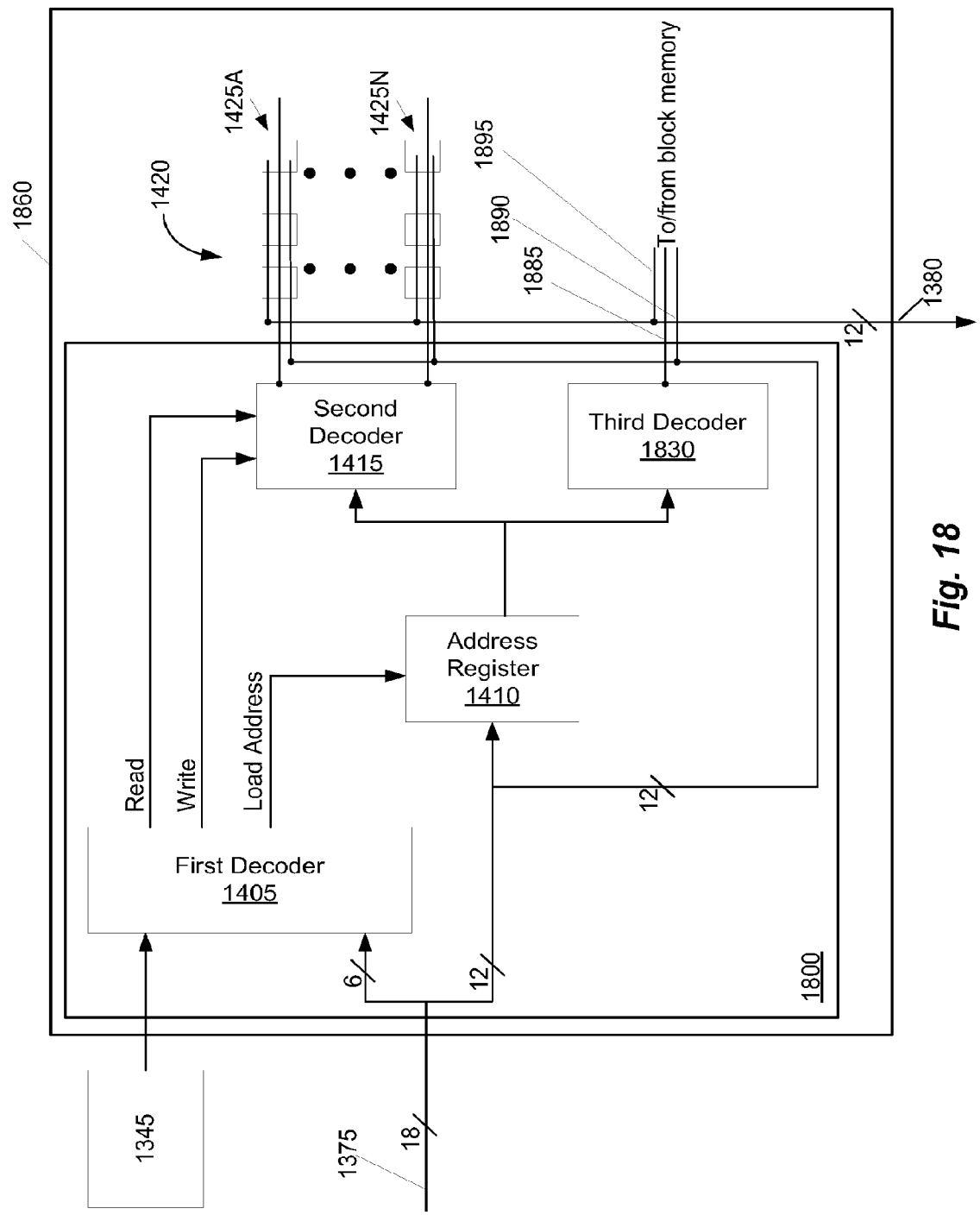
FIG. 18 illustrates a conceptual memory block of some embodiments.

In some embodiments, a tile that includes a block memory is a memory tile, such as memory tile 635 or 640, as shown above in FIG. 6. In some embodiments, the memory tile may have similar structure as other tiles (e.g., a top tile 1300 as discussed above with respect to FIG. 13), which include conceptual memory blocks 1360. FIG. 18 illustrates a conceptual memory block 1860 that is an example of such a conceptual memory block 1360 of some embodiments. The conceptual memory block 1860 is similar to the conceptual memory block 1360 described with respect to FIG. 14. The conceptual memory block 1860 includes decoder logic 1800, conceptual rows 1425A-N of storage elements, and one or more storage cells of a block memory (not shown).

The decoder logic 1800 includes some of the elements of the decoder logic 1400, including a first decoder 1405 (the Stream and Increment Address signals are not shown), a second decoder 1415, and an address register 1410. The decoder logic 1800 also includes a third decoder 1830.

The third decoder 1830 has a functionality that is similar to that of the second decoder 1415. The third decoder 1830 receives an address from the address register 1410 that was identified by a frame. The third decoder 1830 outputs the address along a set of address lines 1885 to the block memory (not shown). The block memory receives a set of bitlines 1890 on which write data is supplied to the block memory when the memory is to be written. The block memory outputs data along bitlines 1895 when data is to be read from the memory.

While not shown in this figure, the decoder logic 1800 of some embodiments further includes multiplexers similar to those shown in FIG. 14 (i.e., multiplexers 1435 and 1430) that select a logical row of memory to output from the decoder logic 1800 on the output lines 1380. In some embodiments, as discussed above, several of the rows 1425 and/or the block memory share read lines. The output lines of each row 1425 and/or memory has an associated set of tri-state drivers that are enabled when reading from the row 1425 or the memory.

Figure 19:
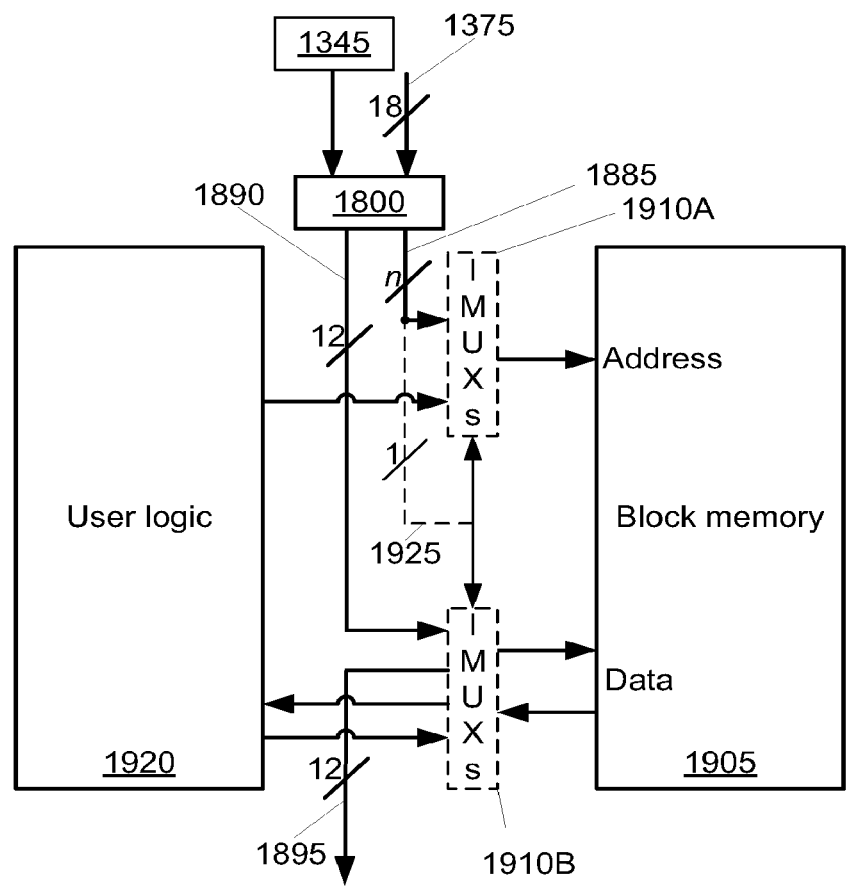
FIG. 19 illustrates reading and writing to a block memory in accordance with some embodiments.

FIG. 19 conceptually illustrates the methodology of some embodiments of reading and writing to a block memory in greater detail. FIG. 19 shows bitlines 1375 and 1895 of the secondary circuit structure. This figure also shows the block memory 1905, two sets of configurable IMUXs 1910A and 1910B, a user logic block 1920, and decoder logic 1800. In some embodiments, the decoder logic 1800 of this figure is the decoder logic 1800 described above with respect to FIG. 18. In some embodiments, the user logic block 1920 includes configurable circuits described above (e.g., configurable logic circuits, such as configurable LUTs and their associated configurable IMUXs, etc.).

The decoder logic 1800 outputs (1) an address of block memory 1905 to be read or written to the set of IMUXs 1910A over the bitlines 1885, as well as (2) the 12-bit operand of a received 18-bit frame. In some embodiments, the bitlines 1885 also carry a switch signal (described below) from the decoder logic 1800. This switch signal is supplied, over a bitline 1925, to the select terminals of the sets of IMUXs 1910A and 1910B. The operand is supplied to the set of IMUXs 1910B. In some embodiments, the 12-bit operand is also supplied over the set of bitlines 1380 to masking circuitry (e.g., masking logic 1350 of FIG. 13) that selects between (1) either the value read out of the block memory 1905, the (2) 12-bit operand itself, or (3) some combination thereof.

In order for the secondary circuit structure to have access to the block memory 1905, the sets of IMUXs 1910A and 1910B must allow the secondary circuit structure to do so. In some embodiments, the switch signal may be asserted at the select lines of the sets of IMUXs 1910A and 1910B that select the secondary circuit structure as having access to the block memory 1905, as opposed to the user logic 1920 having access to the block memory 1905. In some embodiments, this switch signal is supplied by the decoder logic 1800. In some embodiments, the switch signal is a bit (e.g., the most significant bit) of the address stored by the address register 1410 of the decoder logic 1800.

In some embodiments, the switch signal is the output of a memory element (e.g., a UDS element, not shown) that can be addressed and written by the controller of the secondary circuit structure, as described above. In some embodiments, this memory element is a memory element of the secondary circuit structure. In some embodiments, this memory element is not a memory element of the primary circuit structure (i.e., the primary circuit structure is not able to access this memory element). In some embodiments, the switch signal is hardwired to a controller of the secondary circuit structure (e.g., controller 715 of FIG. 7).

In some embodiments, the switch signal is a user signal. In other words, the switch signal is a signal that is generated within the IC. In some embodiments, the switch signal is the output of a configurable circuit of the IC. In some embodiments, the switch signal is asserted by some other mechanism that is neither through the primary circuit structure nor the secondary circuit structure. In some embodiments, the switch signal is a global enable signal that signifies the start of operation of the IC.

In some embodiments, the secondary circuit structure accesses the block memory 1905 while the primary circuit structure does not require access to the block memory. In some embodiments, the secondary circuit structure accesses the block memory while the IC is stopped (e.g., during active mode, as further described below).

In some embodiments, this methodology of reading block memories may be used in conjunction with the circuitry described above with respect to FIGS. 13-17 in order to read and/or write both (1) a block memory and (2) a set of other types of storage elements (e.g., UDS elements, RCLs, configuration data storage elements, etc.) within the same tile. In other words, one skilled in the art would recognize that these two methodologies of reading and writing different types of memories of a tile are not mutually exclusive. Moreover, one tile (e.g., a memory tile 635 or 645, as shown in FIG. 6) of an IC may include the circuitry described with respect to FIG. 19, while another tile of the same IC does not include the same circuitry.

Even though the top tile 1300 structure was described above by reference to several conceptual examples illustrated in FIGS. 13-17, one of ordinary skill will realize that other embodiments might use different circuits in the top tile 1300. For instance, instead of using the bitwise AND gates 1615 and 1620 and the bitwise OR gate 1625, some embodiments use an alternative circuit structure to form a two-to-one multiplexer.

Figure 20:
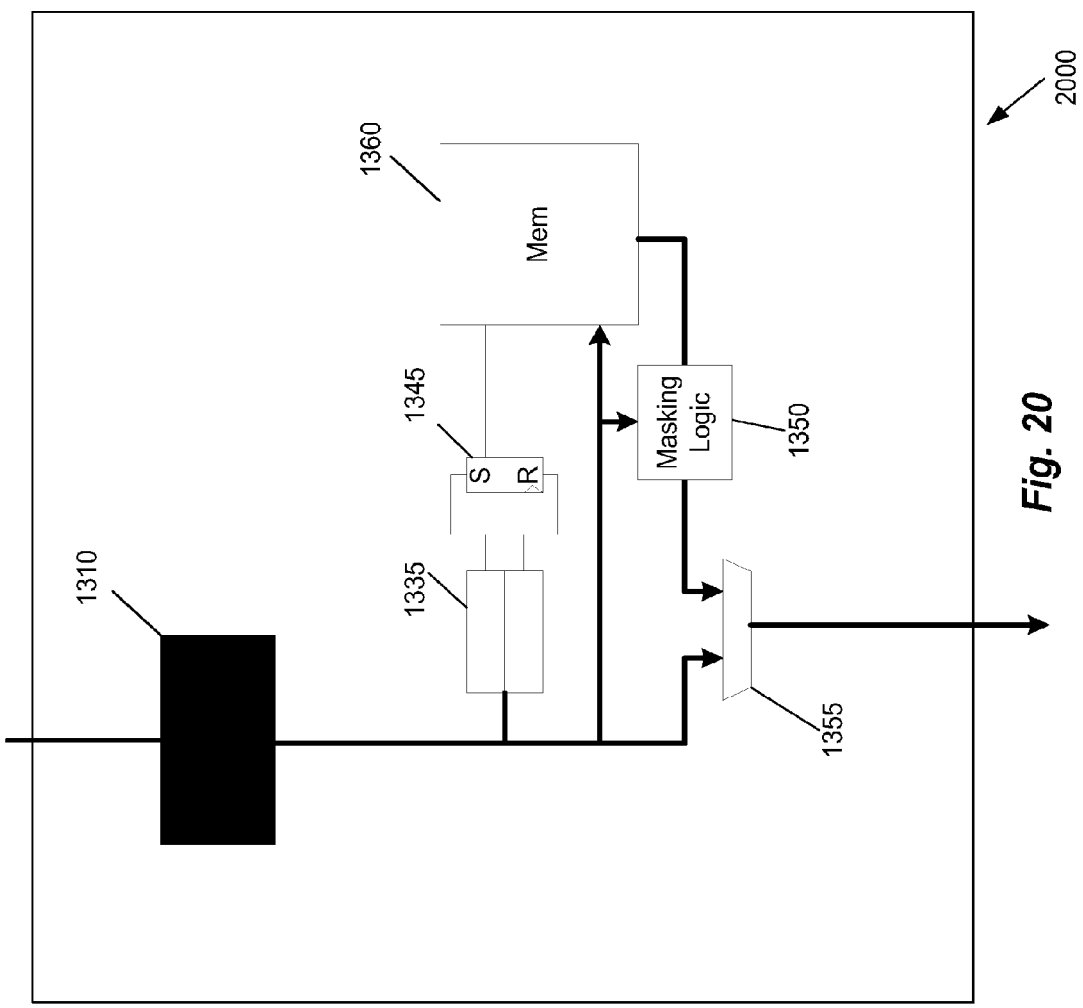
FIG. 20 illustrates a center tile of some embodiments.

The above discussion of FIGS. 13-17 describe secondary circuit structure within tiles as it relates to a top tile. However, in some embodiments, the secondary circuit structure of other types of tiles is similar to that of the top tile. For instance, FIG. 20 illustrates the network structure of a center tile 2000. As shown in this figure, the network structure of the center tile is identical to the top tile 1300, except that it does not include the storage 1305, the tile X/tile Y decoder 1315, the OR gate 1320, the AND gate 1325, the column selector 1330, or the set/reset register 1340. The center tile basically includes all of the circuitry necessary for determining whether a packet is intended for it, and if so, to perform the appropriate read, write, and mask operations. In some embodiments, the network structure for a bottom tile is identical to that of a center tile, with its output being passed to the transport layers 750 described above.

The network structure for an edge tile is similar to the network structure for a center tile. The one difference between edge and center tiles is that, in some embodiments, the edge tiles have more storage elements (e.g., configuration or register cells) to deal with the configurable I/O functionalities of the tile arrangement 700.

V. Secondary Circuit Structure Circuitry

A. Overview

In some embodiments, the secondary circuit structure includes programmable logic (i.e., configurable logic circuits, configurable interconnect circuits, etc.). As such, the functionality provided by the secondary circuit structure is configurable. In some embodiments, the functionality provided by the secondary circuit structure is reconfigurable in the sense that during operation of the primary circuit structure, the secondary circuit structure can switch between different configurations with each configuration performing different functionality. In this manner, the secondary circuit structure of some embodiments is customizable to provide debug functionality that is tailored to specifications of the user designs.

In some embodiments, the configurable resources of the secondary circuit structure are configurable to implement various "logic analyzer" circuitry such as comparators, state machines, trigger circuits, etc. In addition, the secondary circuit structure includes processing units, trace buffers, and memory to further compliment the functional set of operations customizable and executable within the secondary circuit structure.

In this manner, the secondary circuit structure can be used to implement an "on-chip" logic analyzer in conjunction with the streaming mode operation of the secondary circuit structure of the IC. Accordingly, some embodiments of the IC provide internal means (i.e., the secondary circuit structure) by which to diagnose and debug user designs implemented in a primary circuit structure of the IC that is in development or that has already been deployed in the field. For example, the secondary circuit structure of some embodiments is able to store and make available for readback input signals from the primary circuit structure, data resulting from processing the received input signals, or data received from external sources over I/O buffers or other external interfaces connected to the secondary circuit structure.

B. Trace Buffer

In some embodiments, the on-chip "logic-analyzer" functionality includes one or more trace buffers that function as the capture components of the on-chip logic-analyzer. In some embodiments, the trace buffer is on the same configurable IC die or wafer as the array of the primary circuit structure. In other embodiments, the trace buffer is on a separate die or wafer than the primary circuit structure, both of which are enclosed within a single chip package.

With reference to FIG. 7, the trace buffer 760 receives the sets of connections 752, 754, and 756 of the transport network layers 750A-C of the transport network 792. The connections 752, 754, and 756 in some embodiments are (together) 36 bits wide, which allows the trace buffer to receive 36 bits of streamed-out data (e.g., UDS data) from the tile arrangement 710 on each clock cycle. In the embodiments where the tile arrangement is part of a sub-cycle reconfigurable IC, the trace buffer can receive 36 bits on each sub-cycle of the user design cycle.

Figures 21, 22:
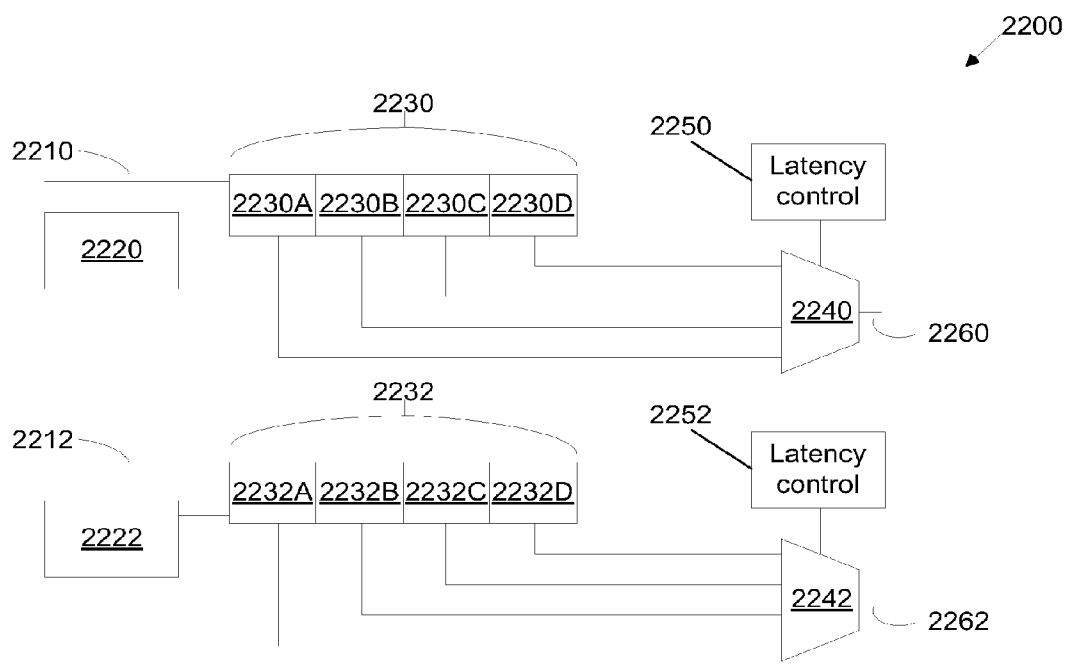
FIG. 21 illustrates a conceptual diagram of a trace buffer of some embodiments.
FIG. 22 illustrates an example of deskew circuitry of some embodiments.

FIG. 21 illustrates a conceptual diagram of a trace buffer 2100 of some embodiments. In some embodiments, the trace buffer 2100 is an example of the abovementioned trace buffer 760. The trace buffer 2100 is a memory with a conceptual "length" and "width," which are both measured in bits. The longer the trace buffer is (in bits) the more IC area the trace buffer occupies. In some embodiments, as shown in FIG. 21, the trace buffer 2100 is 128 bits long. In some embodiments, the trace buffer 2100 can be represented by a grid of slots 36 bits wide by 128 bits long. Data can be written on one "row" of this grid in each sub-cycle. In some embodiments, there are eight sub-cycles per user cycle. In such embodiments, a 128-bit long buffer would store data for 16 user cycles (128/8).

In some embodiments, the trace buffer 2100 is a circular buffer that continuously stores the data that it receives until instructed otherwise. When a circular trace buffer runs out of rows, it starts rewriting the rows, overwriting the oldest rows first. This goes on until the trigger signals a stop, at which point the trace buffer stops overwriting. The trace buffer 2100 then waits to offload the data from the IC to software that interfaces with the IC. In some embodiments, the trace buffer 2100 has extra width to accommodate bits to keep track of the sub-cycle in which the data arrived and/or to keep track of which row is being written. In other embodiments, tracking data is maintained separately from the circular memory of the trace buffer 2100, either within other circuitry that is part of the trace buffer 2100 or elsewhere.

C. Deskew Circuits

In some embodiments, the bit lines passing into the secondary circuit structure arrive with different timings. Accordingly, some embodiments provide deskew circuits 770 to align the data, providing it to the trigger circuit 780 or trace buffer 760 in the order it was generated so that simultaneously generated signals reach the trigger circuits at the same time.

The deskew circuitry of some embodiments is shown in FIG. 22. The deskew circuitry 2200, includes data entry lines 2210 and 2212, load controls 2220 and 2222, one-bit wide shift registers 2230 and 2232, four-to-one MUXs 2240 and 2242 with inputs from the individual bit-registers 2230A-2230D and 2232A-2232D, latency controls 2250 and 2252, and outputs 2260 and 2262 from the deskew circuitry to the trigger circuitry. It should be apparent to one of ordinary skill in the art that FIG. 22 illustrates deskew circuitry for two bits but that some embodiments contain deskew circuits for deskewing any arbitrary number of bits.

The following descriptions of the operation of shift register 2230 also apply to shift register 2232. In FIG. 22, shift register 2230 operates by successively loading one bit at a time into bit-register 2230A. As each new bit is loaded, the previously loaded bits are shifted to the right. Over the duration of a user cycle, the data bits are shifted from 2230A through 2230D. Shifting previous bits over as each bit arrives at the shift register 2230 is similar to the operation of a typical shift register, but the time or circumstance in which new bits arrive is configurable in some embodiments. In some embodiments, a bit is loaded into bit-register 2230A when load control 2220 prompts the register to receive it (e.g., through a write enable line, not shown). Load control 2220 prompts the shift register 2230 to receive a bit on one particular sub-cycle per user cycle. Therefore, in such embodiments, the shift registers 2230 and 2232 shift (i.e., iteratively pass a particular bit from the first shift register 2230A or 2232A to the last bit-register 2230D or 2232D) once per user cycle. The received bit is read into bit-register 2230A, the bit that had been in bit-register 2230A shifts to bit-register 2230B, and so on, until the bit in the fourth bit-register 2230D is simply overwritten, not shifting anywhere.

The latency control 2250 determines which input of MUX 2240 is active. Thus, the latency control 2250 determines how many user cycles to delay. As described above, the load control 2220 of some embodiments activates the shift register 2230 once per user cycle. Because the shift register 2230 shifts once per user cycle, a data bit reaches each input of the multiplexer 2240 one full user cycle after the previous input.

The shift register 2230 and the multiplexer 2240 determine how many full user cycles to delay a data bit, and the load control 2220 determines which of the multiple possible sub-cycles within each user cycle will provide the data bits that go into the shift register 2230. Therefore, by selecting appropriate values for the load controls 2220 and 2222 and the latency controls 2250 and 2252, the deskew circuits can cause delays of an arbitrary number of sub-cycles within a certain range. In some embodiments, this range is between one and n. In some embodiments, n is the number of shift registers 2230 in the deskew circuit 2210. Additional description for deskew circuits is provided for within U.S. patent application Ser. No. 11/769,680, filed Jun. 27, 2007. As would be apparent to one skilled in the art, in order to perform an n-sub-cycle deskew operation using the circuitry described above with respect to FIG. 22, the deskew circuit 2200 of some embodiments would require at least n shift registers 2230 and an n-to-one multiplexer 2240.

Figure 23:
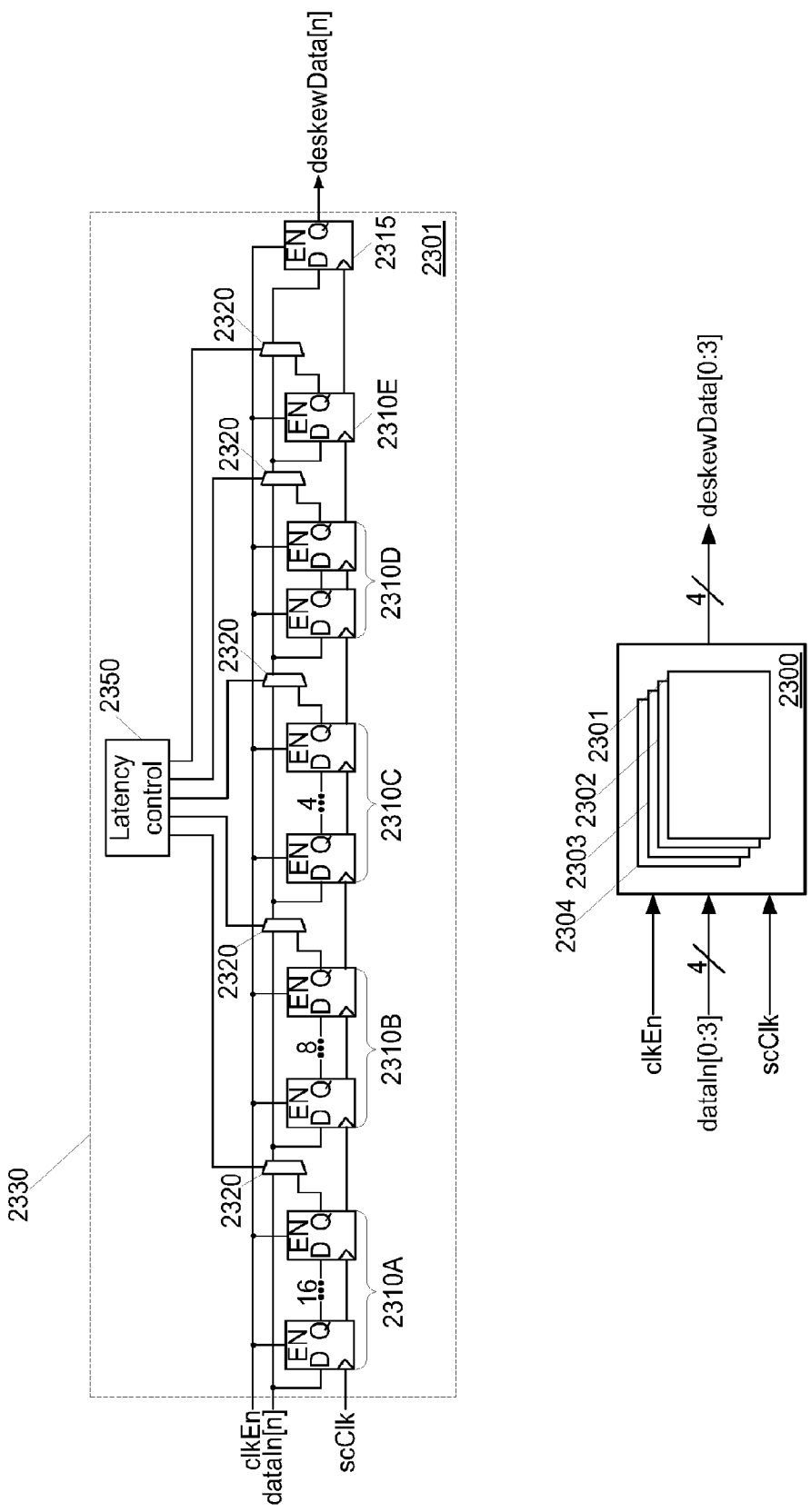
FIG. 23 illustrates another deskew circuit of some embodiments that does not require an n-to-one multiplexer to perform an n-bit deskew operation.

FIG. 23 illustrates another deskew circuit 2300 of some embodiments that does not have the requirement of such an n-to-one multiplexer in order to perform an n-bit deskew operation. The deskew circuit 2300 in FIG. 23 is a four-bit deskew circuit that receives four bits of data and outputs four bits of deskewed data. The four-bit deskew circuit 2300 includes four one-bit deskew circuits 2301-2304. The exploded view 2330 illustrates one of the one-bit deskew circuits 2301 in more detail.

The one-bit deskew circuit 2301 includes sets of flip-flops 2310A-E, an output flip-flop 2315, multiplexers 2320, and a latency control circuit 2350. The one-bit deskew circuit 2301 receives three signals: clkEn, dataIn, and scClk. The one-bit deskew circuit 2301 outputs a deskewData signal.

Each of the sets of flip-flops 2310A-2310E includes different numbers of flip-flops. The first flip-flop set 2310A includes 16 flip-flops, the second flip-flop set 2310B includes eight flip-flops, the third flip-flop set 2310C includes four flip-flops, the fourth flip-flop set 2310D includes two flip-flops, and the fifth flip-flop set 2310E includes a single flip-flop. Each flip-flop stores a data value for one sub-cycle and then shifts the data value to the flip-flop at its output).

The dataIn signal received by the one-bit deskew circuit 2301 is received on a sub-cycle basis, and is delayed (i.e., held by the flip-flops 2310A-E and 2315) for a number of sub-cycles. The number of sub-cycles to hold the data is determined by the latency control circuit 2350. In some embodiments, the latency control circuit 2350 includes configurable logic that controls the multiplexers 2320. These multiplexers 2320 receive 1) the output of a flip-flop set 2310A-E and 2) the dataIn signal itself. When a multiplexer 2320 selects the input it receives from a preceding flip-flop set 2310A-E, the multiplexer outputs a signal that was held for a number of sub-cycles that that is equal to the number of flip-flops in the flip-flop set 2310A-E. When a multiplexer 2320 selects the dataIn signal itself as its output, this means that the multiplexer does not output a signal that was held for the number of sub-cycles equal to the number of flip-flops in the preceding flip-flop set 2310A-E. However, the data may have been previously delayed by a different preceding flip-flop set that supplied its output to a different multiplexer 2320.

As mentioned above, the latency control circuit 2350, which controls each of the multiplexers' 2320 select lines, includes configurable logic in some embodiments. This configurable logic includes a configurable logic circuit (e.g., a configurable LUT) in some embodiments. Because of this configurable logic, one skilled in the art would recognize that the data signal can be delayed by any number of sub-cycles between one and 32. For instance, in order to delay a signal by a single sub-cycle, the latency control circuit 2350 would cause each of the multiplexers 2320 to output the dataIn signal itself. Thus, the dataIn signal would be delayed a single sub-cycle by the output flip-flop 2315. As another example, in order to delay a signal by 11 sub-cycles, the latency control circuit 2350 would cause the multiplexers 2320 at the outputs of the eight-flip-flop set 2310B and the two-flip-flop set 2310D to output the delayed value, while the latency control circuit 2350 would cause the other multiplexers 2320 to output the dataIn signal. Thus, the deskewData signal would be delayed by 11 sub-cycles (i.e., 8+2+1, including the output flip-flop 2315).

While the one-bit deskew circuit 2301 has been described above as having a specific number of sets of flip-flops, each with a specific number of flip-flops, one skilled in the art would recognize that different combinations are possible in order to achieve different deskew results (e.g., longer or shorter maximum delays). Additionally, the one-bit deskew circuit 2301 only performs its deskew operation and provides an output when the clkEn signal is true. In some embodiments, the clkEn signal is disabled when the deskew circuit is not required to provide an output or perform any operation. For instance, such a scenario may occur during active mode, which is further described below. However, in some embodiments, the one-bit deskew circuit 2301 does not receive a clkEn signal, and therefore always performs its deskew operations based on the latency control circuit 2350 and always outputs its deskewData output signal.

In some embodiments, each of the one-bit deskew circuits 2301-2304 is the same as the one-bit deskew circuit 2301 illustrated in exploded view 2330. In some embodiments, a single latency control circuit 2350 controls more than one one-bit deskew circuit. While some embodiments of the multi-bit deskew circuit 2300 include four one-bit deskew circuits, other embodiments include a different number of one-bit deskew circuits (e.g., two, eight, etc.).

D. Trigger

The trigger component of the on-chip logic-analyzer is performed by a trigger circuit 780 that communicates with the trace buffer 760. This trigger circuit 780 analyzes control data and user data (e.g., UDS data) passed over the bitlines from the primary circuit structure and determines what data is to be stored in the trace buffer for subsequent analysis. In some embodiments, the one or more determinations performed by the trigger circuit 780 are configurable based on user specification. Accordingly, some embodiments permit users to configure the trigger circuit 780 with one or more such conditions.

A trigger signal of the trigger circuit 780 "fires" when the trigger circuit 780 identifies a data value, a particular set of values, or sequence of values coming in on connections that satisfy one or more of the user specified conditions set for the incoming values. Firing of the trigger signal causes the trace buffer to store and record data that is being streamed out from the tile arrangement for some specified duration. The duration for recording data within the trace buffer may include data from before the firing of the trigger or data from after the firing of the trigger. These user-specified conditions may be used to specify a single triggering event or multiple triggering events.

a. Overview

Figure 24:
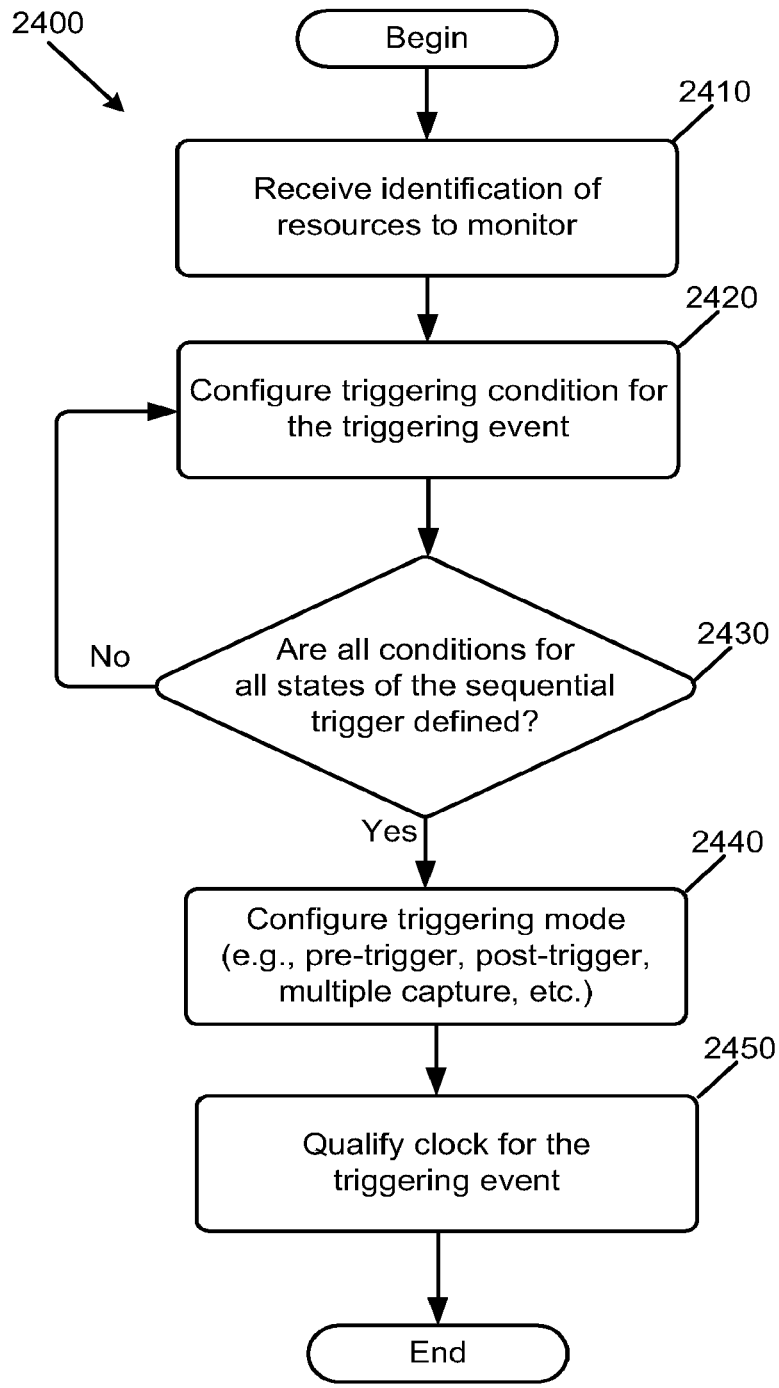
FIG. 24 presents a process for configuring a triggering event in accordance with some embodiments of the invention.

FIG. 24 presents a process 2400 for configuring a triggering event in accordance with some embodiments of the invention. The process 2400 begins by first identifying (at 2410) one or more resources of the user design implemented within the primary circuit structure to monitor. The process then receives (at 2420) one or more triggering conditions for a triggering event.

In some embodiments, complex triggers may be specified as a multi-state state machine with each state containing one or more user specified conditions. In some such embodiments, these sequential triggering events fire when all such states are satisfied. Therefore, after the process configures a first condition, the process determines (at 2430) whether all conditions for all states of the triggering event have been configured. When additional conditions remain to be configured, the process proceeds back to step 2420. Otherwise, the process determines that a combinational trigger (i.e., a single state triggering event) is specified or that the sequential triggering event is fully configured with all user specified states. In some embodiments, users specify the conditions for a triggering event using an interactive software tool that interfaces with the IC (e.g., through JTAG or some other interface). The software tool allows users to specify the conditions for the triggering event based on representation of the user design. Moreover, the software tool translates and transmits the messages to the IC for processing and/or configuration. Some embodiments of the software tool are described below in Section VI.

Next, the process configures (at 2440) a triggering mode to associate with the triggering event. In some embodiments, the triggering mode describes the manner in which data is to be recorded into the trace buffer for an event that causes the trigger to fire. In some embodiments, the triggering modes include: (1) a pre-trigger mode that defines an interval before the triggering event fires in which to collect data that is to be captured along with the triggering event, (2) a post-trigger mode that defines an interval after the triggering event fires in which to collect data, and (3) a multiple capture mode that captures multiple windows of data. Optionally, the process configures (at 2450) clock qualification that may be defined in conjunction with or independently of the triggering modes. In some embodiments, clock qualification further controls and customizes the data that is to be captured during runtime operation of the IC based on user clock cycles, sub-cycles, or user specified intervals. At this stage, the configuration for a triggering event is complete.

b. Triggering Events

In some embodiments, the triggering conditions for a triggering event include: (1) arithmetic comparisons between first and second data values in the primary circuit structure where the first and second data values may be of variable bit lengths, (2) arithmetic comparisons between data values in the primary circuit structure and a user specified constant, (3) state transitions for data values, or (4) counting of conditions. In some embodiments, the triggering condition may include different combinations of the above enumerated conditions. In this manner, users may configure multiple synchronous or nested conditions to describe when a triggering event should "fire."

In some embodiments, the trigger circuit detects state transitions such as rising or falling edges of user signals. Some embodiments configure triggers that "fire" upon detection of a signal transitioning from a first state to a second state irrespective of the current or final state of the signal. In some embodiments, three such triggering events may be configured: 1) a transition from "1" to "0" or a high state to a low state (i.e., falling edge), 2) a transition from "0" to "1" or a low state to a high state (i.e., rising edge), and 3) other signal transitions.

As noted above, a triggering event may be specified as a single state triggering event or as a multiple state triggering event. In some embodiments, a single state triggering event is a combinational trigger that becomes true when the inputs to the trigger circuit satisfy the user specified triggering event condition.

1. Sequential Trigger Events

Additionally, in some embodiments, a triggering event may be specified with multiple conditions that should be satisfied at a single instance or clock cycle of the runtime operation of the IC. For example, such a triggering event fires when data at a particular memory address of a first memory block has a first particular value and when data at a different memory address of a second memory block has a second particular value. In some such embodiments, each such condition specifies a state of a multi-state state machine where all states occur synchronously. Such a triggering event is referred to as a sequential trigger in some embodiments. In other embodiments, the sequential trigger is defined such that the different sets of values arrive at different times during the runtime operation of the IC. For example, the sequential trigger is a user-defined state machine that receives a first set of inputs at a first clock cycle that advance the state machine to a next state, reset the state machine, or hold the state machine at its current state. Then a second set of inputs arriving at a second clock cycle are used to advance, reset, hold, or complete the state machine.

In both the synchronous and multi-cycle instances, the trigger signal is only fired when all states of the sequential trigger have been satisfied. Other sequential triggers of some embodiments operate according to an "if this then that else other" sequence of operations that implement branching. In some embodiments, the trigger circuit of some embodiments supports state machines with a number of states, including an idle state, where each such state may be dependent on data values of different resources of the primary circuit structure.

In some embodiments, combinational triggers can be functions of up to six inputs, while sequential triggers can be functions of up to four inputs. As shown in further detail below, each input to the trigger can be: 1) a comparator output, 2) the output of an event counter, or 3) a one-bit user signal.

Figure 25:
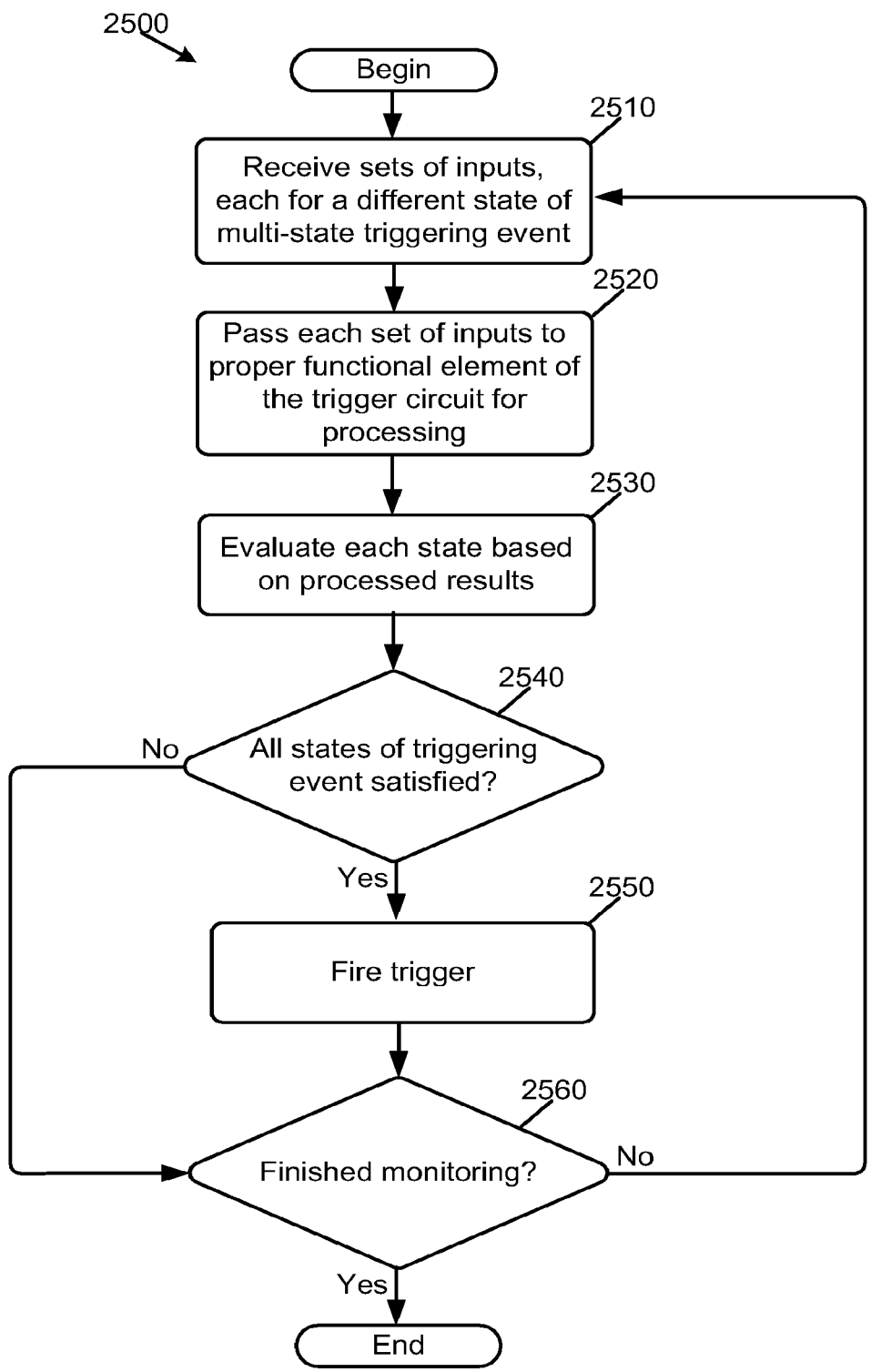
FIG. 25 illustrates a process performed in accordance with some embodiments of the trigger circuit for a user-defined synchronous sequential trigger event.

FIG. 25 presents a process 2500 performed in accordance with some embodiments of the trigger circuit for a user-defined synchronous sequential triggering event. The process 2500 begins by receiving (at 2510) sets of inputs. The sets of inputs include a set of inputs for each state or condition of the multi-state synchronous sequential triggering event. For example, the trigger circuit of some embodiments is configurable to perform up to 64-bit operations, therefore by partitioning and configuring the logic of the trigger circuit, multiple smaller sets of operations may be performed synchronously. Specifically, a first set of resources of the trigger circuit may be configured to perform a four-bit operation, a second set of resources may be configured to perform a 12-bit operation, and a third set of resources may be configured to perform a one-bit operation synchronously in order to specify a synchronous sequential triggering event.

The process passes (at 2520) each set of inputs for each state of the triggering event to the proper functional element of the trigger circuit. The process evaluates (at 2530) each state of the triggering event using the corresponding set of inputs synchronously. The process determines (at 2540) whether all states of the triggering event have been satisfied. When the process determines (at 2540) that all states of the triggering event have not been satisfied, the process proceeds to 2560, which is described below. On the other hand, when the process determines (at 2540) that all states of the triggering event have been satisfied, the process fires (at 2550) the triggering signal. The process then determines (at 2560) whether to continue monitoring by resetting the states. When the process determines (at 2560) to continue monitoring, the process transitions back to step 2510, which was described above. When the process determines (at 2560) not to continue monitoring, the process ends.

2. Variable-Width Trigger Conditions

In some embodiments, the trigger circuit is also configurable so as to specify different trigger conditions for variable bit data that is streamed off the chip into the logic analyzer. Accordingly, the trigger circuit can be configured to adapt to the user design that is implemented in the primary circuit structure of the IC. For example, a first user design implemented with 16 bit memories and logic circuits (i.e., LUTs)

may be monitored and debugged using the trigger circuit by configuring the trigger circuit with 16-bit triggering events. Similarly, a second user design implemented with 64-bit memories and logic circuits (i.e., LUTs) may be monitored and debugged using the trigger circuit by configuring the trigger circuit with 64-bit triggering events. Additionally, it should be apparent to one of ordinary skill in the art that the trigger circuit of some embodiments is further configurable with multiple variable sized triggers that operate simultaneously. In some such embodiments, the trigger circuit is able to monitor and debug 8-bit, 16-bit, and 24-bit data simultaneously as described below in further detail below.

In some embodiments, the trigger circuit is reconfigurable. The configuration of the reconfigurable trigger circuit changes throughout the operation of the IC such that at different intervals or instances in the operation of the IC, different triggering events are specified and monitored for by the trigger circuit. To define the various triggers, some embodiments provide users with a graphical user interface by which triggering events may be specified for the user design based on a graphical representation of the user design.

c. Trigger Modes

In addition to configuring the triggering events for the trigger circuit, some embodiments also configure the mode in which the trigger circuit controls how values are to be stored in the trace buffer. In some embodiments, the trigger circuit and trace buffer includes three configurable modes: 1) pre-trigger mode, 2) post-trigger mode, and 3) multiple capture mode.

1. Pre-Trigger Mode

In pre-trigger mode, the user specifies the start of capture as a number of user-cycles before the triggering event. In this manner, if a triggering event is met, a set of data signals that arrived prior to the particular data signal satisfying the triggering event will be stored in the trace buffer in addition to or instead of the particular data signal satisfying the triggering event. As part of specifying which triggering mode to use in conjunction with the triggering event, some embodiments allow the user to configurably specify a desired size for the pre-trigger capture window. The capture window ranges from the full capacity of the trace buffer to one bit of data. The pre-trigger mode therefore allows a user to monitor conditions and states that occur immediately before a specified triggering event.

Figure 26:
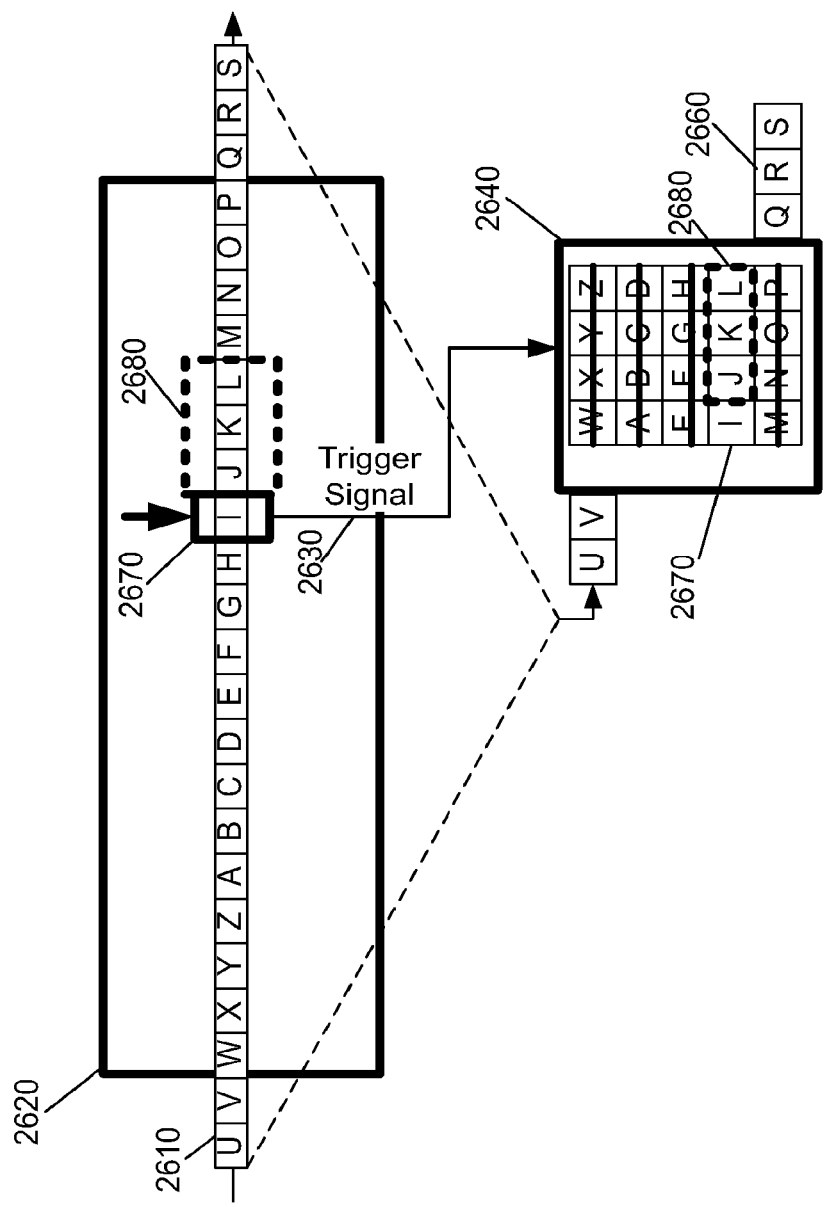
FIGS. 26-28 illustrate different trigger modes in accordance with some embodiments of the invention.

FIG. 26 conceptually illustrates the pre-trigger mode of operation in accordance with some embodiments of the invention. As shown, the pre-trigger mode of operation of some embodiments involves a data stream 2610, a trigger circuit 2620, a trigger signal 2630 of the trigger circuit 2620, and a trace buffer 2640.

The data stream 2610 is continually streamed into the trigger circuit 2620 and trace buffer 2640. In some embodiments, the data stream 2610 includes control and/or user data. Specifically, the data stream may stream data from the configuration controller, transport network, or the deskew circuits of some embodiments.

The trigger circuit 2620 monitors the data stream 2610 in real time. In some embodiments, real time monitoring occurs when the trigger circuit 2620 simultaneously monitors the data values in the data stream as the same data values are received, sent, and/or stored by the circuits in the primary circuit structure being monitored. The trigger circuit 2620 is configured with a triggering event 2670 that fires when a particular value is identified in the data stream 2610.

The trace buffer 2650 is configured to do a pre-trigger capture of data. Therefore, the trace buffer 2650 buffers some number of data values of the data stream that arrived prior to the firing of the triggering signal 2630. To do so, the trace buffer 2640 continually writes the data stream 2610 as it is being monitored by the trigger circuit 2620. The trace buffer 2640 continually writes to its memory until the memory is full or until a triggering event fires. If the memory is full, the trace buffer 2640 begins overwriting older data 2660.

Once the trigger circuit 2620 identifies the triggering event 2670, the trigger circuit 2620 asserts the trigger signal 2630. In response, the trace buffer 2640 captures the data associated with the triggering event and the specified pre-trigger window of data 2680. Other data within the trace buffer 2640 can then be discarded. In some embodiments, the discarding of data occurs via software that streams out data from the trace buffer for debugging.

In some embodiments, the size of the pre-trigger window of data 2680 is user configurable. Therefore, when the triggering event 2670 is detected by the trigger circuit 2620, the trace buffer 2640 receives the firing of the trigger signal 2630 from the trigger circuit 2620 which causes the trace buffer 2650 to store the data value of the triggering event 2670 and also the specified values within the pre-trigger window 2630. These values can then be subsequently viewed or processed.

2. Post-Trigger Mode

In post-trigger mode, the user specifies the start of capture as a number of user-cycles after the triggering event. In this manner, the user is able to specify and control what data is stored after the trigger fires. As for the pre-trigger mode, the post-trigger mode allows users to view what occurs within the primary circuit structure immediately or some time after a specified condition occurs. To do so, the trace buffer can be set to allow some delay (sometimes called a "programmable delay") between the triggering event and the stopping of the buffer. Such a trigger delay allows data to be collected from beyond the time of the triggering event itself. In this manner, the trace buffer may store a relevant subset of data that it received for a certain time interval after the triggering event that the trigger circuit detected. In some embodiments, the programmable delay can optionally be set to delay for: 1) half the depth of the trace buffer, so that approximately the same amount of data will be buffered before the triggering event as after, 2) the depth of the trace buffer, so that most or all of the collected data will be from after the trigger, or 3) short or no delay, so that most or all of the data in the trace buffer is from before the triggering event.

Figure 27:
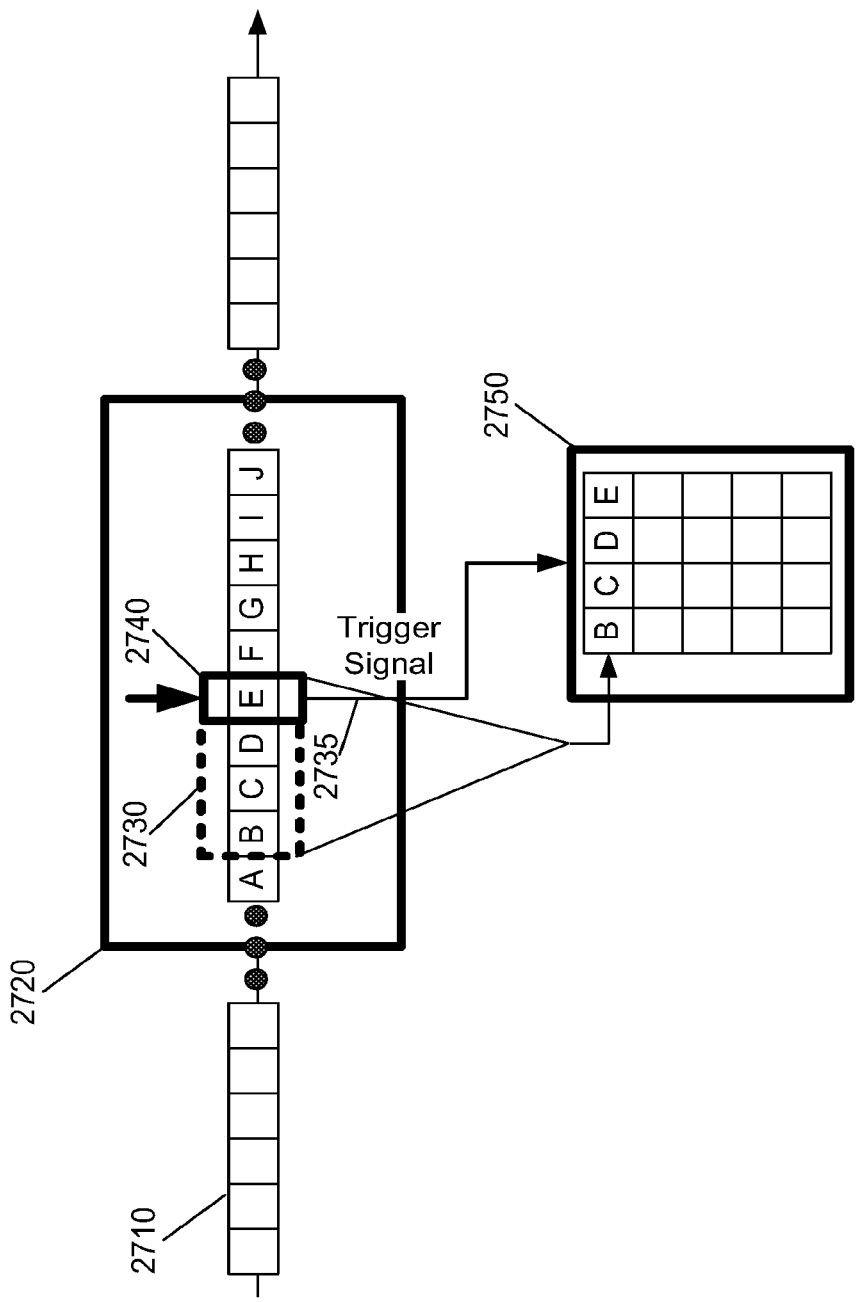

FIG. 27 conceptually illustrates a post-trigger mode of operation for a triggering event in accordance with some embodiments of the invention. As shown, the post-trigger mode of operation of some embodiments involves a data stream 2710, a trigger circuit 2720, a trigger signal 2735 of the trigger circuit 2720, and a trace buffer 2750.

As in FIG. 26 above, the data stream 2710 is continually streamed into the trigger circuit 2720 and trace buffer 2750 of some embodiments. The trigger circuit 2720 monitors the data stream in real time as it passes into trigger circuit 2720. Therefore, when a trigger occurs as a result of the particular data value 2740 being monitored, the trigger circuit fires the trigger signal 2735 that causes the trace buffer 2750 to begin writing. The writes will capture the triggering event and subsequently arriving data over a post-trigger defined window 2730.

3. Multiple Capture Mode

In some embodiments, multiple capture mode allows a user to capture multiple windows of data. In this mode, the trigger can fire multiple times. Each time the trigger fires, the trace buffer stores n (a number specified by the user) samples of data, and then waits for another trigger to fire. This process continues automatically until the trace buffer is filled. In other words, multiple capture mode operates without user or software intervention. In some embodiments, multiple capture mode works in conjunction with the post-trigger mode.

Figure 28:
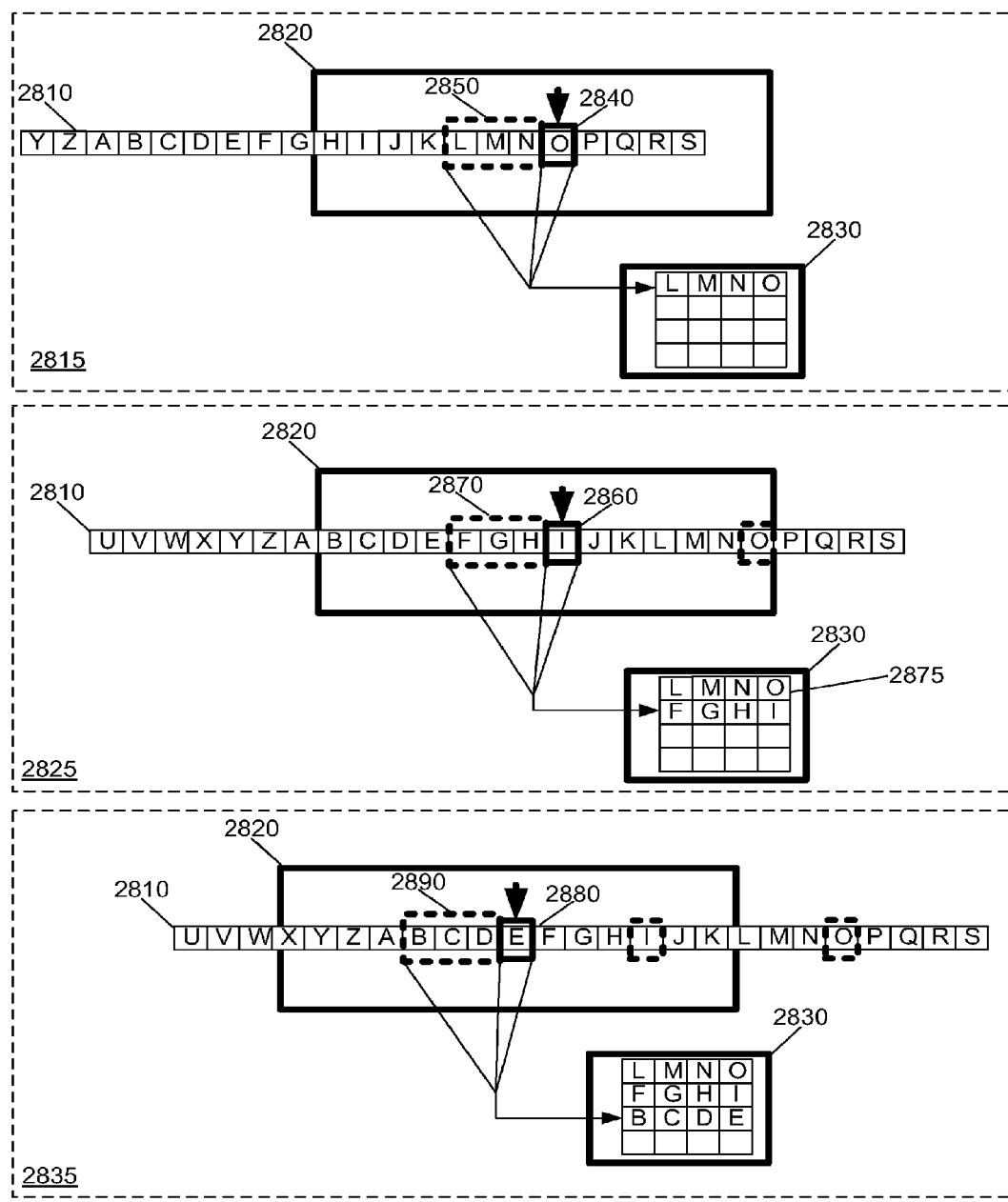

FIG. 28 conceptually illustrates the multiple capture mode of operation for a triggering event in accordance with some embodiments of the invention. As shown, the multiple capture mode of operation of some embodiments involves a data stream 2810, a trigger circuit 2820, a trigger signal of the trigger circuit 2820 that fires at multiple instances 2840, 2860, and 2880, and a trace buffer 2830.

In this figure, the data stream 2810 is continually streamed into the trigger circuit 2820 and trace buffer 2830 of some embodiments. The streaming is shown at three separate time slices 2815, 2825, and 2835 when the trigger circuit fires. During each time slice, the trigger circuit 2820 monitors in real-time the data values as they are streamed.

In the first time slice 2815, the particular data value 2840 being monitored has a value that causes the trigger circuit 2820 to fire. In response, a first window of data 2850 arriving after the particular data value 2840 is captured and stored into the trace buffer 2830. Capturing in the trace buffer is then halted after the first window of data 2850 is recorded. The trigger circuit 2820 then resets the triggering event and monitors for the next occurrence in the data stream 2810.

In this figure, the next triggering event occurs during the second time slice 2825 when the data value 2860 is monitored. Again, the trigger signal fires causing the trace buffer 2830 to store the data value 2860 along with the specified window 2870 of data values arriving after the data value 2860. However, the trace buffer 2830 does not overwrite the previously captured data values 2875. Once again, when the specified window 2870 is written to the trace buffer 2830, the trace buffer 2830 halts any further writes and the trigger circuit 2820 resets to monitor for the next triggering event.

Time slice 2835 presents another example of the firing of the trigger when the trigger circuit 2820 and trace buffer 2830 of some embodiments operate in multiple capture mode. Accordingly, these triggering modes (e.g., pre, post, multiple) enhance debugging capabilities such that the data that is collected as part of each trigger is associated with the trigger. Therefore, not only can users view the data that caused a triggering event to occur, but also relevant data that is associated with the triggering event. Unlike traditional debugging tools where a series of arbitrary consecutive data is logged from one or more resources with no particular arrangement, the data resulting from these data modes not only identifies the particular data value or set of data values that caused the trigger, but also pre or post trigger data that a user specified to monitor in association with the firing of the trigger.

d. Clock Qualification

In some embodiments, the trigger circuit performs clock qualification. Clock qualification provides additional control over how data is written to the trace buffer after the trigger fires. In some such embodiments, the user configures the trigger circuit with one or more qualifiers that control how data is written to the trace buffer on a clock-by-clock basis.

Figure 29:
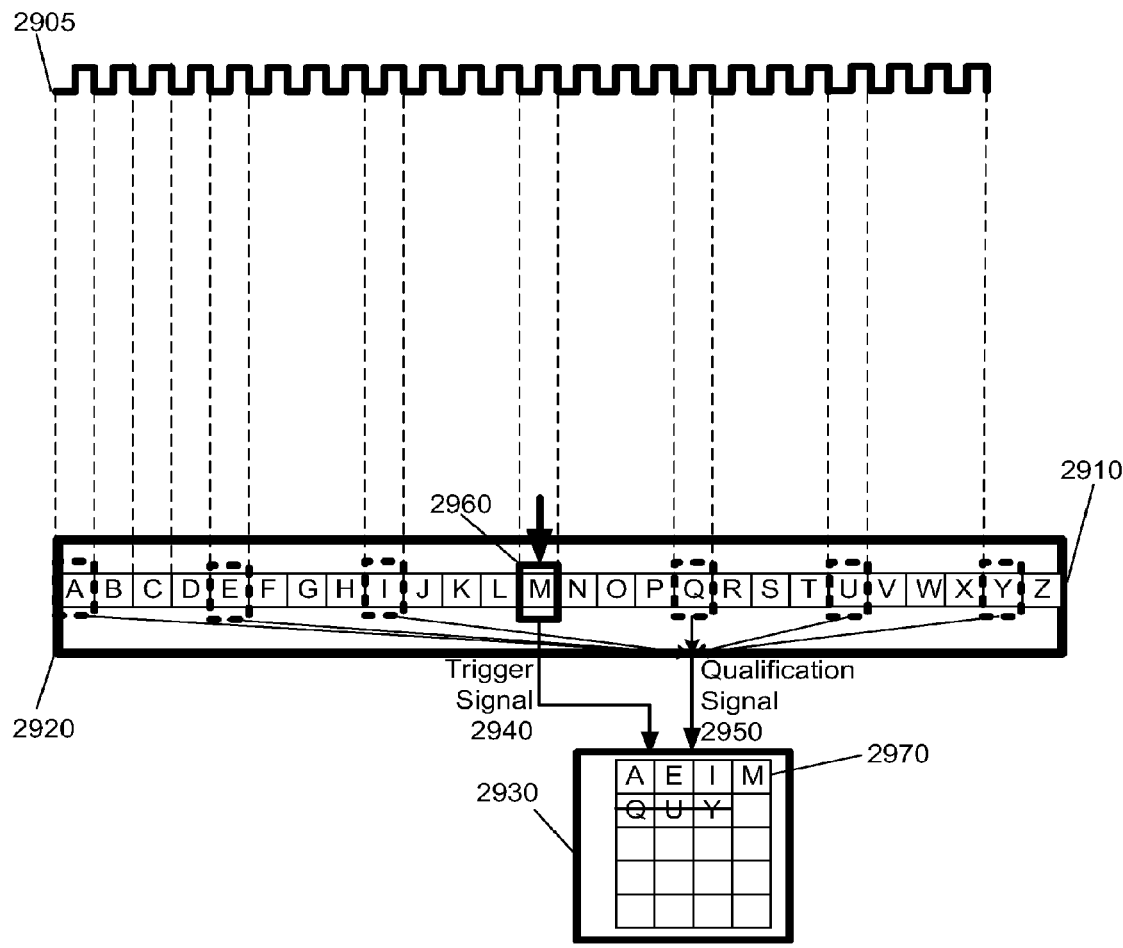
FIG. 29 illustrates clock qualification in accordance with some embodiments.

FIG. 29 conceptually illustrates clock qualification in accordance with some embodiments. As shown, clock qualification of some embodiments involves a user design clock 2905, a data stream 2910, a trigger circuit 2920, a trigger signal 2940 of the trigger circuit 2920, a qualification signal 2950 of the trigger circuit 2920, and a trace buffer 2930 receiving both the trigger signal 2940 and the qualification signal 2950.

In this figure, a data stream 2910 is continually streamed into the trigger circuit 2920 and the trace buffer 2930 in real time as the monitored circuits of the primary circuit structure receive the data stream according to the user design clock 2905. The trigger circuit 2920 is configured with a user specified triggering event and also with a clock qualifier. In some embodiments, the clock qualifier is a counter that counts on which clock cycles the trace buffer 2930 should perform a write operation. In this figure, the clock qualifier causes the trace buffer 2930 to perform a write operation every fourth user cycle. In some embodiments, the clock qualifier is conveyed from the trigger circuit 2920 to the trace buffer 2930 via a qualification signal 2950 that further controls when the trace buffer 2930 writes.

Similar to the pre-trigger mode of operation described above, the trace buffer receives the data stream and writes the data stream in a continuous manner, overwriting previously written data when the buffer is full. However, the clock qualification signal 2950 controls the trace buffer 2930 such that only data values at the desired clock are written into the buffer. Then when the trigger circuit 2920 identifies a data value 2960 that satisfies the triggering event, the trigger circuit 2920 fires the trigger signal 2940.

If the circuits are configured to operate in pre-triggering mode, then a window of values already within the trace buffer are stored and those values are prevented from being overwritten. If the circuits are configured to operate in post-triggering mode, as shown in FIG. 29, then subsequent writes are performed into the trace buffer 2930 in accordance with the clock qualification signal 2950 until a specified post-trigger window 2970 is recorded.

Adaptations of the clock qualification functionality allow users to capture signals only during writes of a particular logic memory in the user circuit or address within the logic memory. Without clock qualification, the trace buffer captures up to some number X of data once the trigger fires. However, if the user is only interested in writes and writes only happen once every 10 clock cycles, then 90% of the data in the trace buffer is not interesting to the user. By configuring clock qualification, some embodiments perform the data capture only when the user desired writes occur at every tenth clock cycle. In this manner, the trace buffer stores only relevant user data. Qualification thus provides the additional control to make more economic use of the trace buffer and further filters the data that passes from the primary circuit structure into the trace buffer based on the firing of the trigger circuit.

Figure 30:
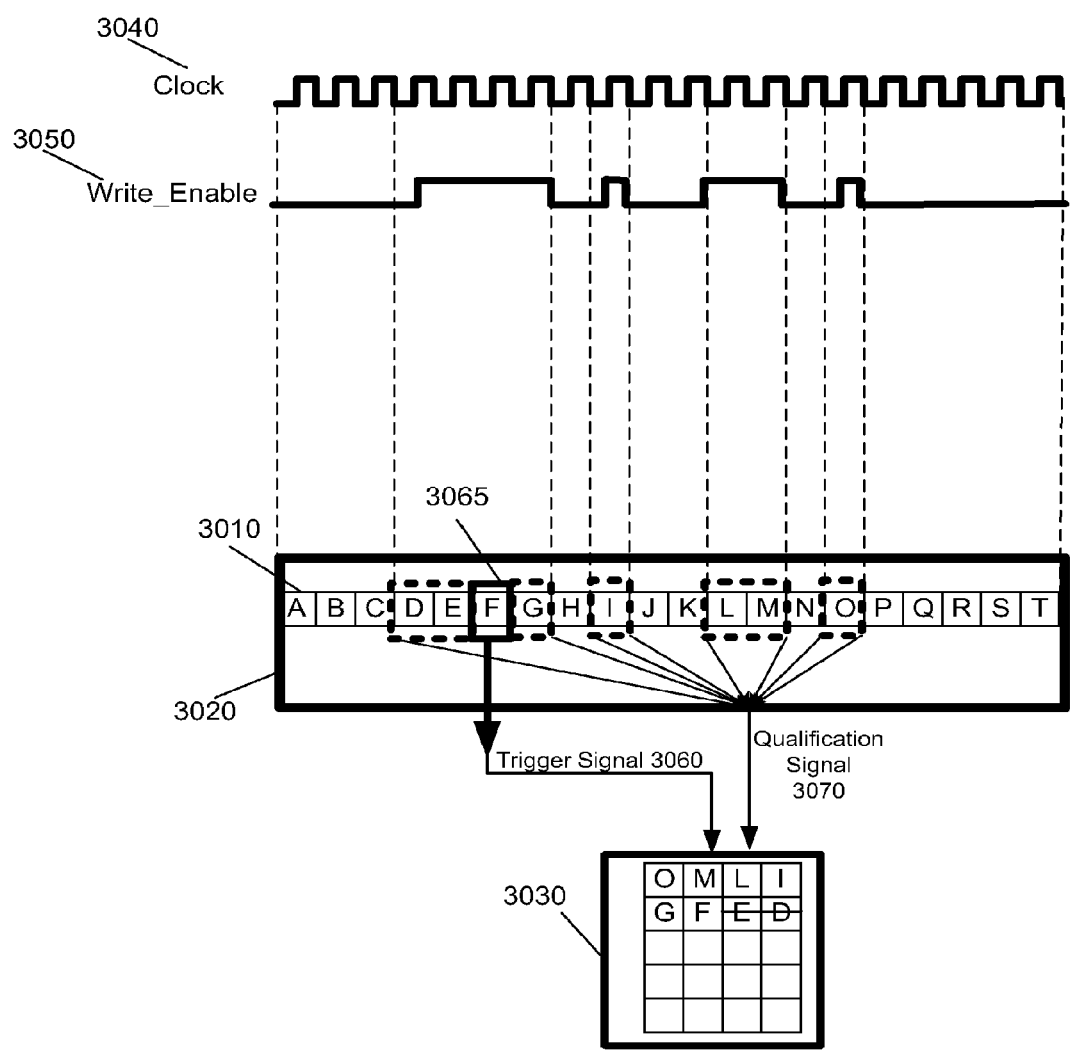
FIG. 30 conceptually illustrates clock qualification with a qualifier based on memory writes.

FIG. 30 conceptually illustrates clock qualification with a qualifier based on memory writes. As shown, clock qualification of some embodiments involves a user design clock 3040, a Write_Enable signal 3050, a data stream 3010, a trigger circuit 3020, a trigger signal 3060 of the trigger circuit 3020, a qualification signal 3070 of the trigger circuit 3020, and a trace buffer 3030 receiving both the trigger signal 3060 and the qualification signal 3070.

In this figure, a data stream 3010 from the primary circuit structure is streamed into the trigger circuit 3020 and trace buffer 3030 of the secondary circuit structure at the user clock 3040. However, qualifying the writes of the data stream 3010 to the trace buffer 3030 is the clock qualification signal from the trigger circuit 3020 that is based on a Write_Enable signal 3050. The Write_Enable signal 3050 represents when a particular memory address of a memory in the primary circuit structure is written to.

As shown, the trace buffer 3030 only writes values of the data stream 3010 when the Write_Enable 3050 signal has a value of "1". Accordingly, when the trigger circuit 3020 fires the trigger signal 3060 upon detecting the triggering event 3065, the trace buffer stores only value from the data stream 3010 that arrive when the qualification signal 3070 corresponding to the Write_Enable signal 3050 is set.

In some embodiments, clock qualification is performed by streaming the Write_Enable signal as a one-bit value into the trigger circuit further described below with reference to FIG. 31. The trigger circuit can then be configured using either the edge-detection circuits or ALU of the trigger circuit to determine whether the Write_Enable signal has a value of "1". If so, the trigger circuit will then set the qualification signal to a "1".

e. Trigger Circuit

Figure 31:
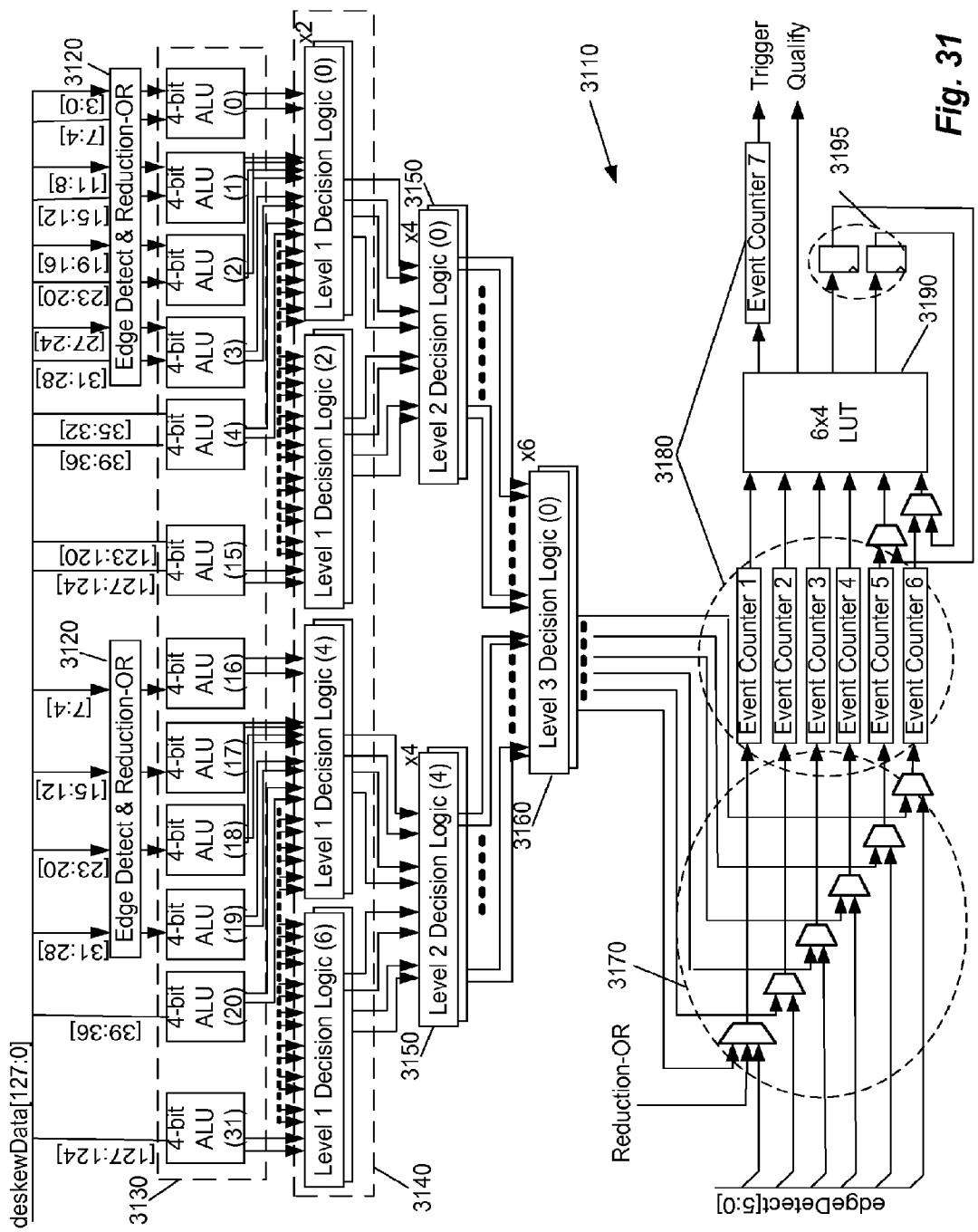
FIGS. 31-36 illustrate a trigger circuit and various components of the trigger circuit in accordance with some embodiments of the invention.

FIG. 31 presents a circuit diagram for a trigger circuit 3110 in accordance with some embodiments of the invention. In some embodiments, the trigger circuit 3110 includes configurable edge-detection circuits 3120, a set of arithmetic logic units (ALUs) 3130, a first level hierarchical decision logic 3140, a second level hierarchical decision logic 3150, and a third level hierarchical design logic 3160, matchers 3170, event-counters 3180, a LUT 3190 for generating the final trigger, and a set of storage elements 3195. As shown, the trigger circuit receives 128 bits of data over the deskew lines. However, it should be apparent to one of ordinary skill in the art that some embodiments of the trigger circuit may be adapted to operate using any arbitrary number of bits (e.g., 1024, 256, 8). Accordingly, the trigger circuit need not be implemented using all of the above enumerated circuit modules. Similarly, some embodiments of the trigger circuit may be implemented using other circuit modules in conjunction with or instead of some of the above enumerated circuit modules.

In some embodiments, the trigger circuit 3110 operates at a user defined clock rate where the user defined clock rate is synchronous to a sub-cycle clock running at 1/n of the sub-cycle frequency where n is the number of reconfigurable sub-cycles in one clock cycle, also referred to as "looperness." In some such embodiments, deskewed data arrives at every user-clock edge, synchronous to the sub-cycle clock. A sub-cycle control module generates a proper clock enable signal based on the looperness configured and all pipeline registers will be clocked only when the clock enable signal is asserted. It should be apparent to one of ordinary skill in the art that in some other embodiments the trigger circuit 3110 operates at the sub-cycle frequency.

1. Configurable Edge-Detection Circuits

The edge-detection circuits 3120 are configurable to detect one of several signals transitions. In some embodiments, the edge-detection circuits 3120 detect a rising edge, a falling edge, a state change irrespective of the actual transition, or perform a no operation pass through of the signal received on its input to its output. Each of the edge-detection circuits 3120 in FIG. 31 perform up to 16 bits of edge detection. However, it should be apparent to one of ordinary skill in the art that the edge-detection circuits 3120 may be implemented using several one-bit edge-detection circuits.

Figure 32:
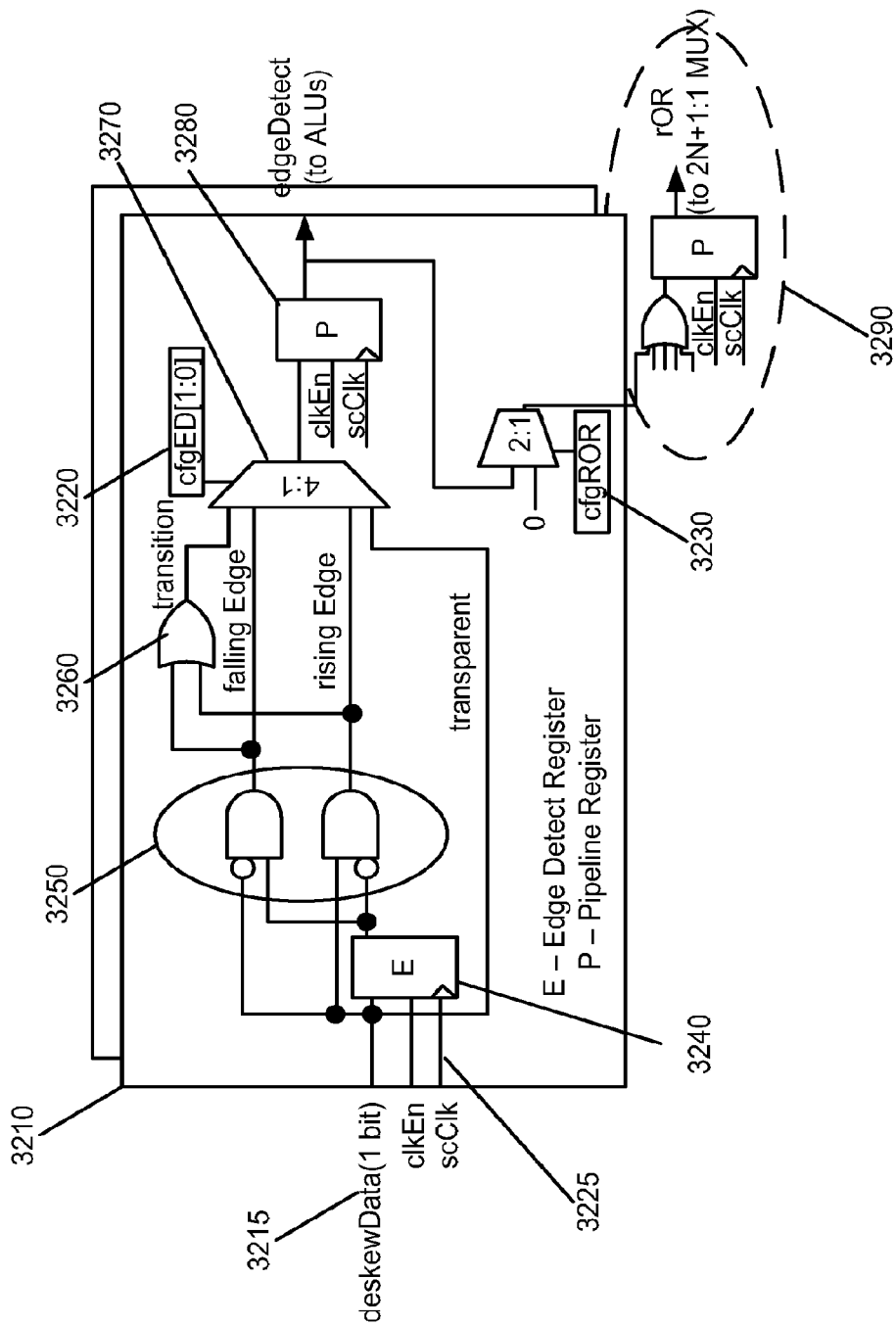

FIG. 32 illustrates a one-bit edge-detection circuit 3210 in accordance with some embodiments of the invention. As shown, the edge-detection circuit 3210 includes a one-bit input 3215, a clocking signal 3225, configuration bits 3220 and 3230, a delay register 3240, a pair of edge detecting AND gates 3250, a signal transition OR gate 3260, a configuration select multiplexer 3270, a timing register 3280, and reduction-OR circuitry 3290. Several such one-bit edge-detection circuits 3210 are necessary to perform the reduction-OR functionality as is described below.

To perform the edge detection functionality, the delay register 3240 creates a delayed-version of the input signal 3215. To create the delayed-version of the input signal 3215, the register 3240 includes a flip-flop through which the input signal 3215 passes. Both the delayed-version of the input signal 3215 and the non-delayed version of the input signal 3215 are passed to the edge detecting AND gates 3250.

One AND gate in the pair of AND gates 3250 inverts the non-delayed version of the input signal 3215 before performing the logical AND operation. Then, by ANDing the inverted non-delayed version of the input signal 3215 with the non-inverted delayed-version of the input signal 3215, this AND gate is able to detect a falling edge in the input signal 3215.

The second AND gate in the pair of AND gates 3250 inverts the delayed version of the input signal 3215 before performing the logical AND operation. Then, by ANDing the inverted delayed version of the input signal 3215 with the non-inverted non-delayed version of the input signal 3215, this AND gate is able to detect a rising edge in the input signal 3215.

By logically ORing the outputs of the edge detecting AND gates 3250 using the signal transition OR gate 3260, the edge detection circuit 3210 is further able to determine a signal transition irrespective of whether it is a falling edge or rising edge. Specifically, if either a falling edge or rising edge is detected, the signal transition output of the OR gate will be a value of "1".

In this manner, the edge-detection circuit 3210 can synchronously detect rising edges or falling edges. All such values are then passed to the configuration select multiplexer 3270 which selects the edge detection operation that the edge-detection circuit 3210 performs at a given moment in time based on the configuration bits 3220. The edge-detection circuit 3210 is configurable to output a "1" value when a rising edge occurs, when a falling edge occurs, or when either condition occurs on its respective input. The circuit 3210 may also be configured to operate transparently by simply passing through its inputs to its outputs. Configuration tables for the configuration bits 3220 of the edge detection circuit 3210 are provided in the subsection below "Configuring the trigger circuit." A retiming register 3280 is then placed to buffer the output of the edge detection circuit so that a stable signal passes to the ALU or other components of the trigger circuit.

Additionally, the edge detection circuit 3210 when coupled with other edge detection circuits 3210 provide a reduction-OR functionality whereby a single edge transition may be detected from amongst several input bits. Specifically, each edge detection circuit 3210 determines a transition for a single input bit. Each such output is passed to a shared reduction-OR circuit 3290 that performs a logical OR operation for the values in order to determine if any one of multiple bits has transitioned states. The reduction-OR configuration of the edge detection circuit 3210 is controlled by the configuration bit 3230 which is described further below in the subsection "Configuring the trigger circuit."

The outputs from the edge-detection circuitry 3120 and those inputs of the trigger circuit 3110 that do not pass through the edge-detection circuitry 3120 are then passed to the ALUs 3130. In some embodiments, the ALUs 3130 are configurable to perform one or more of a set of operations.

2. ALUs

In some embodiments, the bank of ALUs 3130 is created using several four-bit ALUs. In some embodiments, the ALUs 3130 are configured to compliment the functionality of the edge-detection circuitry 3120 by detecting specific signal transitions. For instance, the ALU can select a data value or a constant to determine whether a detected signal transition involves transitioning from a "0" to "1" or vice versa.

In some embodiments, the ALUs 3130 support comparisons of variable width by spanning an operation larger than four bits over multiple ALUs with each ALU performing a subset of the operation. For instance, by spanning the full width of the trigger circuit 3110, some embodiments are able to implement 128-bit operations (e.g., 32 four-bit operations). As the trigger circuit 3110 is constructed with multiple n-bit combinational ALUs, the trigger circuit 3110 can therefore support comparisons of variable widths, in steps of n bits. Additionally, different sets of the ALUs 3130 may be grouped together to form multiple discrete comparators. For example, three of the ALUs 3130 may be configured to perform a first 12-bit operation while eight of the ALUs 3130 may be configured to perform a second 32-bit operation simultaneously with the first 12-bit operation.

In some embodiments, each ALU of the ALUs 3130 is configurable to compute several operations for operands A and B, where operand A is a user signal and operand B is either a user signal or a user-specified constant. It should be apparent to one of ordinary skill in the art that the separable configurable attribute of each ALU allows each ALU to be configured differently such that different ALUs can perform different operations relative to other ALUs at any instance during the runtime operation of the IC. In some embodiments, the operations performed by each of the ALUs 3130 include comparator operations such as A<B, A>B, A<=B, A>=B, A==B, A!=B, and transitions from "1" to "0" or from "0" to "1" for operands A and B. Additionally, each ALU includes carry logic, sign logic, overflow detection, equality logic, and masking.

Figure 33:
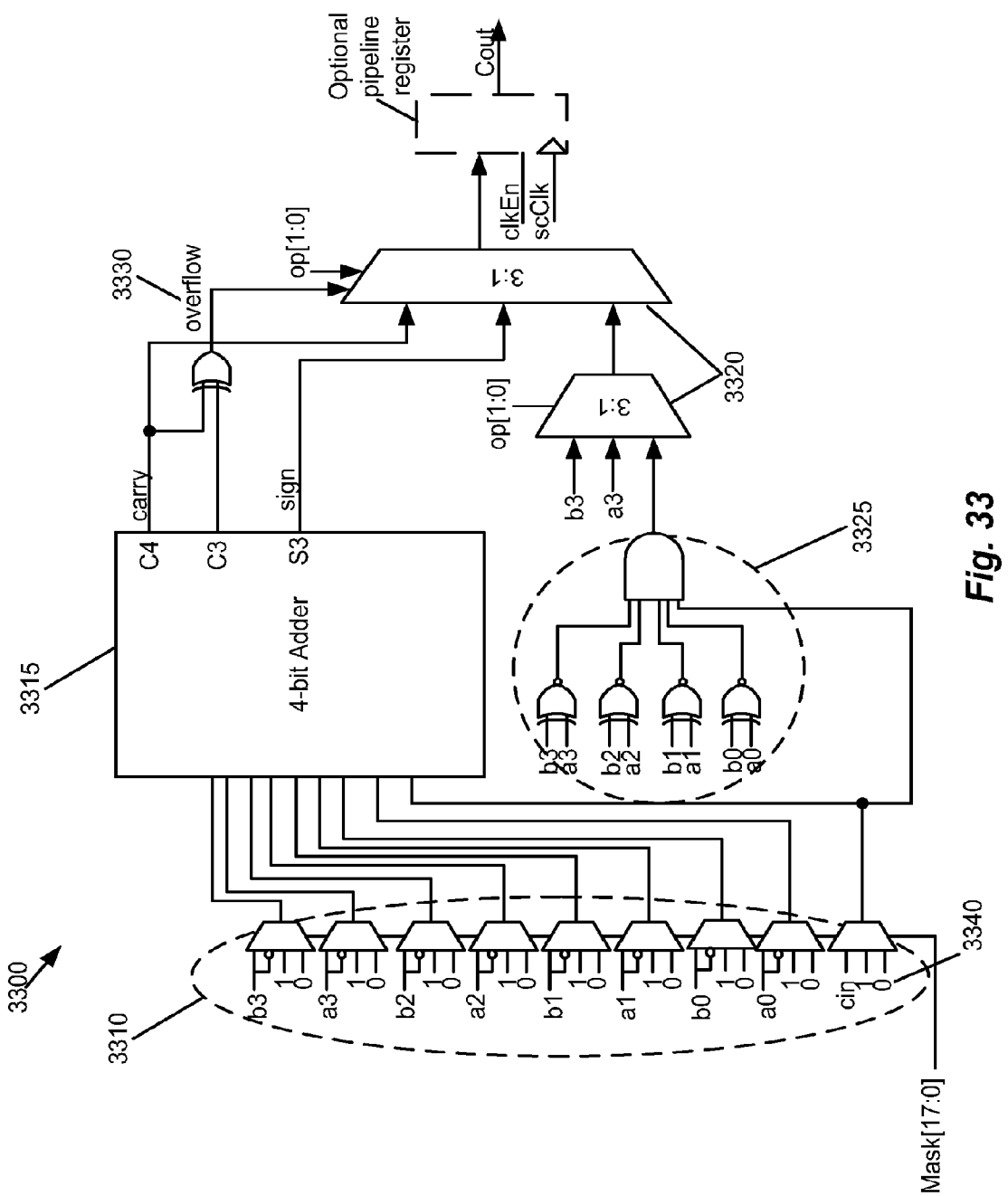

FIG. 33 illustrates an ALU 3300 in accordance with some embodiments of the invention that implements the various ALU functionality. The ALU 3300 includes a set of input select multiplexers 3310, a four-bit adder 3315, equivalence comparison circuits 3325, and function select multiplexers 3320.

The set of input select multiplexers 3310 control masking of four different possible inputs. These inputs include a pass through value of an input bit from the deskew lines passing into the trigger circuit of a first operand or a second operand (e.g., A or B), an inverted pass through value of the first operand or second operand, a constant "0" value, and a constant "1" value. The selection of the inputs is based on configuration data received at the select lines of each multiplexer. As a result, a constant value is programmed into the ALU without the need to pass the constant value over the deskew lines (e.g., inputs of the trigger circuit).

The four-bit adder 3315 then receives the selected inputs and performs a four-bit signed add operation on the input values. However, it should be apparent to one of ordinary skill in the art that by selecting inverted input values and/or constant values, the four-bit adder 3315 can be made to also perform a subtraction operation. The outputs of the adder 3315 include a sign value, a carry value, and a result value for the four-bit operation. These values are then used to perform one of several arithmetic comparison operations. For example, to perform an A<B operation, the "cin" input 3340 is masked to be a constant value of "1". The addition of this "1" constant and the inverted B-input values computes the 2's complement of B. The result added with the A input is necessary to perform the subtraction of B from A. The resulting sign value of the four-bit adder determines if operand A is less than operand B. Similarly, to compute if A>B, the constant value of "1" is selected for the cin input 3340 which is added to the B input and the inverted A input.

For operations employing multiple ALUs to perform larger than four-bit comparisons. Inputs A and B must be sign-extended to four bits. For example, a 10-bit number must be sign-extended to 12-bits. This simplifies the design of the ALUs because the result of the comparison operation is represented by the most-significant sum bit of the ALU.

The equivalence comparison circuits 3325 perform a XNOR operation between each A bit and B bit value. The results of all four XNOR bits are then ANDed together to produce a value of "1" if A equals B.

The function select multiplexers 3320 then receive outputs from the four-bit adder 3315 and the equivalence comparison circuits 3325 and select an output to determine the function produced by the ALU. Configuration tables describing some of the various operations performed by the ALU 3300 are further described below in the subsection "Configuring the trigger circuit."

As shown in FIG. 31, some ALUs 3130 directly receive deskewed data and other ALUs 3130 receive deskewed outputs from the edge-detection circuitry 3120 described above. Therefore, it is not necessary for every ALU to receive inputs from the edge-detection circuits 3120, but rather only some ALUs 3130 receive inputs from the edge-detection circuits 3120. In some embodiments, the alternating of inputs received from the edge-detection circuits is because it is rare that a user would compare an edge detection result with another edge detection result. Instead, the comparison is often made against a constant or some previous value.

Figure 34:
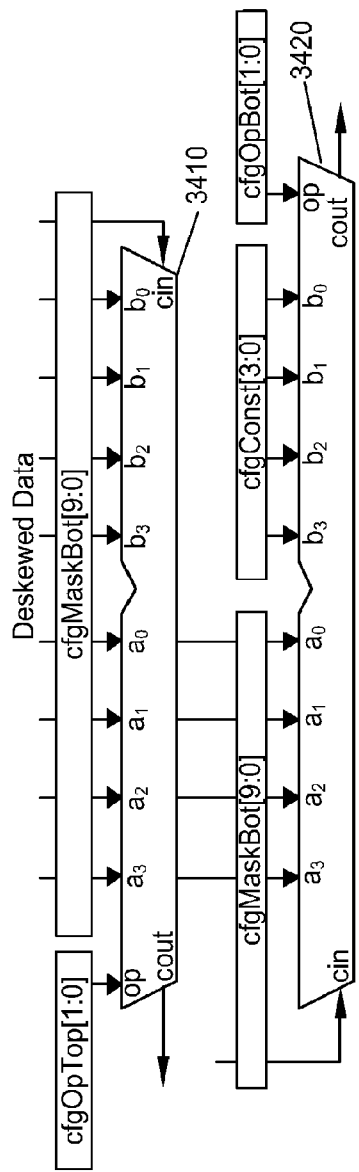

In some embodiments, the ALU 3130 are aligned with a set of top ALUs and a set of bottom ALUs. FIG. 34 provides a more detailed illustration for an ALU slice with a top ALU 3410 and a bottom ALU 3420 that receive deskewed input data in accordance with some embodiments. The top ALU 3410 accepts two four-bit variable inputs. The bottom ALU 3420 accepts one four-bit variable input, A, and one constant input, B. The inputs to the ALU slice come from the deskew units that align the trigger circuit 3110 signals. The constant B input to the bottom ALU is driven by a constant register. Some of the A and B inputs for the ALU slice pass through masks that are configurable, on a bit-by-bit basis, to pass either the input value, inverted input value, or a constant such as a "1" or "0" to the ALU.

Additionally, each ALU has a maskable chain input (Cin) and chain output (Cout) for chaining together multiple ALUs. The chaining of ALUs allows the trigger circuit to support operations wider than the four-bit width operations performed by an individual ALU using the below described hierarchical decision-logic modules 3140-3160. In some embodiments, chaining allows for up to 128-bit wide operations to be performed by the trigger circuit. It should be apparent to one of ordinary skill in the art that chains of ALUs can be started at any point by masking out the chain input as necessary.

Figure 35:
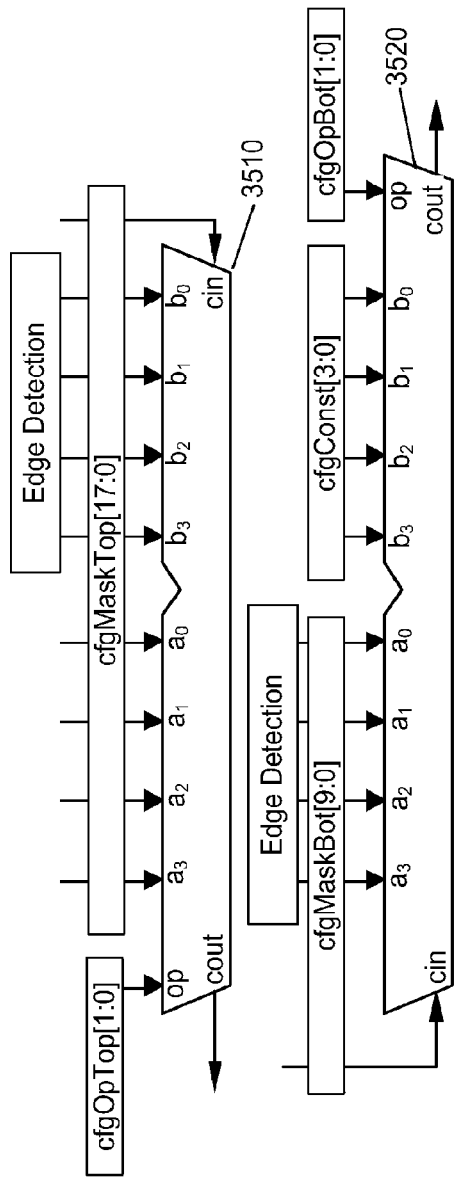

FIG. 35 illustrates the ALU slice of FIG. 34 but with some inputs being supplied by edge-detection circuitry. As shown, the deskewed data inputs only connect to an A input of the top ALU 3510. The B input of the top ALU 3510 and the A input of the bottom ALU 3520 take outputs from the edge-detection circuitry to maximize the usability of the edge-detection circuitry outputs by complimenting the edge-detection circuitry functionality with the ALU functionality. When the edge-detection circuitry operates in "pass-through" mode, then the illustrated ALU slice operates in a manner similar to the ALU slice presented above with reference to FIG. 34.

3. Decision Logic Modules

In some embodiments, the decision-logic modules 3140-3160 accept the outputs from the individual ALU modules and programmably chain the outputs together to form wider comparators. Specifically, the decision logic 3140-3160 examines the outputs from all ALU outputs used to implement a given operation of a given width and computes the total operation across all of the involved ALUs.

In some embodiments, the decision logic 3140-3160 is organized in tree-like fashion. Such a hierarchical ordering increases parallelism with a reasonable implementation cost. As shown, the decision logic includes a first level hierarchical decision logic 3140, a second level hierarchical decision logic 3150, and a third level hierarchical design logic 3160. At each level, there are multiple decision logic blocks.

Each decision logic block of the first level 3140 accepts outputs from eight of the four-bit ALUs 3130. In some embodiments, the outputs include the sign signal ("S") and equality signal ("E") from each ALU described above. The sign value "S" indicates if a first four-bit value is greater than a four-bit value and the equality value "E" indicates whether the values are equal. In turn, each decision logic block generates a pair of sign "S" and equality "E" signals that reduces the total number of sign and equality signals generated by the ALUs. For example, a 12-bit equality comparison operation performed by three 4-bit ALUs will result in three equality signals set to a true or "1" value when the 12-bit operands being compared are equivalent. A particular decision logic block of the first level 3140 then compares the resulting three equality signals from the three ALUs and if all three equality signals are true, the particular decision logic block outputs a single equality signal indicating the result.

The second level decision logic blocks 3150 are implemented with four-bit decision blocks, each block accepting four pairs of signals from the first level. The blocks in the second level, as in the first level, are replicated to enable a flexible grouping of ALUs to create comparators of varying width.

Lastly, the third level decision logic blocks 3160 accept the inputs from the second level in order to generate the final outputs of the decision logic hierarchy. Each decision logic block in the third level accepts an input pair for every block at the second level to generate the final output. However, the third level blocks are replicated so that there are six identical blocks, each accepting all of the pairs from the second level in order to provide outputs for the matchers 3170. In this manner, the trigger circuit of FIG. 31 supports six simultaneous operations.

Figure 36:
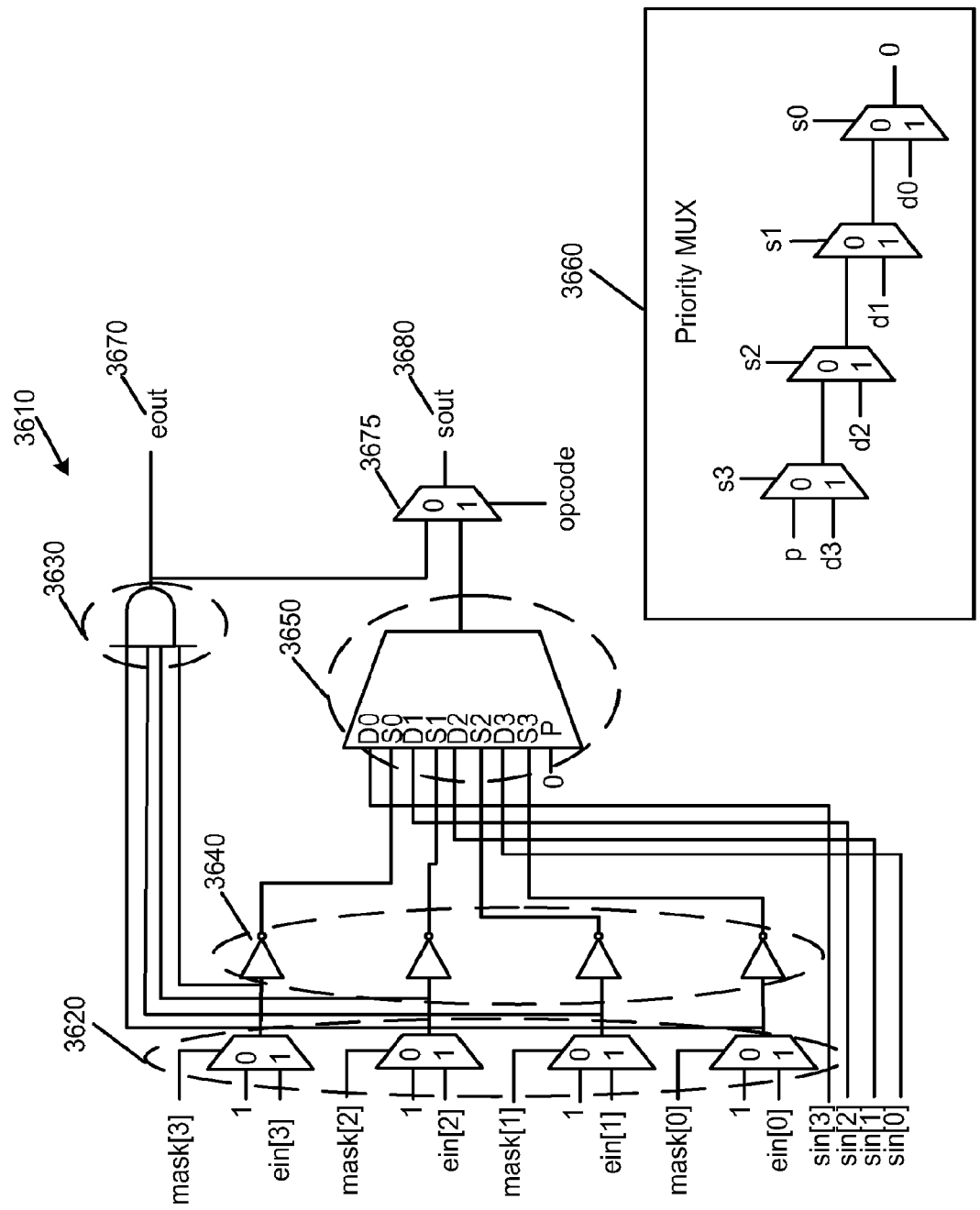

FIG. 36 illustrates a decision logic block 3610 in accordance with some embodiments. In this figure, the decision logic block 3610 includes several 2:1 multiplexers 3620, AND gate 3630, inverters 3640, and a priority multiplexer 3650.

The multiplexers 3620 select the inputs for the decision logic block 3610. Specifically, the decision logic block 3610 can be configured to evaluate a constant "1" or the equality output from the ALU if in the first level of the hierarchy or the equality output from a previous decision logic block in a previous level of the hierarchy. The equality output has a value of "1" if the input represents equality and a value of "0" if the input represents inequality.

The outputs from the input multiplexers 3620 are ANDed together to create the eout signal 3670. The eout signal 3670 represents equality only if all sub-values are also equal. The outputs of the input multiplexers 3620 are also passed through inverters 3640 and passed to the priority multiplexer 3650.

The priority multiplexer 3650 determines if one value is larger than another based on the equality signals and sign signals 3680 from the ALUs. Specifically, the priority multiplexer compares the sign bit and equality bit resulting from the most significant part of the comparison resulting from the ALUs or the decision logic to determine if one is greater than the other and proceeds to the next most significant part if the determination cannot be made using the earlier set of values. This is accomplished using the equality and sign values as shown in the detailed circuit structure 3660 where a chain of 2:1 multiplexers receive the inverted equality values and the sign values to perform the comparison. Finally, the output from the priority multiplexer 3650 and the eout signal 3670 are passed to a final multiplexer 3675 that chooses between the two inputs based upon an opcode value.

The following presents two examples for the operation of the decision logic of some embodiments when determining the equality between two 12-bit values A and B (A=B) and determining which value is greater (A>B). Therefore, assuming only a single level of decision logic that receives the sign "S" signals and equality "E" signals from the four 4-bit ALUs, the single level of decision is sufficient to produce the final result of either operation.

Specifically, the 12-bit values A and B are assigned to three ALUs with the first ALU, ALU[0], comparing bits 0-3 of values A and B and generating a first "E" signal, ein[0], and a first "S" signal, sin [0]. For this example, assume the following values for A and B (where the left-most bit is the most significant bit and the right-most bit is the least significant bit).

A: 0010 0100 1111 (Decimal 591)
B: 0011 0011 1111 (Decimal 831)

The second ALU, ALU[1], compares bits 4-7 of A, B, generating second "E" value, ein[1], and second "S" value, sin [1], and a third ALU, ALU[2], comparing bits 8-11 of A, B, and generating third "E" value, ein[2], and third "S" value, sin [2]. ALU[3] does not contribute to the comparison and the ALUs and decision logic will be configured to ignore output values from ALU[3].

To perform the equality operation A=B, the priority multiplexer of the decision logic circuits are ignored. Instead, the signal opcode that selects the output of the decision logic block is set to a "0" so that the block selects the output from the AND-gate driven by the four outputs from the input multiplexers. The ein[3] output from ALU[3] is masked by setting mask[3] to a "0". This forces a "1" from its associated multiplexer that is ANDed with the remaining outputs from the ALUs (ein[2], ein[1], ein[0]). The output from the four-input AND gate will be a "1" if ALU[2], ALU[1] and ALU[0] determine that the four-bit values they are comparing are equal, and will be a "0" otherwise. In some embodiments, the decision logic is configured to ignore the output of ALU[3], as the output of ALU[3] does not contribute to the comparison.

To perform the comparison operation A>B, the opcode signal to the decision logic block is set to a "1" to select the output from the priority multiplexer for its output. In this example, the four-input AND gate is ignored.

As shown, B is greater than A. The trigger circuit is configured to detect if A is greater than B by setting mask[3] is set to a "0" value. This places a "1" on its associated inverter. The other mask bits are set to a "1". The sin [3] output from ALU can be ignored for this example. The remaining ein and sin signals from ALU[2], ALU[1] and ALU[0] generate the following values from the exemplary A and B values above:

ein[0]: 1 (A and B are equal, for bits 0-3)
ein[1]: 0 (A and B are not equal, for bits 4-7)
ein[2]: 0 (A and B are not equal, for bits 8-11)
ein[3]: 1 (mask[3] is set to a '0')
sin [0]: 0 (A is not greater than B, for bits 0-3)
sin [1]: 1 (A is greater than B, for bits 4-7)
sin [2]: 0 (A is not greater than B, for bits 8-11)

These values are then passed to the priority multiplexer. Starting at the far right of the priority multiplexer and moving back through the chain, s0 selects the output of the closest previous multiplexer in the chain. s1 selects d1(sin [2]) as its output. d1 is the final output for the priority multiplexer. d1 (sin [2]) is a 0, which indicates that A is not greater than B which is the final result for this example.

The following generalizes the operations performed by the decision logic to detect equality or inequality of two values A and B. For example, if the trigger circuit 3110 is configured to determine whether A is greater than B, for a 16-bit comparison using four four-bit ALUs, the outputs from these four ALUs are compared using the following algorithm:

Start with the most-significant nibbles of A and B
Compare A and B nibble-wise (using the outputs from the ALUs), until either:
There are no more nibbles, the numbers are equal OR
One of the nibbles is larger than the other, the number with the larger nibble is the larger number Although the algorithm is presented serially, some embodiments of the trigger circuit 3110 (e.g., ALUs 3130 and decision logic hierarchy 3140-3160) implement the algorithm in parallel to achieve maximum performance. In this manner, some embodiments are able to avoid having the nibble-wise operations performed by each ALU propagate from a first n-bit ALU to a last n-bit ALU for an m-bit operation.

4. Selection Circuitry

In some embodiments, the matchers 3170 are multiplexers that receive inputs directly from outputs of the edge-detection circuitry 3120 or directly from the outputs of the decision logic 3160. In this manner, the matchers 3170 make it possible to bypass and therefore avoid configuring and consuming an ALU in order to pass a one-bit signal value to the later stages of the trigger circuit. This frees up the trigger circuit to perform additional or more complex operations for a specified triggering event.

In some embodiments, the matchers 3170 in conjunction with the decision logic select the relevant data to pass to the later stages of the trigger circuit when the triggering event includes multiple user specified conditions. For instance, if only a single four-bit condition is specified for a particular triggering event, then only the inputs to the matchers 3170 for that triggering event need to be passed. However, if multiple conditions are specified for one or more triggering events, then the output of each such triggering event is separated by the matchers logic such that each multiplexer in the set of multiplexers 3170 is responsible for passing a result of a specified condition to the event counters 3180 and LUT 3190. In some embodiments, the matchers 3170 are configurable such that their operation is driven by one or more sets of configuration data.

5. Event Counters

An event counter 3180 is able to track the number of occurrences of an event (e.g., one or more of the events described above, including a user-defined event, a signal transition, etc.) during operation of an IC in some embodiments. As shown in FIG. 31, multiple event counters 3180 may be present in the trigger circuit, where each event counter tracks the number of occurrences of different events. In some embodiments, an event counter may be configured to count the number of consecutive times an event occurs. In some embodiments, an event counter may be configured to count the overall number of times an event occurs (including non-consecutive occurrences of an event). In some embodiments, an event counter that is configured to count consecutive occurrences may be reconfigured to count overall occurrences during the operation of the IC, and vice versa.

In some embodiments, an event counter continuously outputs an event signal which is true once a preconfigured count value is reached and is false when a preconfigured count value is not reached. Like other components of the IC, these event counters are accessible over the secondary circuit structure (i.e., some or all of the values stored in the event counters may be read or written through the secondary circuit structure). As further described below, event counters have a variety of uses. For instance, event counters may be used in the definition of trigger events, or to monitor performance of particular resources of the IC.

i. Event Counter Circuitry

Figure 37:
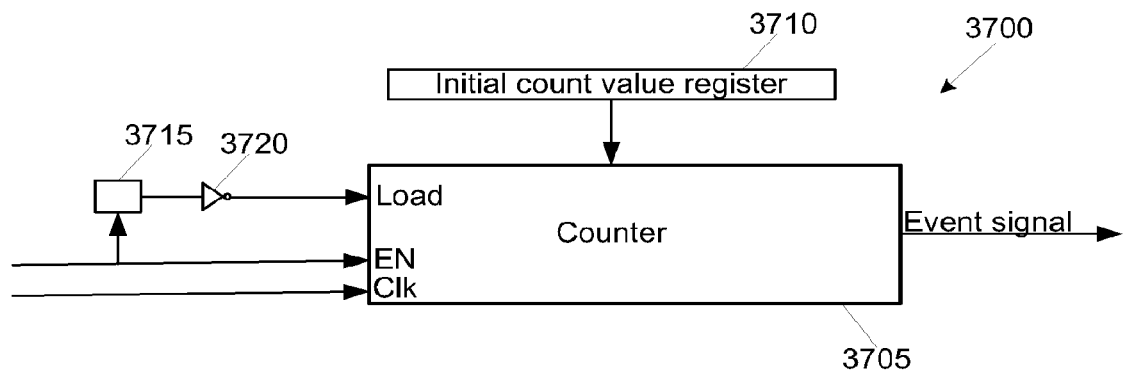
FIG. 37 illustrate different embodiments of an event counter.

FIG. 37 illustrates an event counter 3700 of some embodiments. As shown, the event counter 3700 includes counter circuitry 3705, an initial count value register 3710, a count mode selector 3715, and an inverter 3720. The counter 3705 stores a count value that indicates the number of times an event has occurred. The event counter 3700 receives, as input, an "EN" signal that indicates when the event that the event counter is counting (referred to as the "counted event") has occurred. In some embodiments, the EN signal is the output of one of the matchers described above. In some embodiments, the EN signal is the output of the LUT 3190 of the trigger circuit 3110. In some embodiments, this signal is periodically supplied to the event counter 3700 (e.g., once every user cycle). The EN signal is provided to counter 3705 and the count mode selector 3715.

When the EN signal is true (i.e., when the counted event has occurred), the counter 3705 increments (i.e., increases by 1) the count value. While the word "increment" is used throughout this description, the counter 3705 of some embodiments is able to increase decrease (decrement) the count value. In this way, the event counter 3700 can "count up" or "count down." In some embodiments, when the event counter 3700 is configured to count down, the event counter 3700 outputs a true signal when the count value is a predetermined number (e.g., one). When the EN signal is false (i.e., when the counted event has not occurred), the counter 3705 does not increment or otherwise affect the count value. In some embodiments, the event counter 3700 also receives a clock signal Clk. On either the rising edge, falling edge, or either edge of the clock signal, the counter 3705 increments when the EN signal is true.

The event counter 3700 outputs an event signal. In some embodiments, this signal is output once for every time the event counter 3700 receives an EN signal as input (e.g., once every user cycle). In some embodiments, the event signal is the most significant bit of the count value stored by the counter 3705. This bit is zero (thus yielding a false event signal) until the count value reaches a terminal value, depending on the number of bits of the counter 3705. In some embodiments, upon reaching the terminal value, the most significant bit of the count value switches from zero to one (thus yielding a true event signal). Thus, in some embodiments, the terminal value for an n-bit counter is $2^{n-1}/2$.

For instance, if the counter 3705 is a 16-bit counter (i.e., the count value is a 16-bit value), the terminal value is 32,768. Between the values of zero and 32,767, inclusive, the most significant bit is zero (and thus the event signal is false). Once the count value reaches the terminal value (i.e., 32,768), the most significant bit is one (thus yielding a true event signal).

The number of times a counted event must occur in order for the event signal to be true can be customized through the initial count value. For instance, if the number of times is 1,000, the initial count value of a 16-bit counter 3705 (which has a terminal value of 32,768) may be set to 31,768. In some embodiments, this number is loaded into the counter 3705 before counting (e.g., during configuration of the IC). Since 31,768 is 1,000 away from the terminal value (i.e., 32,768), the event signal will be true after the counted event occurs 1,000 times. The event counter 3700 may also be configured to output a true event signal after a single occurrence of an event by loading a value one less than its terminal value (i.e., 31,767 for a 16-bit counter) into the initial count value register 3710. As discussed above, this value may be loaded into the counter 3705 from the initial count value register 3710.

The event counter 3700 is able to operate in two modes: "continuous" and "overall." In continuous mode, the event counter 3700 counts continuous, consecutive occurrences of the counted event. In overall mode, the event counter 3700 counts all occurrences of the counted event, including non-consecutive occurrences. This dual-mode operation is made possible through the use of an initial count value register 3710, a count mode selector 3715, and an inverter 3720. In some embodiments, the count mode selector 3715 is a configurable logic circuit that indicates, based on configuration data, whether the event counter 3700 is set to continuous mode or to overall mode. When the event counter 3700 is set to overall mode, the count mode selector 3715 outputs only a true output to the inverter 3720. Thus, the output of the inverter 3720 is false. The output of the inverter 3720 is a "load" signal that indicates whether to load the initial count value stored by the initial count value register 3710 into the counter 3705. Because the load signal is always false during operation of overall mode, the initial count value is not loaded while the event counter 3700 is counting, and the counter 3705 counts an overall count value.

In some embodiments, the initial count value is loaded into the counter 3705 while the event counter 3700 is not operating. For instance, as mentioned above, the initial count value is loaded into the counter 3705 before the event counter 3700 begins operation (i.e., before the event counter 3700 receives EN signals) in some embodiments. In some embodiments, the initial count value is loaded into the counter 3705 before the trigger fires.

When the event counter 3700 operates in continuous mode, the count mode selector 3715 passes through the EN signal, so that the output of the inverter 3720 is the logical compliment of the EN signal. For instance, when the EN signal is true (i.e., the counted event has occurred), the output of the inverter 3720 (i.e., the load signal) is false. However, when the EN signal is false (i.e., the counted event has not occurred), the output of the inverter 3720 (i.e., the load signal) is true. When the load signal is true, the initial count value stored in the initial count value register 3710 is loaded into the counter 3705, thus "resetting" the count value to the initial count value. In this way, the event counter 3700 is able to count consecutive occurrences of a counted event.

In some embodiments, the counter 3705 and the initial count value register 3710 are accessible via the secondary circuit structure. In other words, the values stored by the counter 3705 and/or the initial count value register 3710 may be read from or written to over the secondary circuit structure over a set of lines of the secondary circuit structure. In some embodiments, the event counter is able to pass through the EN signal on its output, rather than an event signal. In such embodiments, a multiplexer is located at the output of the event counter 3700. The multiplexer receives the EN signal and the event signal as input. In some embodiments, the multiplexer receives configuration data on its select line in order to determine whether to pass through the EN signal or the event signal. In some embodiments, the counter 3705 is able to be configured so that it does not increment, even when receiving a true EN signal.

In some embodiments, the count value of one or more event counters is readable by the secondary circuit structure. In some embodiments, these count values are stored in storage elements of the event counter that are "hardwired" through dedicated lines to the controller of the secondary circuit structure. Through these dedicated lines, the count values are continuously provided to the controller. Through the controller's interface (e.g., JTAG or some other type of interface) with external software, the count value can be read by the external software and presented to a user. Because these event counters include dedicated lines to the controller, the reading of these count values by the controller does not interfere with the operation of either the primary circuit structure (i.e., the user logic) or the secondary circuit structure (i.e., the generating and sending of packets).

Figure 38:
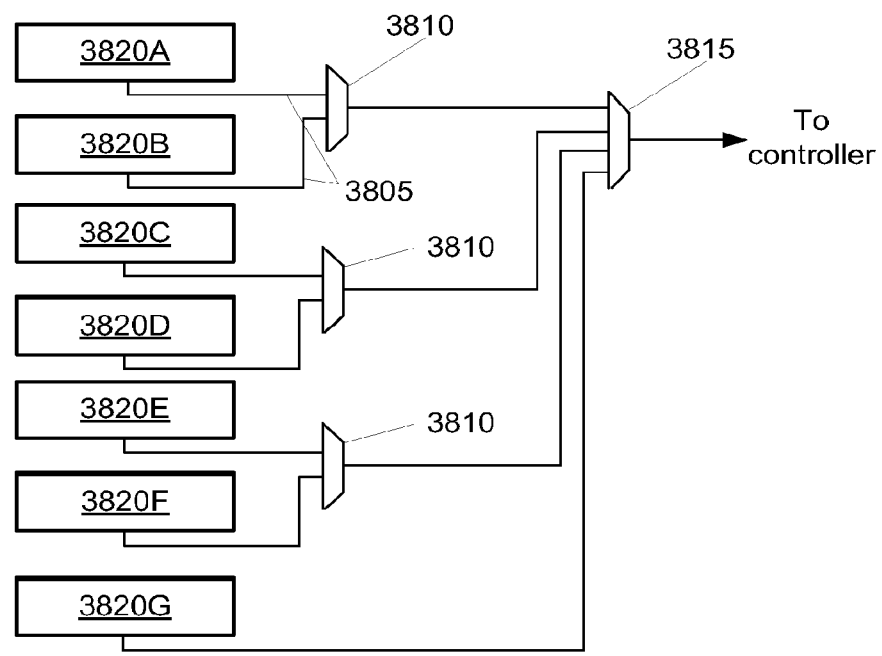
FIG. 38 illustrates an embodiment of reading of an event count value of some embodiments.

FIG. 38 conceptually illustrates seven event counters 3820A-G of a trigger circuit with readable count values. The secondary circuit structure includes sets of lines 3805 that access the count value stored by the event counters 3820A-G. While, in some embodiments, these lines 3805 are hardwired to the configuration controller, FIG. 38 illustrates some embodiments where configurable multiplexers select which of the event counters provide their count value to the controller. This figure includes three multiplexers 3810 that each receive the count values of two different event counters 3820 and selectively output one count value of one event counter 3820. In some embodiments, this receiving of the count value is independent of the event counter's 3820 other operations (e.g, receiving an EN signal and outputting an event signal).

The multiplexers 3810 supply their output to another multiplexer 3815, which outputs the count value stored by one of the seven event counters 3820A-G. As shown by the figure, this other multiplexer 3815 may directly receive the count value from one of the event counters 3820G in some embodiments. In other words, the event counters 3820G does not supply its count value to a multiplexer 3810 when outputting the count value to the secondary circuit structure. In some embodiments, one or more of the multiplexers 3810 and 3815 perform the abovementioned selecting based on one or more configuration data set.

In some embodiments, each of the event counters 3820A-G continuously outputs its count value to the secondary circuit structure. In some embodiments, the six event counters 3820A-F are the six event counters 3180 shown in the trigger circuit 3110 of FIG. 31. In some embodiments, the other event counter 3820G is the event counter at the output of the trigger circuit 3110 illustrated by FIG. 31. The multiplexers 3810 and 3815 and the lines 3805 that connect these multiplexers to the event counters 3820A-G are not shown in FIG. 31. However, in some embodiments, the trigger circuit 3110 includes these multiplexers 3810 and 3815 and lines 3805.

Figure 39:
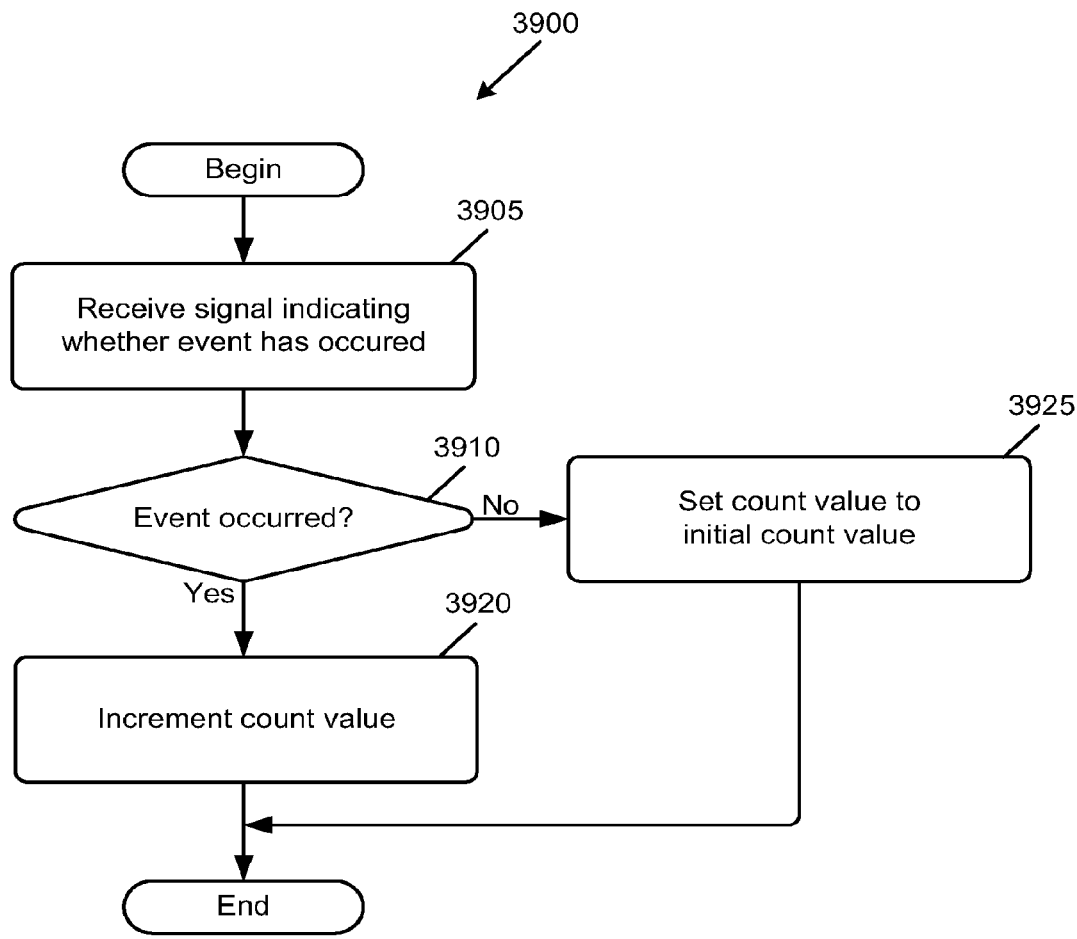
FIG. 39 illustrates a process of some embodiments that an event counter performs to count the number of times an event has occurred consecutively.

As mentioned above, a count value may be the either (1) the number of times the event has occurred consecutively, or (2) the overall number of times the event has occurred, including non-consecutive occurrences. FIG. 39 illustrates a process 3900 of some embodiments that counts the number of times an event has occurred consecutively. The process starts by receiving (at 3905) a signal indicating whether an event has occurred. In some embodiments, this is the EN signal received by an event counter, as described above. The process determines (at 3910), based on the received signal, whether the event has occurred. If the EN signal is true, this indicates that the event has occurred. If the EN signal is false, this indicates that the event has not occurred. When the process determines (at 3910) that the event has occurred, the process increments (at 3920) the count value of the event counter. The process then ends.

When the process determines (at 3910) that the event has not occurred, the process then reads (at 3925) an initial count value. This initial count value can be any value (e.g., 0, 1024, etc.). In some embodiments, this initial count value is stored in the initial count value register of the event counter. In other words, the count is "reset" each time the user-defined event does not occur. Thus, the count value stored in the event counter reflects the number of times the user-defined event has occurred consecutively. After this setting (at 3925), the process ends. In some embodiments, the process 3900 repeats each time the event counter receives an EN input value (e.g., once per user cycle, once per sub-cycle, etc.).

The above sub-section describes a process that performs event counting in continuous mode. The following sub-section describes a process that performs event counting in overall mode. Furthermore, the process describes, in addition to this other event counting mode, the use of an event counter when firing a trigger.

ii. Event Counter-Based Triggers

Figure 40:
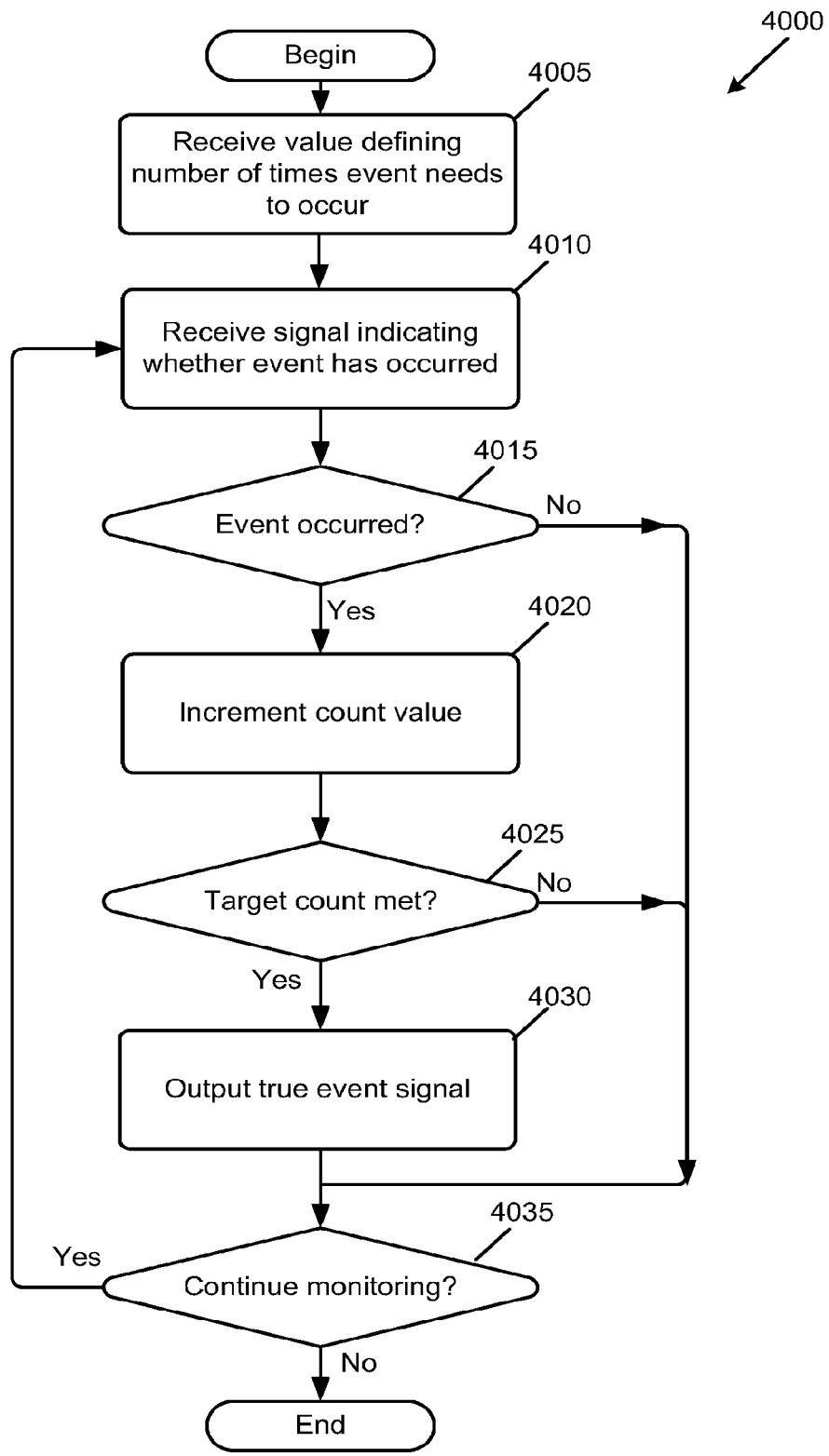
FIG. 40 illustrates a process of some embodiments that fires a trigger after a counted event occurs a predetermined consecutive number of times.

As mentioned above, some embodiments use event counters for a variety of tasks. For instance, an event counter at the output of the trigger circuit 3110 (e.g., the event counter 3180 that receives an output signal from the LUT 3190) can be used to further define when a trigger will fire. In some embodiments, the trigger will fire only when the specified event (referred to below as a "counted event") occurs a specified number of times. FIG. 40 illustrates a process 4000 of some such embodiments, where an event counter is configured in overall mode. In some embodiments, the event counter outputs an event signal that indicates whether the counted event has occurred the pre-determined number of times.

As shown in the figure, the process receives (at 4005) a configuration value that defines how many times the counted event needs to occur in order for the event counter to output a true event signal. In some embodiments, this value is loaded into the initial count value register described above. The process receives (at 4010) a signal (e.g., the EN signal described above) indicating whether the counted event has occurred. The process then determines (at 4015) whether the counted event has occurred (i.e., if the EN signal is true or false). When the process determines (at 4015) that the counted event has not occurred (i.e., the EN signal is false), the process proceeds to step 4035, which is further described below.

When the process determines (at 4015) that the counted event has occurred (i.e., the EN signal is true), the process increments (at 4020) the count value. The process then makes a determination (at 4025) of whether the counted event has occurred the pre-determined number of times. As described above, this determination may be made simply by the event counter outputting its most significant bit, which is a one (or "true") only when its terminal value is reached. When the target count is met (i.e., the event counter's terminal value is reached), the process outputs (at 4025) a true event signal, thus firing the trigger. The process determines (at 4035) whether to continue counting the occurrences of the event. If not, the process ends. In some embodiments, the process does not continue once the true event signal is out (at 4030). When the process is to continue, the process transitions back to step 4010. When the process determines (at 4025) that the counted event has not occurred the pre-determined number of times, the process transitions to step 4035.

In some embodiments, the process also outputs (not shown) a false event signal, when the process determines (at step 4025) that the event has not occurred the predetermined number of times. In some embodiments, steps 4010 through 4045 occur repeatedly (e.g., once every user cycle, once every sub-cycle, etc.) each time the event counter receives an input signal indicating whether a counted event has occurred.

While the process has been described in the context of using a single event counter in order to fire a trigger, other event counters may operate concurrently with, and/or in conjunction with, such an event counter. For instance, a second event counter may count the number of occurrences of a different event while the process uses a first event counter in determining whether to fire a trigger. In this way, not only can the first event counter be used to define a trigger, the second event counter can be used to collect other data (e.g., data that bears a logical relationship to the event that forms the trigger).

For instance, a first event counter may be preprogrammed with a count value of 1,024, and be configured to decrement (i.e., reduce the count value by 1) each time a counted event (e.g., a rising edge of a user signal) occurs. The trigger may be configured to fire once the first event counter has a count value of 0. While the first counter continuously (e.g., once every user cycle) receives values indicating whether the rising edge of the user signal has occurred, the second event counter receives a signal that indicates whether a different counted event (e.g., a user-defined "error" event) occurs. After the trigger fires (based on the first event counter), the second event counter can be read through the secondary circuit structure to indicate the number of user-defined "errors" that occurred during the 1,024 user cycles (i.e., the 1,024 occurrences of the rising edge of the user clock).

iii. Event Counter Use Scenario—Performance Monitoring

Figure 41:
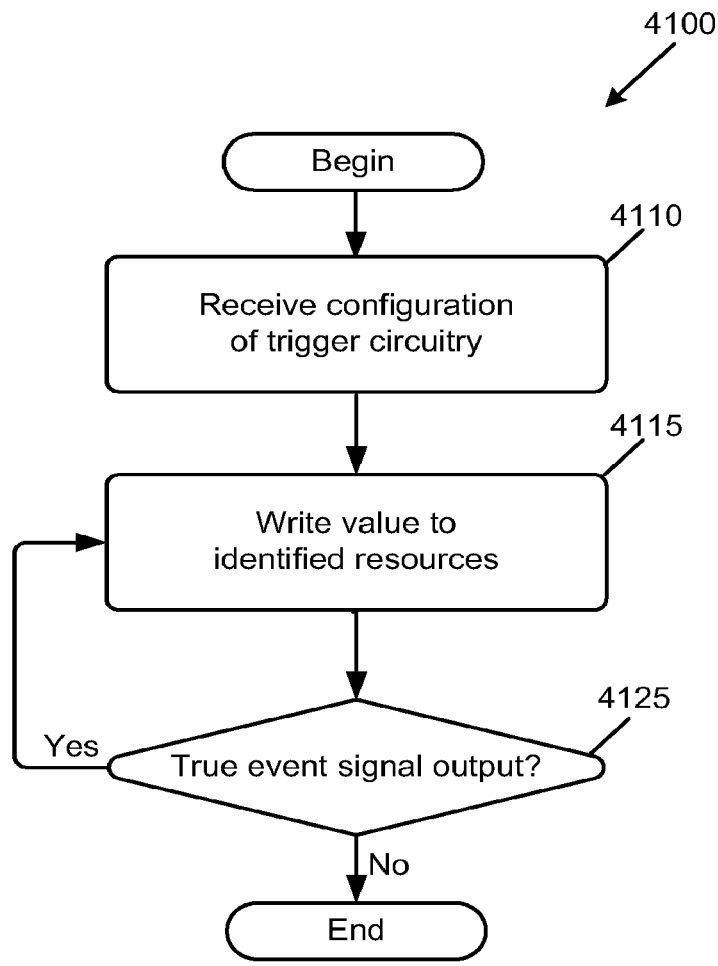
FIG. 41 illustrates a process of some embodiments that performs performance monitoring of a particular set of circuits.

Another example of a use of event counters is performance monitoring within the IC. FIG. 41 illustrates a process 4100 of some embodiments that a may be performed within an IC to monitor performance of a particular set of resources. The process receives (at 4110) a configuration of the trigger circuitry. This configuration specifies a set of resources to monitor. This configuration also configures the trigger circuit to use an event counter to indicate that a counted event occurs each time a set of values is written to the specified set of resources. The configuration of the event circuitry further includes the number of times to write a value to the set of resources. In some embodiments, this value is written to the initial count value register of an event counter of the trigger circuit, and then loaded into the event counter. In some embodiments, the difference between the specified number of times and the event counter's terminal value is written to the initial count value register of the event counter and then loaded into the event counter.

The process then writes (at 4115) a set of values to the identified resources. In some embodiments, the controller of the secondary circuit structure performs this writing by sending a Write packet along the bus of the secondary circuit structure. In some embodiments, a clock is started once the process begins to write (at 4115) these values. In some embodiments, this is an off-chip clock (i.e., a clock on a workstation connected to the IC through JTAG or some other interface). In some embodiments, this write is performed by sending a "Write" packet from the controller (described above) addressed to the set of circuits. Because each write is defined as a counted event, an event counter is incremented each time a set of values is written to the set of resources.

The process then determines (at 4125) whether the event counter has output a true event signal indicating that the predetermined number of writes has been performed. However, if more values are to be written (i.e., the process determines (at 4125) that a true event signal has not been output), the process transitions to back to step 4115. Once the writing is complete, the clock is stopped. Based on the number of writes that were performed and the elapsed time, the performance of the identified resources can be determined. Because the data is collected and reported through the secondary circuit structure, the performance data is reliable. In other words, the collecting and reporting of the performance data does not hinder or affect the performance of the resources themselves. While the above described process performs a series of writes, one skilled in the art would realize that performance monitoring could include other operations (e.g., read operations).

It should be apparent to one of ordinary skill in the art that the presence of multiple event counters in an IC introduces the possibility of multiple functional combinations not described in detail above. For instance, two event counters may be used to count the occurrence of two different, unrelated events that occur at two different, unrelated sets of circuits of the IC.

6. Trigger Output

The LUT 3190 supports sequential trigger functionality using the storage elements 3195. For example, a sequential trigger that specifies two sequential conditions that must be satisfied before firing of the trigger requires that the result of the first state be stored in the storage elements 3195. Then when the second state is computed using the above defined circuitry, the result of the first state stored in the storage elements 3195 may be used in evaluating the result of the second state in order to determine if the triggering event is satisfied. Accordingly, the storage elements 3195 track the state of one or more sequential triggers and the LUT 2490 evaluates the results to determine whether to continue to the next state, reset the sequential trigger, or fire the trigger.

f. Configuring the Trigger Circuit

Configuration of the trigger circuit is determined by the configuration of some or all of the above enumerated circuits of the trigger circuit. As such, each circuit performs a subset of operations for the trigger circuit based on configuration data that is supplied to each circuit. The user defined triggers are mapped to the corresponding configuration data that implement the specified debug or monitor functionality.

1. Configuration Values

In some embodiments, the edge-detection circuit is configured according to a pair of configuration data values. With reference to FIG. 32, the edge-detection circuit receives a first set of configuration data values 3220 that configures edge detection on the incoming deskewed input data and a second set of configuration data values 3230 that configures the reduction-OR function of the edge-detection circuit.

In some embodiments, the first set of configuration data values 3220 configure one of four operations to perform on an incoming bit of deskewed data. Therefore, for every bit, two configuration data values are used to determine the functionality. Table 1 below provides the configuration data values and the corresponding functionality:

TABLE 1

| Configuration data values 3220 and 3230 | Edge Detect Operation |
|---|---|
| 00 | Pass through the associated input bit such that the output bit is the same as the input bit. |
| 01 | Detect the rising edge of the associated input bit and output "1" if the rising edge is detected. |
| 10 | Detect the falling edge of the associated input bit and output "1" if the falling edge is detected. |
| 11 | Detect both rising and falling edge of the associated input bit and output "1" if transition is detected |

In some embodiments, the second set of configuration data values 3230 configure the reduction-OR functionality of the edge-detection circuit such that a configuration data value of "0" causes the circuit to pass through the edge detection output to the reduction-OR and a configuration data value of "1" drives a constant "0" so the associated input bit is masked out.

Table 2 below provides the configuration data values for configuring an ALU to perform one or more of the above described functions. In some embodiments, the operand B may be replaced with a constant. In this table, "PASSTHRU" represents selecting the operand at the input of a multiplexer and "IPASSTHRU" represents selecting the inverted values for the operand. The symbol mask_cin represents selecting the carry in signal, mask_A* represents selecting the A operand, and mask_B* represents selecting the B operand. Similarly, "CONST1" represents selecting the constant value of 1 and "CONST0" represents selecting the constant value of 0.

Additionally, the ALU stage column of Table 2 refers to the position that an ALU occupies in a chain of computation that requires multiple ALUs. For instance, when performing a 12-bit less than comparison operation, the first ALU performing the comparison on the most significant 4-bits is configured using the "last" configuration bits of the ALU stage of Table 2 (e.g., 10), the second ALU performing the comparison on the middle set of 4-bits is configured according to the "middle" configuration bits of the ALU stage of Table 2 (e.g., 00), and the third ALU performing the addition on the least significant 4-bits is configured according to the "1" configuration bits of the ALU stage of Table 2 (e.g., 00).

Such different configurations for the ALUs allow for the trigger circuit to perform different operations of different sizes. For example, when performing the less than comparison operation, the "last" ALU is configured differently than the "middle" and "1" ALU. The last ALU is configured differently because the last ALU receives the most significant bit of the operation. To perform the less than comparison operation, the last ALU compares the sign bits of the two operands (e.g., "A" and "B"). If the sign bits are different, then the larger operand can be distinguished from the smaller operand. However, the middle and "1" ALU do not receive the sign bit of the operands. Therefore, these ALUs are configured to perform two's complement subtraction.

TABLE 2

| Purpose | ALU stage | op[1:0] Select lines for MUX 3320 | Mask Settings Selecting Inputs for Multiplexers 3340 | | Description |
|---|---|---|---|---|---|
| Compute A < B | 1 | 00 | mask_cin | CONST1 | ALU computes A + (−B) + 1, |
| | | | mask_A* | PASSTHRU | i.e. subtract B from A in 2's |
| | | | mask_B* | IPASSTHRU | complement representation. This mode is required in A < B computation. |
| | middle | | mask_cin | PASSTHRU | ALU computes A + (−B) + cin. |
| | | | mask_A* | PASSTHRU | This mode is required in A < B |
| | | | mask_B* | IPASSTHRU | computation. |
| | last | 10 | mask_cin | PASSTHRU | Compute the result of A < B. |
| | | | mask_A* | PASSTHRU | |
| | | | mask_B* | IPASSTHRU | |
| Compute A > B | 1 | 00 | mask_cin | CONST1 | ALU computes B + (−A) + 1, |
| | | | mask_A* | IPASSTHRU | i.e. subtract A from B in 2's |
| | | | mask_B* | PASSTHRU | complement representation. This mode is required in A > B computation. |
| | middle | | mask_cin | PASSTHRU | ALU computes B + (−A) + cin. |
| | | | mask_A* | IPASSTHRU | This mode is required in A > B |
| | | | mask_B* | PASSTHRU | computation. |
| | last | 11 | mask_cin | PASSTHRU | Compute the result of A > B. |
| | | | mask_A* | PASSTHRU | |
| | | | mask_B* | IPASSTHRU | |
| Compute A == B | 1 | 01 | mask_cin | CONST1 | ALU computes A XNOR B |
| | | | mask_A* | PASSTHRU | |
| | | | mask_B* | PASSTHRU | |
| | middle or last | | mask_cin | PASSTHRU | Compute the result of A == B. |
| | | | mask_A* | PASSTHRU or CONST0 | Mask unused input bits to constant '0' if necessary. |
| | | | mask_B* | PASSTHRU or CONST0 | |

TABLE 4

| cfgEC32 | Event Counter Operation | Description |
|---|---|---|
| 0 | Pass through | Pass through the associated input bit, output is the same as the input. Counter is in idle. |
| 1 | Count occurrence | Count down at each occurrence of '1' on the input bit. Output 1 when counter expires. The initial value of the counter is loaded by a software component. |

Tables 3 and 4 below further provide the configuration data values for configuring an event counter in accordance with some embodiments. In Table 3 below, "x" represents a "do not care" bit and "c" represents an initial bit value.

In some embodiments, the second set of configuration data values 3230 configure the reduction-OR functionality of the edge-detection circuit such that a configuration data value of "0" causes the circuit to pass through the edge

TABLE 3

| cfgEC16[17:0] | Event Counter Operation | Description |
|---|---|---|
| 00xxxxxxxxxxxxxxxx | Pass through | Pass through the associated input bit, output is the same as the input. Counter is in idle. |
| 01cccccccccccccccc | Count occurrence | Count down at each occurrence of '1' on the input bit. Output 1 when counter expires. The initial value of the counter is defined by the lower 16 bits (bit c as shown on the left). |
| 10cccccccccccccccc | Count consecutive occurrence | Starting to count down at the rising edge of the input bit. Continue counting down at each consecutive '1's on the input bit. Reset to the initial value at any falling edge of the input bit. Output 1 when counter expires. The initial value of the counter is defined by the lower 16 bits (bit c as shown on the left). This operation mode detects consecutive matches. |
| 11xxxxxxxxxxxxxxxx | Reserved | Reserved | detection output to the reduction-OR and a configuration data value of "1" drives a constant "0" so the associated input bit is masked out.

2. Usage Examples

Several examples will now be provided to illustrate how a triggering event is created by configuring the trigger circuit. It should be apparent to one of ordinary skill in the art these examples are not intended to provide a comprehensive enumeration of all possible configurations of the trigger circuit, but rather a concise set of commonly used configurations.

i. 64-Bit Arithmetic Operation with a Constant Value

Figure 42:
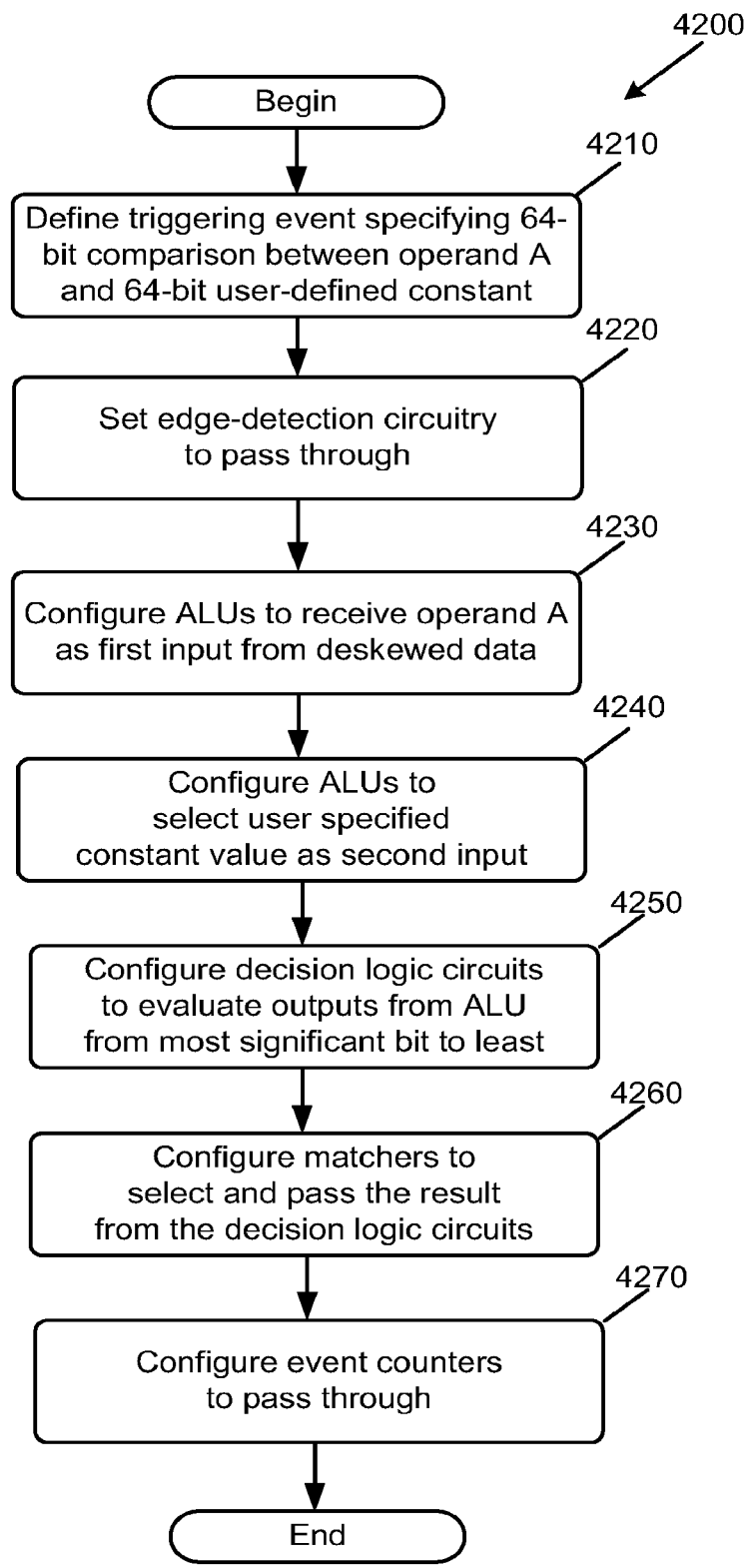
FIGS. 42-44 illustrate several usage examples of the trigger circuitry of some embodiments.

One such configuration of the trigger circuit is to perform a 64-bit arithmetic comparison between a 64-bit signed operand A and a 64-bit user specified constant. FIG. 42 presents a process 4200 for configuring a trigger circuit of some embodiments to perform a 64-bit arithmetic comparison between a 64-bit signed operand A and a 64-bit user specified constant.

The process 4200 begins by defining (at 4210) a triggering event specifying the comparison operation as the triggering event. The process evaluates the triggering event and maps the triggering event to the trigger circuit of some embodiments by specifying the various configuration data and opcodes needed to configure the trigger circuit to perform the specified triggering event. Specifically, the process determines that the 64-bit arithmetic operation does not require the use of the edge-detection circuitry. Accordingly, the process sets (at 4220) the edge-detection circuitry to pass through data received on its inputs to its outputs.

The operation does however require the use of 16 4-bit ALUs as half of the bits passing over the deskew lines (e.g., 64 of the 128 bits) are allocated to receiving the operand A value. It should be apparent to one of ordinary skill in the art that the remaining 64-bits passing over the deskew lines may be ignored or used to perform another operation in the trigger circuit in parallel with the 64-bit comparison operation. This is due to the fact that the 64-bit constant value is programmed directly into the ALUs and does not need to pass over the deskew lines.

The process then configures the inputs of the ALUs. The operand A is passed to the ALUs by configuring (at 4230) the mask multiplexers for the first input operand of the ALUs to PASSTHRU. The constant is passed to the ALUs by configuring (at 4240) the mask multiplexers for the second input operand of the ALUs to feed one of two constant bit values (e.g., "0" or "1") as defined by the received triggering event.

The process then configures (at 4250) the decision logic hierarchy to receive and reduce the outputs of the ALUs. For example, the decision logic performs an equality or inequality operation over the sign bits or equality bits resulting from the ALUs. The reduced set of results is then passed to the LUT in order to determine whether the triggering event is satisfied and therefore should fire.

In order to do so, the process configures (at 4260) the matchers to select the appropriate result signal from the decision logic circuitry. The event counters, which are not needed for this arithmetic operation, are set (at 4270) to pass through causing the result to pass to the LUT. The LUT then determines whether to assert or fire the trigger. For example, when the triggering event is configured to fire when the 64-bit operand is equal to the 64-bit constant value, the LUT receives the equality value from the decision logic hierarchy. The equality value of the decision logic hierarchy will have compared the equality values from each of the ALUs. Therefore, if all of the 4-bit comparison operations performed by each ALU results in a "1" or true value, then the single equality bit output from the decision logic hierarchy will also be "1" or true causing the LUT to assert the trigger signal. It should be apparent to one of ordinary skill in the art that the process 4200 of FIG. 42 is adaptable to configure the trigger circuit to also perform the below enumerated triggering events and other triggering events.

ii. 32-Bit Arithmetic Operation with Non-Constant Values

In some embodiments, the trigger circuit can be configured to perform a 32-bit arithmetic operation (e.g., A<B, etc.) with two non-constant values. Such an operation also consumes all 64 inputs from the deskew unit and is thus configured similar to the 64-bit arithmetic operation above. However, this operation only requires eight of the ALUs to perform the arithmetic operation. Accordingly, eight ALUs are configured to pass through the A and B operand received on its inputs and to perform the user specified arithmetic operation. The decision logic then receives the results from each of the ALUs. The decision logic is configured to reduce the results from each of the eight ALUs in order to derive a set of values from which the LUT determines whether or not to fire the trigger.

iii. Multiple Simultaneous Operations

In some embodiments, the trigger circuit can be configured to perform multiple arithmetic operations synchronously. This synchronous operational allows for users to define complex nested triggering events that execute simultaneously. Additionally, the triggering event may be specified with variable bit-length or bit-width operations where a first operation is performed with inputs of a first bit-length and a second operation is performed with inputs of a second bit-length with the first and second bit-lengths being different.

Figure 43:
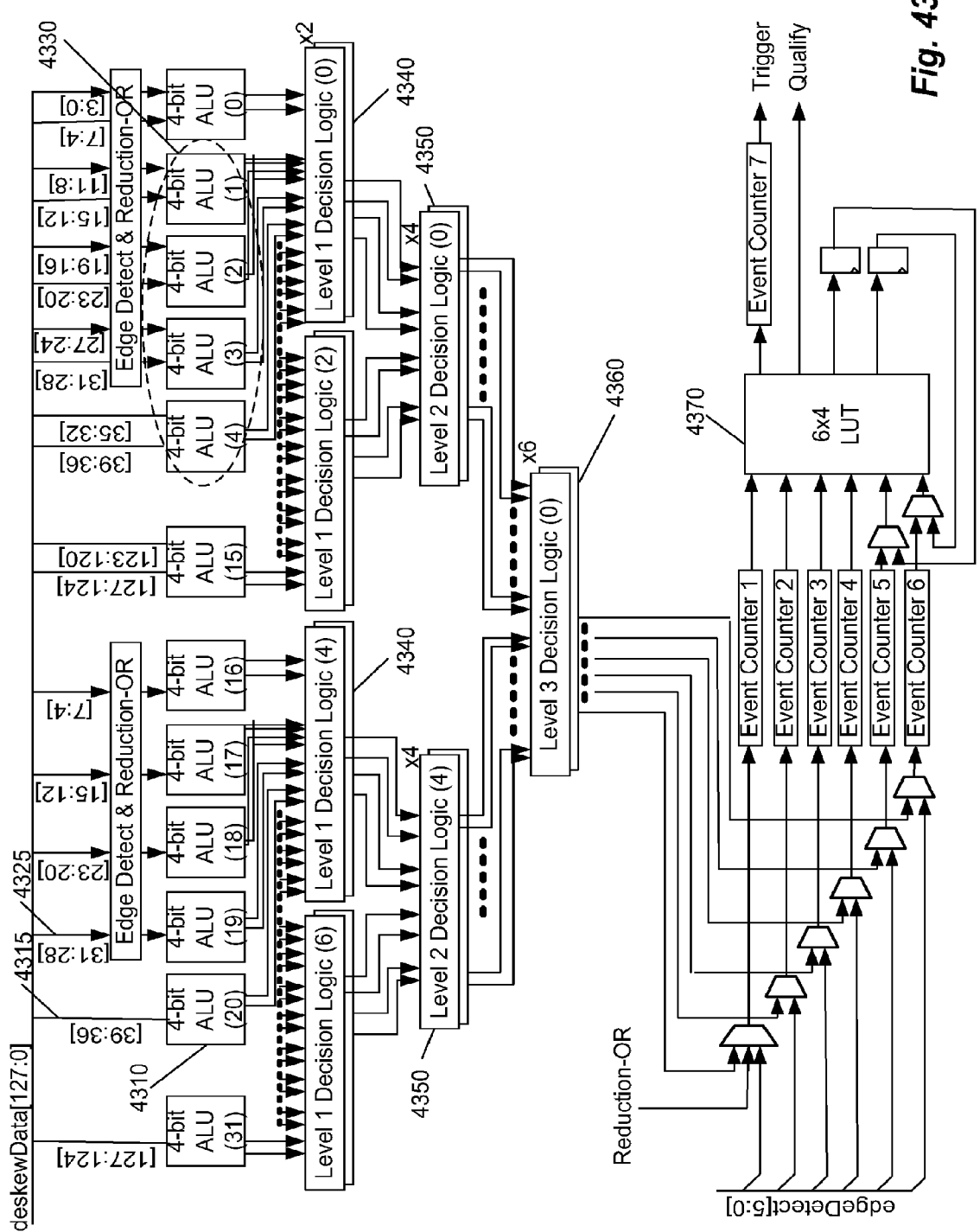

FIG. 43 presents a configuration for the trigger circuit of some embodiments that performs a triggering event defined to perform (1) an equivalence comparison between a G-bit operand ("A") and a constant ("B") (i.e., A=B) ANDing the result with (2) an equivalence comparison between a 16-bit operand ("C") and another 16-bit operand ("D") (i.e., C=D) and ORing the result with (3) an equivalence comparison between a write_enable signal and a constant value of "1" (i.e., write_enable=1).

As shown, the first comparison operation (i.e., A=B) requires two ALUs 4310 and 4320 that are configured to compare operand A against constant B. Specifically, two bit lines for the most significant bits 4315 of the A operand are passed into the ALU 4310 and four bit lines for the least significant bits 4325 of the A operand are passed into the ALU 4320 by setting the edge-detection circuits to pass through mode such that the deskewed data arrives to the ALU 4320. The ALUs 4310 and 4320 are further configured to internally generate the B constant as the second input for the first comparison operation.

The second comparison operation (i.e., C=D) requires four ALUs to compare C against D. Accordingly, four ALUs 4330 are configured to accept as inputs the deskewed operands C and D from the streaming bitlines.

The third comparison operation (i.e., write_enable=1), which compares only one-bit values, is configured using one ALU that is not used for the first comparison operation or the second comparison operation. The ALU is configured such that the input masks propagate as an input the one-bit data value (i.e., write_enable) from the streaming data and a constant "1".

The results of each of the comparison operations must still be AND'ed and OR'ed together in order to determine whether the triggering event should fire. Accordingly, the first level of the decision logic hierarchy 4340 identifies and reduces the result of each individual operation into single bit values. The second level of the decision logic hierarchy 4350 is then configured to perform an equality operation of the result of the first comparison (i.e., A=B) and the second comparison (i.e., C=D) which effectively results in the AND operation between the first comparison and second comparison being performed. The result is then sent to the third level of the decision logic hierarchy along with the result from the third comparison operation (i.e., write_enable=1). The third level of the decision logic hierarchy then performs an inequality operation on its inputs to effectively perform the OR operation. The result then passes to the LUT in order to determine whether to fire the trigger.

iv. Multiple Comparisons Against Single Operand

In some embodiments, the trigger circuit can be configured to specify a triggering event that fires when a 16-bit address is between two user-defined bounds and when a write_enable signal has a value of "1". Such a triggering event requires two comparisons: a first comparison to determine whether the address is greater or equal to some first value and a second comparison to determine whether the address is less than or equal to some second value. This triggering event therefore requires two chains of ALUs. The address signal is brought to both ALU chains with each ALU chain performing a comparison of the address value against a different comparison value. As before the chaining of the multiple ALUs is performed using the decision logic and the final operation of ANDing together the output of the two ALU chains and the write_enable signal to form the final trigger output is performed by the LUT.

v. Sequential Trigger

Figure 44:
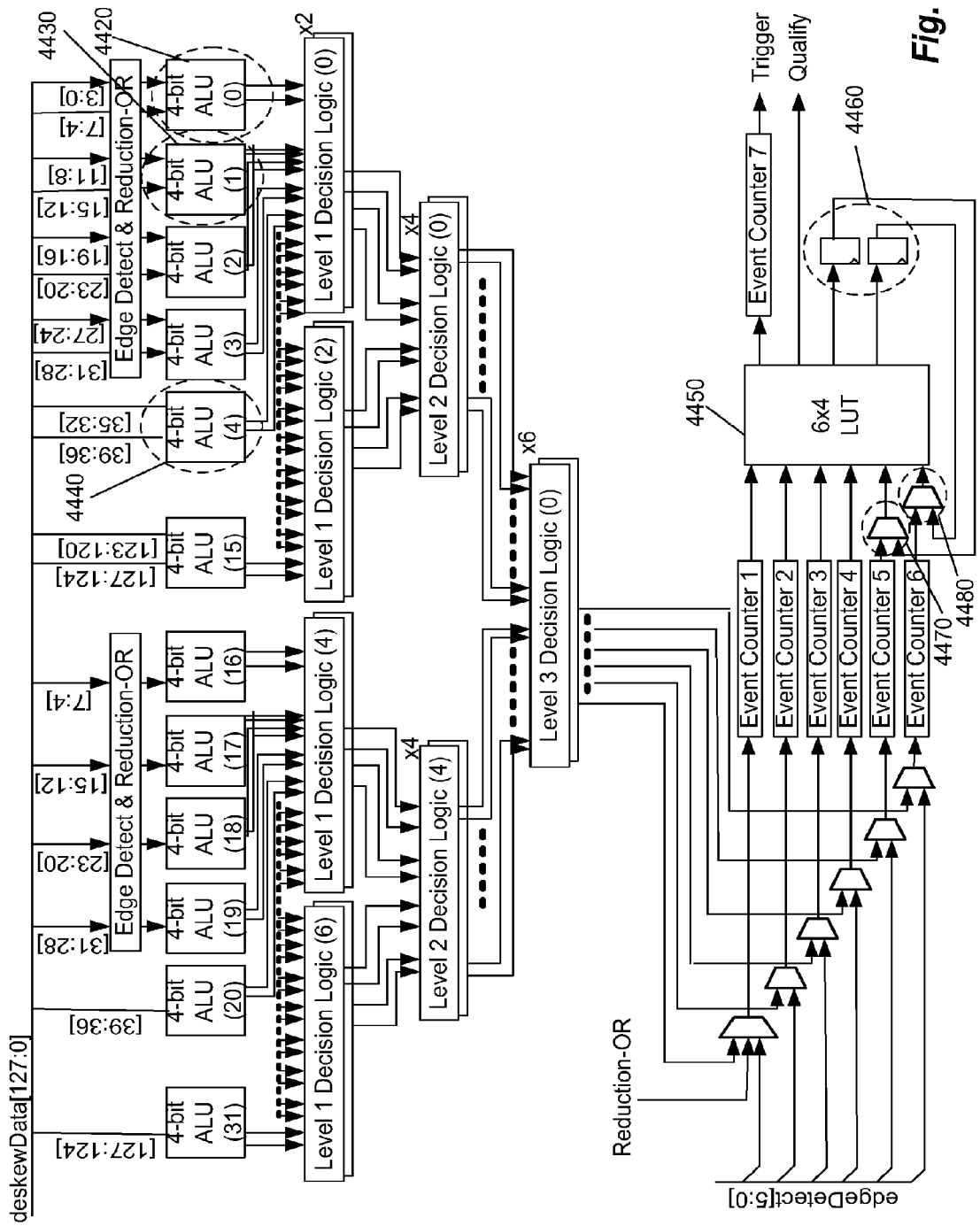

In some embodiments, the trigger circuit can be configured to specify a sequential triggering event that fires when the right sequence of operations synchronously occurs in a three-state state machine FIG. 44 presents a configuration of the trigger circuit 4410 for performing a three-state sequential triggering event. Specifically, the configuration is for performing a triggering event: IF constant A is less than or equal to operand B THEN IF operand A is equal to operand B THEN IF operand A is less than operand B THEN TRIGGER. As such, the state machine starts in the idle state that constantly checks to see if the B operand exceeds a first constant value, A. After this state is satisfied, the trigger circuit acting as a state machine advances to the next state to perform an equality comparison to determine if operand A is equal to an operand B. If this condition is false, the trigger circuit reverts back to the idle state, otherwise the trigger circuit advances to the next and final state to determine if a next operand A is less than a next operand B. If this final condition is satisfied, then the trigger circuit fires. Otherwise, the trigger circuit returns back to the idle state.

In some embodiments, the trigger circuit 4410 executes the sequential trigger through a single configuration. Assuming each of the operations is a 4-bit operation and each of the operands is a 4-bit operand, then the trigger circuit 4410 of some embodiments is configured so that a first ALU 4420 performs the first comparison operation (e.g., A<=B) for the first state of the state machine, a second ALU 4430 performs the second comparison operation (e.g., A=B) for the second state of the state machine, and a third ALU 4440 performs the third comparison operation (e.g., A<B) for the third state of the state machine. It should be apparent to one of ordinary skill in the art that the trigger circuit of some embodiments is reconfigurable such that the ALUs are reconfigured after each state of the state machine is satisfied in order to perform a different operation for a next state of the state machine.

The result of the ALU operations pass to the LUT 4450 that determines which, if any, state of the state machine has been satisfied. The LUT 4450 maintains the current state of the state machine using the storage elements 4460. The storage elements 4460 act as the state registers for this state machine to allow the LUT 4470 to compute the final stage of the triggering event that determines whether to fire the trigger. In some embodiments, the storage elements 4460 include a pair of flip-flops that store a pair of bits used by the trigger circuit to implement up to a four state state machine (e.g., 00=idle state, 01=first state, 10=second state, 11 final state). Therefore, at each clock cycle of trigger circuit operation, the LUT 4450 receives output logic from one or more ALUs through the decision logic hierarchy and state logic from the storage elements 4460.

As shown in FIG. 44, the LUT 4450 receives six inputs. The trigger circuit 4410 is configurable such that the LUT 4450 receives five bits of output logic and only one bit of state logic by configuring multiplexer 4470 to pass an output logic value from the decision logic hierarchy and by configuring multiplexer 4480 to pass a state logic value from one of the storage elements 4460. In such a configuration, the trigger circuit 4410 is a two state state machine. The trigger circuit 4410 is also configurable such that the LUT 4450 receives four bits of output logic and two bits of state logic by configuring both multiplexers 4470 and 4480 to pass state logic values from the storage elements 4460. In such a configuration, the trigger circuit 4410 performs up to a four state state machine. However, it should be apparent to one of ordinary skill in the art that other configurations are possible by incorporating an additional storage element in the set of storage elements 4480 that selectively provides input to the LUT 4450. Moreover, it should be apparent to one of ordinary skill in the art that the LUT 4450 is a general purpose logic element that is configurable to perform any desired logic operation based on configuration data sets provided to the LUT 4450 during runtime operation of the trigger circuit 4410.

vi. Trigger on Rising Edge of any 16 User-Selected Signals

As noted above, the trigger circuit is configurable to fire when a rising edge is detected. The following specifies the configuration for one such triggering event that fires whenever one of 16 user selected signals is detected to have a rising edge. Specifically, the rising edges are detected by the edge-detection circuitry with the reduction-OR function enabled. The reduction-OR output of edge-detection circuit is routed through the multiplexers to the LUT that determines whether to fire the trigger output signal. In some such configurations, none of the ALUs are consumed. Accordingly, the user signals can further pass to those ALUs to generate additional trigger conditions.

vii. Trigger on 1024 Occurrences of a Rising Edge on any 16 User-Selected Signals and Collect the Counts of a Particular User Signal In some embodiments, the event counters are used in conjunction with other circuits of the trigger circuit to specify complex triggering events. In this manner, a triggering event may be specified that fires upon 1024 occurrences of a rising edge on any of 16 user selected signals.

Additionally, a second triggering event may simultaneously be configured to count the number of occurrences of an error signal. In some such configurations, a first event counter is programmed with an initial value of 1024. An occurrence of any rising edge on the 16 user inputs detected by the edge-detection circuitry will decrease the count of first event counter by 1. The trigger will fire when the counter reaches 0. Before the trigger fires however, a particular user signal is routed to an ALU to compare the value of the particular user signal with a constant "1". A second event counter then counts to record the number of instances the particular user signal had a "1" during the particular interval in which 1024 occurrences of a rising edge was detected on any of the 16 user signals.

VI. Debugging Tool with Hardware and Software Components

A. Overview

The above-described embodiments of hardware and software, in addition to a software monitoring tool, as further described below in Section IX, provide a fully interactive debugging tool that allows users to inspect and debug their designs as they run in real time. Specifically, the debugging tool of some embodiments includes the hardware mentioned above (e.g., an IC that includes the secondary circuit structure described), a desktop computer running the software component of the debugging tool, and an interface (e.g., a cable) that connects the two. In some embodiments, the desktop computer is able to communicate with the IC over a JTAG connection, parallel connection, or some other type of communications methodology.

Because the debug circuitry is built into the IC, the debugging tool is always available. In other words, users do not need to insert anything into their designs, nor do they need to plan ahead in order to use the debugging tool. Circuit function and timing are completely unaffected by the debugging process, and users can debug their circuits at the maximum clock rate. The debugging tool does not affect the capacity or utilization of the IC in any way. Users can use all of the debug features, even if the IC is 100% utilized. The debugging tool has no impact on the placement and routing of user circuits. The debugging tool provides a completely interactive debugging experience. Users can immediately view any signal value at any time with no waiting. In some embodiments, the debugging tool can be used to debug legacy designs, early-stage designs, and designs that are running in-system.

In some embodiments, the software component operates transparently with the standard synthesis, placement, and routing of the IC. During synthesis, placement, and routing, a user design is mapped to physical circuits of the IC and a configuration bit stream is generated to configure the circuits of the IC to implement the user design. Once the user design has been compiled and a configuration bit-stream generated, this mapping is stored in a mapping database. The software component accesses all information regarding the user design from this mapping database. The mapping database contains all of the information necessary for the debugging tool to debug the user circuit, including data that links user names (i.e., names of circuits of the user design that are represented as code, such as RTL) of user circuits to physical sites on the IC. Users can configure the IC using the software component via an interface (e.g., JTAG or some other interface) that connects the IC to an external resource (e.g., a computer).

The debugging tool has several modes of operation, including active mode, passive mode, low-level mode, and prototyping mode. In low-level mode, the debugging tool performs low-level tasks useful for chip bring-up and debug. In prototyping mode, an IC is used with a PCI card to control user I/O and checkpoint user designs. In active mode, which is further described below, a user may "step" circuit clocks and/or modify signal values. In passive mode, which is also further described below, circuit activity, including circuit data and run-time information, is automatically monitored in real-time (e.g., stored in an on-chip memory, such as a trace buffer, for later upload and analysis).

B. Active Mode

As mentioned above, active mode involves a user actively, or "intrusively," monitoring the operation of an IC. In active mode, a user may debug an IC by starting and stopping clocks, and by inspecting and modifying signal values in the IC. There is no limit to the number of signals that may be viewed by a user.

In some embodiments, in active mode, some or all memories (e.g., register files, MRAMs, LRAMs, UDS storage elements, etc.) of the IC are accessible (i.e., readable and/or writeable) via the secondary circuit structure. In some embodiments, it is possible to restore memory state back to its original state (i.e., prior to active mode debugging by the debugging tool of some embodiments). "Memory state" includes memory contents, output registers, FIFO state (e.g., how full FIFO queues are), etc. In some embodiments, any memory state that is visible to the user is restorable after accessing (e.g., reading and/or writing) the memories of the IC via the secondary circuit structure. In some embodiments, before altering values in the memories of the IC, the values are read through the secondary circuit structure and stored in a location external to the IC (e.g., a computer connected to the IC through a JTAG port or some other communications interface). These values can be written back to the memories from which they were read, if the user so desires. In this way, the memory states can be restored after accessing.

Active mode is similar to software debugging, in which users perform debugging operations such as stepping programs, inspecting variables, etc. However, unlike software debuggers, which allow programmers to step their programs one source line at a time, active mode of the debugging tool of some embodiments supports "clock stepping." Some or all clocks of the IC can be interactively single-stepped or multi-stepped. In other words, some or all clocks of the IC can be stepped by one or more clock cycles. In some embodiments, a clock may be multi-stepped by $2^n$ cycles, where n is the number of bits of counters that are used to count clock cycles. In some embodiments, n is 16, while in other embodiments, n is a larger number. Multi-stepping occurs at the maximum user frequency in some embodiments.

Clock stepping is an effective debugging technique for directly testing a user circuit. In a typical debugging session using clock stepping, a user advances the state of the circuit by stepping the clock some number of cycles and then verifies the functional correctness by reading various signal values (e.g., state-machine values). Users can also force the circuit into specific states by writing values directly into UDS elements (e.g., state registers, memories, etc.). In some embodiments, this reading and writing is performed through the secondary circuit structure. Clock stepping accelerates the overall debugging process by skipping previously verified machine sequences or those that are irrelevant to the current debugging session.

Clock stepping is enabled by special circuitry (described below) contained in the clock resources of the IC of some embodiments. Clocking resources in an IC may be divided into a fixed number of clock domains. Such clocking resources are described in U.S. Pat. No. 7,342,415, issued on Mar. 11, 2008, which is herein incorporated by reference. However, clocking resources will be briefly described below.

Figure 45:
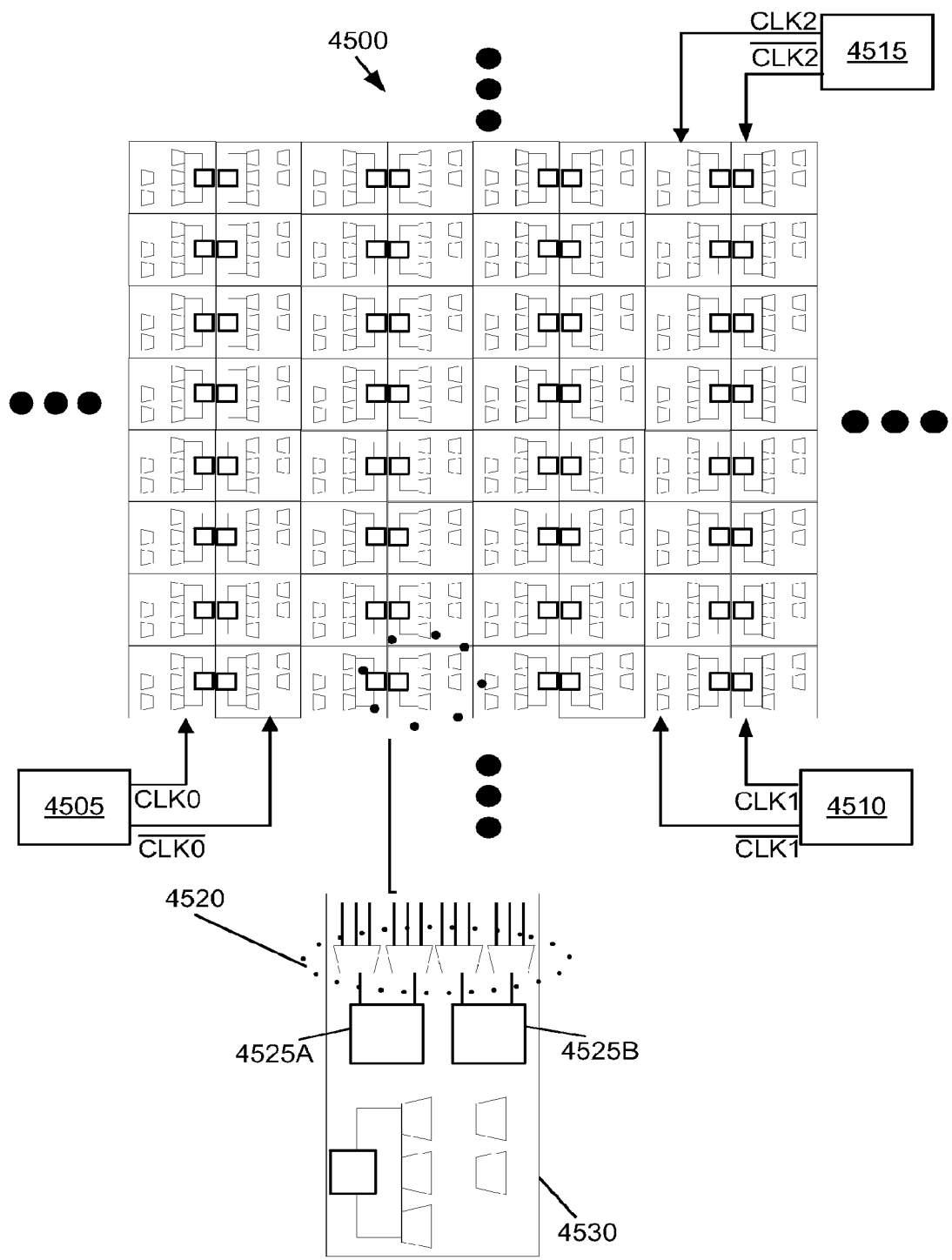
FIG. 45 illustrates global and local clock resources within an IC.

FIG. 45 illustrates three different globally distributed clock generators 4505, 4510, and 4515 of three different clock domains of an IC 4500 that generate three different clocks based on three different clock signals. In some embodiments, one or more of the globally distributed clock generators 4505, 4510, and 4515 are located on the IC 4500. In some embodiments, one or more of the globally distributed clock generators 4505, 4510, and 4515 are located off of the IC 4500. One skilled in the art would recognize that, in some embodiments, the number of globally distributed clocks may vary (e.g., more or less than three).

In some embodiments, one or more tiles each include a set of clock circuitry, as illustrated by exploded view 4530. In some embodiments, each tile includes two different local sub-cycle clock signal generators 4525A and 4525B. In some embodiments, one or more tiles operate based on the sub-cycle clock generated by the corresponding local sub-cycle clock signal generators.

As shown in FIG. 45, the local sub-cycle signal generators within a configurable tile are preceded by a set of multiplexers 4520 that route one of the globally distributed clocks and its complement to each local sub-cycle signal generator. The local sub-cycle signal generators in the tiles then generate their local clocks based on the received global clock signals CLK0-2. Having two different local sub-cycle signal generators 4725A and 4525B for each tile allows circuits (e.g., RMUXs) within a tile to operate on different clock domains than other circuits within the tile (e.g., IMUXs and the LUTs of the same tile). One benefit of such a scheme is that it allows the RMUXs of a tile to be used to route signals that belong to different clock domains than the logic circuits of the tile.

Specialized circuitry of some embodiments (described below) within a domain's clock generator allows a user to directly control how clock signals of that domain are generated. A user may perform many different types of operations with regard to a clock. For instance, a user can: 1) step the clock one clock-edge at a time, 2) enable the clock for multiple edges (at the circuit's maximum frequency in some embodiments), and/or 3) toggle the resets associated with each clock domain.

Some embodiments allow a user to toggle one or more clocks at a time. In some embodiments, a global clock-enable signal toggles multiple clocks within a clock domain. In some embodiments, the global clock-enable signal toggles multiple clocks in multiple clock domains of the IC. In some embodiments, the global clock-enable signal toggles all of the clocks of the IC. The global clock-enable signal of some embodiments also controls some or all clockable user components (e.g., flip-flops, FIFOs, clocked I/O circuits, etc.) of the IC so that these user components can be stopped and started. Some embodiments implement a global clock-enable signal in concert with clock-enable control counters tied to one or more clock control circuits of the IC (as further described below). In some embodiments, this clock-enable signal is asserted through a JTAG port or some other communications port.

1. On-Chip Clock-Enable Control Counters

Figure 46:
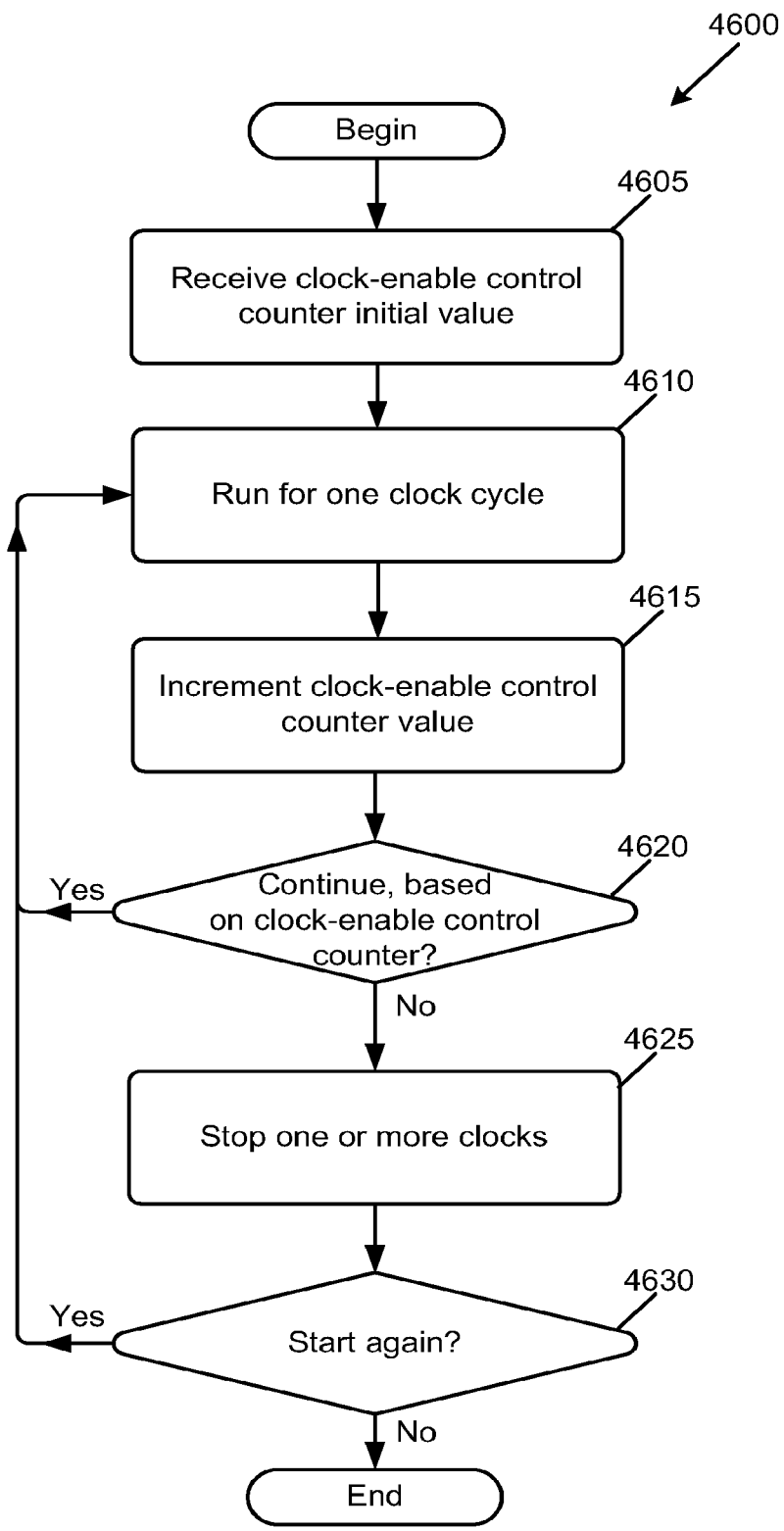
FIG. 46 illustrates a process of clock stepping in active mode using clock-enable control counters.

FIG. 46 illustrates a process 4600 of clock stepping using clock-enable control counters, as further described below. The process receives (at 4605) the clock-enable control counter value. This value is stored in a clock control counter, which is further described below. In some embodiments, this value is set to the number of clock cycles specified by the user. In some embodiments, the specified number of clock cycles is a number of user cycles. This number may be set to any number of clock cycles (e.g., a single cycle, 1,000 cycles, millions of cycles, etc.), depending on the width of the counter (i.e., an n-bit counter may count up to $2^n$).

Once initialized, the process starts the clock and runs (at 4610) the IC. At each clock cycle, the process increments (at 4615) the clock-enable control counter. In some embodiments, the clock-enable control counter counts down, while in some embodiments, the clock-enable control counter counts up. The process then determines (at 4620) whether the IC has run the specified number of clock cycles (e.g., the value of the clock-enable control counter is zero, if counting down). If not, the process transitions back to step 4610 and continues running. However, if the specified number of clock cycles has been run, the process stops (at 4625) the IC.

In some embodiments, this stopping of the IC is done by using a global clock-enable signal. Once the IC is stopped, values of circuits within the IC may be read. In some embodiments, these values are read through the secondary circuit structure. The process then determines (at 4630) whether to start again. This determination may be made by receiving a global clock-enable signal indicating that the IC should start again. This global clock-enable signal enables the clocks of the IC. When the process determines (at 4630) that it should not start again, the process ends.

2. Chained Clock Control Circuits

Figure 47:
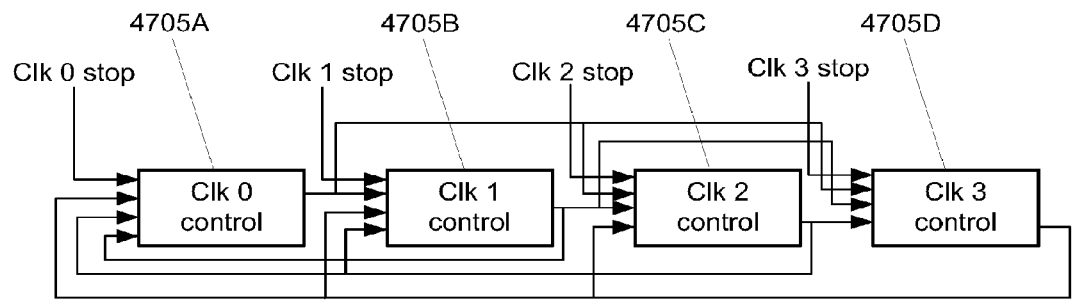
FIG. 47 illustrates chained clock control circuits of some embodiments.

In some embodiments, a global clock-enable signal is implemented by chaining multiple clock control circuits together, so that a signal sent to one clock control circuit can control multiple other clock control circuits. FIG. 47 is a conceptual illustration of four such chained clock control circuits 4705A-D. Each clock control circuit 4705A-D receives several control signals. These control signals include a clock stop signal that corresponds to the clock control circuit's 4705A-D respective clock. The control signals of each clock control circuit also include the control outputs of each of the other clock control circuits that are chained to the clock control circuit. In some embodiments, these clock stop signals are generated within the IC (e.g., they may be the output of a trigger circuit or event counter). In some embodiments, these clock stop signals are generated outside of the IC. In some such embodiments, the clock stop signals are provided to the IC through an interface, such as JTAG.

Figure 48:
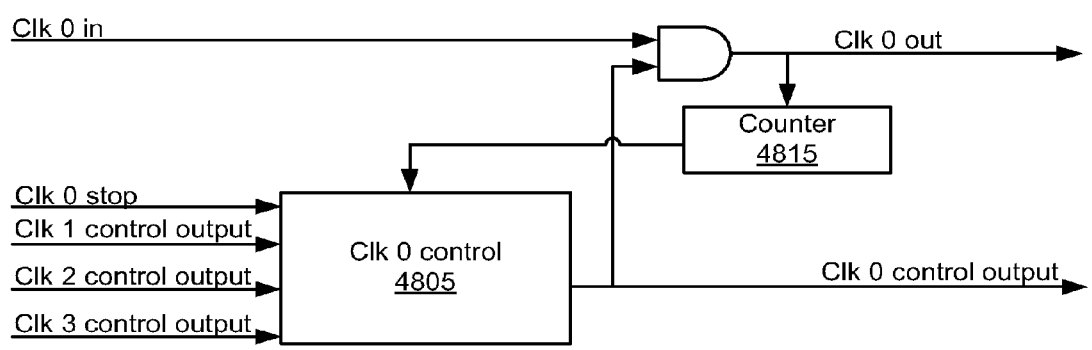
FIG. 48 illustrates a clock control circuit in accordance with some embodiments of the invention.

FIG. 48 illustrates a particular clock control circuit 4805 for clock "Clk 0" and a clock-enable control counter 4815. In some embodiments, the clock control circuit 4805 is an example of one of the clock control circuits mentioned above with respect to FIG. 47 (e.g., clock 0 control circuit 4705A). The clock control circuit 4805 receives, as input, the control signals mentioned above (i.e., a stop signal corresponding to its own clock as well as the control outputs of the other clock control circuits 4705B-D). The clock control circuit 4805 also receives, as input, a signal from the clock control counter 4815.

In some embodiments, the clock control counter 4815 is similar to the event counters described above, except that it counts clock edges (e.g, rising edge, falling edge, or both) instead of events. Additionally, like event counters, the clock control counter 4815 counts whether a predetermined number of clock signals have occurred, and outputs a true signal when the predetermined number of clock signals have occurred. In some embodiments, this number is configurable in a similar way to that of the event counters (i.e., a value is loaded from an initial count register, where the value is the difference between the counter's terminal value and the number of times the counter 4815 must count before indicating that the terminal value has been reached). In some embodiments, although not shown, the counter 4815 provides its output to one or more clock control circuits of another clock domain. In this way, other clock control circuits can determine when the counter 4815 has reached a predetermined value. In some embodiments, this value is loaded into the clock control counter 4815 during configuration of the IC. In this way, a clock may be stepped anywhere between one ("single stepped") and $2^n-1$ ("multi-stepped") clock cycles, where n is the number of bits of the value stored by the clock control counter 4815.

Based on its input signals (i.e., Clk 0-3 control output signals and clock control counter 4815 output), the clock control circuit 4805 makes a determination as to whether to stop the clock Clk 0. In some embodiments, this determination is based on logic that is predetermined by a user. In some embodiments, this logic is based on configuration data, and thus can be any type of logic. For instance, in some embodiments, the determination is based on OR logic that outputs a true signal (i.e., a signal that indicates that the clock should be disabled) when any of its inputs are true. In some embodiments, the determination is based on AND logic that outputs a true signal when all of its inputs are true. In some embodiments, the clock control circuit 4705A includes one or more configurable logic circuits (e.g., one or more configurable LUTs) for making the determination. In some embodiments, the clock control circuit 4805 includes reconfigurable logic circuits (e.g., sub-cycle reconfigurable logic circuits) that can reconfigure while the IC is running.

The output of the clock control circuit 4805, is provided as input to other clock control circuits (e.g., clock control circuits 4705B-D of FIG. 47). The output is also ANDed with the clock signal for its corresponding clock (i.e., "Clk 0 in"). If the clock control circuit's 4805 output is false, then the clock signal for Clk 0 is always false, and therefore the clock has no edges (i.e., the clock is "disabled"). In other words, the clock is "stopped." Thus, because of the chained clock control signals, the stoppage of one clock may configurably control the stoppage of other clocks.

Similarly, through such chaining, the clock control circuit 4805 is capable of starting one or more clocks. When the clock control circuit's 4805 output is true, the clock Clk 0 "runs," (i.e., Clk 0 out is the same as Clk 0 in). The chaining of multiple clock control circuits (as shown in FIG. 47), is useful for starting multiple clocks, as one clock's timing may depend on another clock in some embodiments. Thus, for instance, if Clk 1 needs Clk 0 to start first, but does not depend on a count value or any other clock, the clock control circuit 4705B that corresponds to Clk 1 will be configured to output a true Clk 1 control output signal if the Clk 0 control output signal is true. As another example, one clock control circuit might run until its clock control counter reaches a terminal value, and then causes (1) a second clock to stop and (2) a third clock to start. One skilled in the art would recognize that the preceding examples were only two of many combinations of conditions that could be specified for stopping and starting clocks of the IC using the circuitry described above with respect to FIGS. 47 and 48.

C. Passive Mode

When operating in passive mode, the debugging tool of some embodiments makes use of the secondary circuit structure. In some embodiments, to debug using passive mode, users specify, using register transfer language ("RTL"), which user signals they want to capture during IC operation and configure the trigger function that controls when, and how, to capture the specified signals. During operation, the on-chip debug circuitry (e.g., the secondary circuit structure, the transport network, etc.) passively captures these signals in real time in a dedicated on-chip memory (e.g., a trace buffer). Afterwards, these captured signal values are uploaded to the workstation running the software component of the debugging tool for processing, analysis, and inspection. As described below, in addition to, or in lieu of capturing the signals in an on-chip memory, these signals may be streamed off-chip. In some embodiments, some or all user state elements (e.g., configurable storage elements, UDS elements, etc.) are accessible through the secondary circuit structure.

Figure 49:
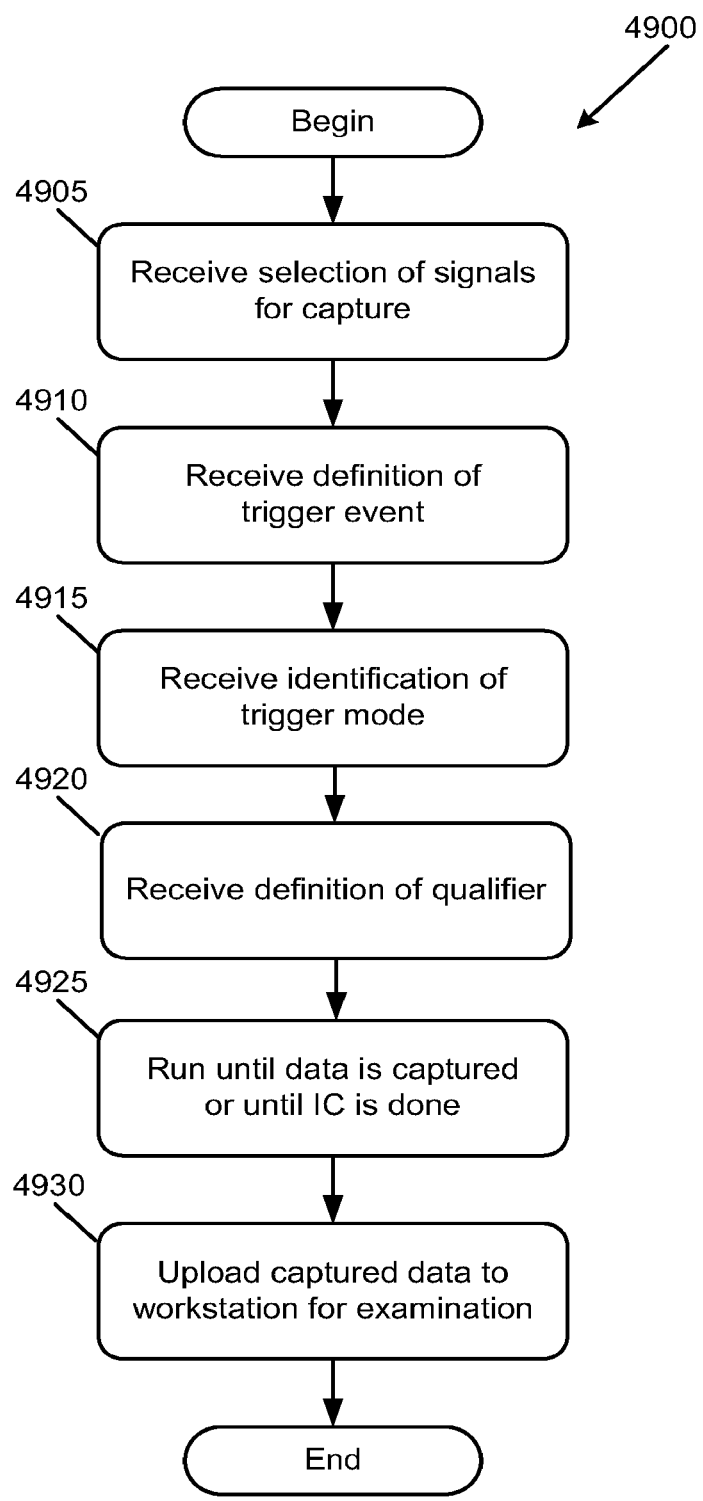
FIG. 49 illustrates a process of debugging an IC in passive mode.

FIG. 49 illustrates a process 4900 of debugging an IC in passive mode. A user may choose to perform this process 4900 when the user discovers an anomaly in the operation of the IC, and wishes to debug the IC in order to eliminate the anomaly. An example of such an anomaly may be an incorrect value being written to a specific user-memory location.

Once the process 4900 starts, the process 4900 receives a selection (at 4905) of a set of user signals for capture. This set of user signals may be a set of user signals that are relevant to determining the cause of the anomaly (e.g., the IC writing an incorrect value to a specific user-memory location). As mentioned above, a user may select these signals by their RTL designations in some embodiments. The process 4900 then receives (at 4910) a definition of a trigger event, which fires when the trigger event becomes true. In this example, the user-specified trigger fires when the IC writes any value to the specified user-memory location.

The process 4900 then receives (at 4915) an identification of a trigger mode. As described above, the trigger mode controls how much data before and/or after the trigger event an on-chip memory (e.g., a trace buffer) captures. The process 4900 then receives (at 4920) a definition of a qualifier, which, as described above, filters the values that are captured once the trigger fires.

The process then runs (at 4925) the IC until the specified data is captured into the on-chip memory, or until the IC stops running. Next, the process 4900 uploads (at 4930), via JTAG or some other communications port, the captured data for examination by the user. The examination of the uploaded data ideally would give insight into why the anomaly occurred (e.g., why the incorrect value was written to memory).

Some or all logic tiles of the IC of some embodiments contain interface circuitry (as described above) that is connected to the secondary circuit structure and is dedicated to the task of continuously streaming configured signal values in real time to the secondary circuit structure. In some embodiments, user signals are streamed out directly to the secondary circuit structure from the tile of origin. If direct streaming is not possible, in some embodiments, signals are routed to other destination tiles, using unoccupied routing resources (i.e., routing resources not used by the user design of the IC), and then transmitted to the secondary circuit structure from these destination tiles. In some embodiments, some or all routes (direct and indirect) are rapidly computed by a software module. In some embodiments, the software module computes these routes as soon as the user selects which signals will be traced.

As a user selects signals for tracing, the debugging tool of some embodiments automatically determines the amount of deskew necessary for each user signal based upon data from the EDB. In some embodiments, the debugging tool programs the deskew circuitry so that signals arrive at the trigger unit in the same relative order as they originated in the physical fabric. In some embodiments, the deskew unit may also deliver user-signal data to the trace buffer for capture.

In some embodiments, some or all user signals of an IC can be selected for capture in the trace buffer. In cases where the signal may not physically exist (e.g., it may have been optimized away), or where the signal does not pass through a storage element that is accessible through the secondary circuit structure (e.g., a UDS element), the signal is automatically regenerated in the software component of the debugging tool by finding extant primary inputs for the requested signal that pass through configurable storage elements, tracing them, and regenerating the user signal values after uploading the trace-buffer contents to the host running the software.

a. Passive Mode Example—Memory Tracing

Figure 50:
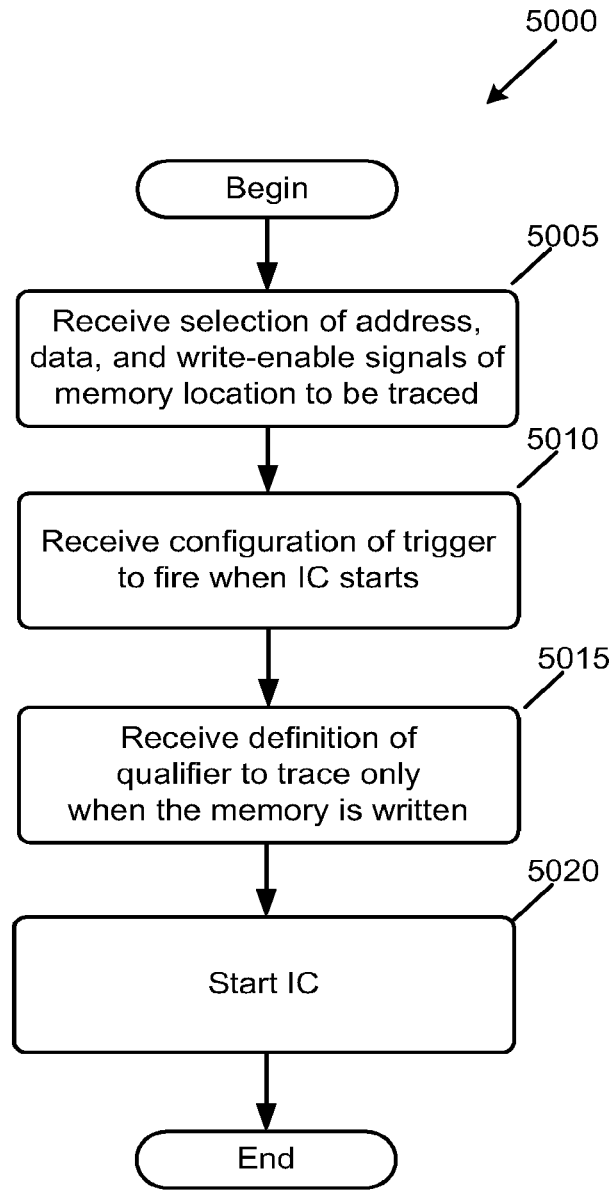
FIG. 50 illustrates a process that traces the values stored at a specific memory address using qualification in passive mode

The debugging tool of some embodiments can trace all memory inputs and outputs in passive mode. Several memory-tracing scenarios are possible. For instance, FIG. 50 illustrates a process 5000 that traces the values stored at a specific memory address using qualification. The process starts by receiving (at 5005) a selection of the user memory, address, data, and write-enable signals for tracing the memory of interest. As discussed above, the user memory may be selected by its RTL names. Next, the process receives (at 5010) a configuration of the trigger to fire as soon as the IC commences operation. In some embodiments, this is done by configuring a trigger condition that is known to be true, such as comparing a value to the same value. The process then receives (at 5015) a configuration of the qualifier so that the values that are captured for viewing by the user (e.g., stored in the trace buffer) are values that are present in the specified memory at the specified address when writes occur to the memory. The process then starts (at 5020) the operation of the IC.

With the trigger unit configured this way (i.e., a trigger event that fires immediately and a qualifier that filters the stored signals to allow tracing only when the specified memory address is written), the last value written to the trace buffer is the current value stored by the memory at the specified address. If no values are written to the trace buffer, then this indicates that the memory address has not been written to, and it contains its initial value. While this process has been described in the context of tracing a single memory location, one skilled in the art would recognize that this technique can also be used to trace multiple memory locations (i.e., multiple addresses of the same or different memories).

Another example of a method of memory tracing of some embodiments provides complete reconstruction of a memory, as opposed to tracing a single memory location. Such a process is similar to the process 5000 described above. The same signals as in the previous example are traced, and the trigger is configured to fire immediately. However, the qualifier is configured so that it stores data to the trace buffer when any memory location is written. In this way, it is possible to recreate the current complete contents of the traced memory without interfering with circuit operation.

VII. Monitoring Asynchronous Clock Domains

Modern programmable devices generally contain specialized routing networks that can transmit clock signals long distances on an IC. In some embodiments, an IC includes multiple clocks, each with its own global clock network. A clock domain is (1) a specific global clock network and (2) all of the circuit elements associated with it. For example, if a state machine implemented on a programmable device is clocked by a global clock network named "Z," then the clock domain would consist of global clock network Z and all of the circuitry that implements the state machine.

Circuits implemented in different, asynchronous clock domains communicate with each other using interfacing techniques that reduce the probability that metastability would cause the circuit to malfunction. Data, and in some cases, control signals, are typically transmitted to a different clock domain using a FIFO queue having read and write ports. The "read" port of the FIFO queue resides in the receiving domain, while the "write" port resides in the transmitting domain. Control signals are often transmitted by synchronizers, which, in some embodiments, are implemented as a serial chain of two or more D flip-flops that are clocked by the receiving clock domain. In some embodiments, synchronizers ensure that the signals received by the receiving clock domain are synchronous with the receiving clock domain (i.e., the receiving clock domain receives the control signals according to the receiving clock domain's clock).

In some embodiments, data within a given clock domain is transmitted by time-division multiplexing ("TDM") data onto a single physical wire, using a sub-cycle clock associated with that clock domain as the time base. The sub-cycle clock defines when data is valid on each physical wire. In some embodiments, there are multiples sub-cycles per user cycle in each clock domain.

In some embodiments, the sub-cycle clock signals in two asynchronous clock domains are completely unrelated. In other words, it is not possible to know when a receiving clock domain will sample data from a transmitting asynchronous clock domain. All that is known in such a scenario is that the receiving domain will sample the transmitting domain data multiple times per user cycle. In some embodiments, prior to transmitting data to an asynchronous clock domain, the data to be transmitted is held steady in a UDS element long enough for the receiving clock domain to correctly read it. Some embodiments hold the data steady for one full user cycle (i.e., multiple sub-cycles).

Whenever operating in passive mode, some embodiments use a single clock to capture some or all data and place it on the secondary circuit structure for transmission to debug circuitry. In some embodiments, ICs are debugged one clock domain at a time. In such cases, the clock of the debugging tool is completely synchronized with the sub-cycle clock of the domain being debugged and TDM signals can be directly and accurately captured, without needing to be held for any additional duration of time in a UDS element.

Figure 51:
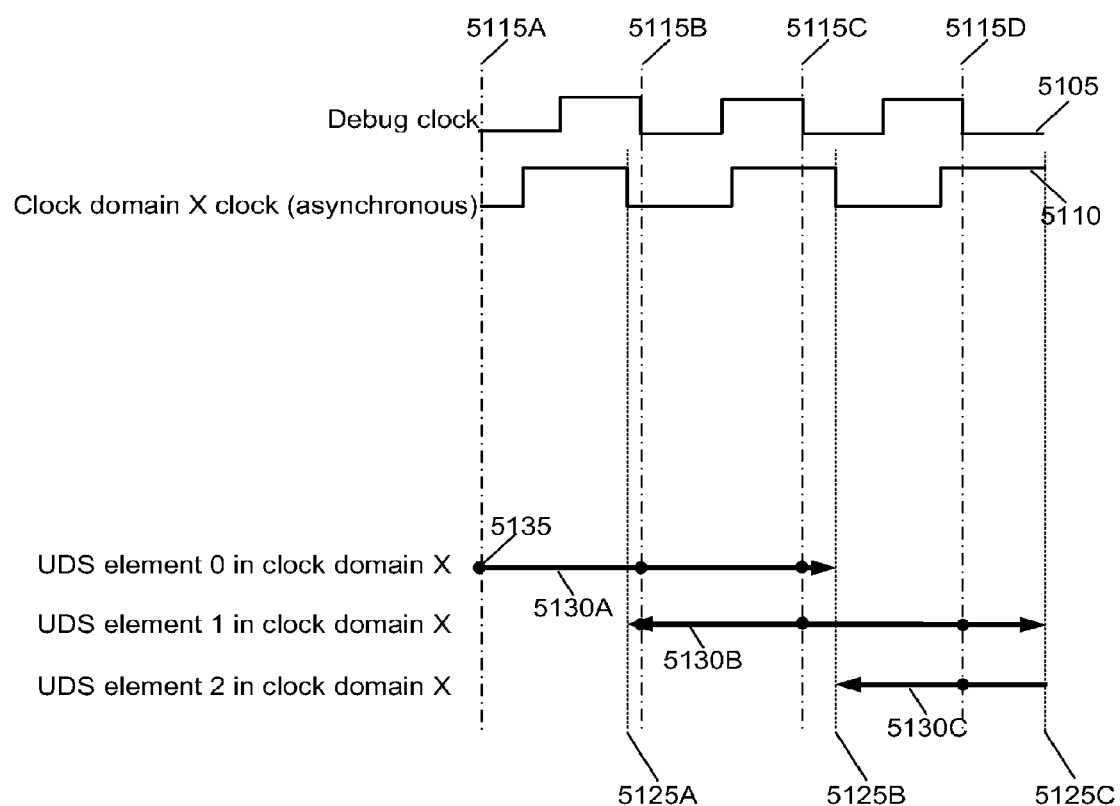
FIGS. 51 and 52 illustrate a methodology of some embodiments of capturing data using a faster debug clock to capture signals in an asynchronous clock domain.

In some embodiments, the receiving clock domain is a debug clock domain corresponding to the secondary circuit structure. In some such embodiments, the debug clock domain's clock is faster than the clock of the clock domain to be debugged. FIG. 51 illustrates such a methodology of capturing data using a faster debug clock to capture signals in an asynchronous clock domain. FIG. 51 illustrates a debug clock 5105 and a clock 5110 of clock domain "X," which is asynchronous to the debug clock 5105. In other words, the asynchronous clock 5110 has no known phase relationship with the debug clock 5105. In some embodiments, two clocks are synchronous if they are identical. In some embodiments, two clocks are synchronous if they have a known phase relationship (e.g., some formula or value can be applied to a clock to attain an identical clock as the synchronous clock).

The asynchronous clock 5110 of this example operates on a sub-cycle basis, in which there are two sub-cycles for each user cycle. While this example is presented in the context of an asynchronous clock 5110 with two sub-cycles for each user cycle, one skilled in the art would recognize that the same methodology can apply for an asynchronous clock with any number of sub-cycles per user cycle. The sub-cycles of clock domain X are denoted by the dotted lines 5125A-C. The falling edges of the debug clock 5105 are represented by dashed lines 5115A-D. In some embodiments, the debug clock 5105 is a sub-cycle clock (i.e., each edge of the debug clock 5105 signifies the beginning or end of a sub-cycle). In some embodiments, the debug clock 5105 is not a sub-cycle clock (i.e., each edge of the debug clock 5105 signifies the beginning or end of a user cycle in the debug clock's clock domain). In this example, the falling edge of the debug clock 5105 represents when the secondary circuit structure reads values of the circuits of clock domain X.

The debug clock 5105 is faster than the asynchronous clock 5110. In other words, in any given duration of time, the debug clock 5105 has more edges than the asynchronous clock 5110 of clock domain X. As shown in the figure, the debug clock 5105 of some embodiments is faster than, but less than twice as fast as, the asynchronous clock 5110 of clock domain X. In other embodiments, the debug clock is more than twice as fast as the asynchronous clock 5110.

In this figure, the falling edge of the asynchronous sub-cycle clock 5110 indicates when a value in clock domain X is valid (i.e., when a specified set of circuits holds a value). However, because the debug clock 5105 is asynchronous with the clock domain X clock 5110, these values cannot be directly read, as the secondary circuit structure (which operates at the debug clock rate) does not read these values at these times. In order to remedy this, in some embodiments, when a new value is stored in the set of user circuits, that value is also stored in a UDS element (e.g., a time via). In some embodiments, the UDS element in which that value is stored is an unused UDS element (i.e., a UDS element that is not used by the user design of the IC). The values stored in domain X are demultiplexed and held steady by sampling them and holding them steady in these UDS elements in their "home" clock domain (i.e., clock domain X). The UDS element of some embodiments holds the signal steady through the entire user cycle (i.e., the two sub-cycles that make up the user cycle in this example). While held steady for the entire user cycle, the signal is read by the secondary circuit structure, as described above.

The times these signals are captured from the UDS elements is represented by several dots 5135 at the intersection of the UDS elements holding these signals steady and the debug clock rate. In some embodiments, the UDS elements are read, or sampled, at the debug clock rate. As shown by the figure, the first data value 5130A, stored in UDS element 0, is read by the secondary circuit structure at falling edges 5115A-C of the debug clock 5105. The second data value 5130B, stored in UDS element 1, is read by the secondary circuit structure at falling edges 5115B-D. The third data value 5130C, stored in UDS element 2, is read by the secondary circuit structure at falling edges 5115D. Since the first and third data values 5130A and 5130C are not fully shown in the figure, other times at which the secondary circuit structure samples these values in their respective UDS elements are not shown. Additionally, since the first and third data values are not stored in UDS elements for reading by the secondary circuit structure during overlapping time periods (i.e., non-overlapping user cycles), they may both be stored in the same UDS element. For instance, UDS element 0 could consecutively store the first data value 5130A and the third data value 5130C.

This figure represents an embodiment in which signals are captured on the falling edge of the debug clock 5105. However, in other embodiments, signals are captured at other times (e.g., the rising edge of the debug clock 5105) in addition to, or in lieu of the falling edge of the debug clock 5105. As is apparent from the figure, each user clock cycle of the asynchronous clock domain 5110 corresponds to one or more overlapping falling edges of the debug clock 5105. This denotes that the asynchronous clock domain is sampled one or more times per user clock cycle of the asynchronous clock domain (i.e., the amount of time each data value 5130A-C is stored in a UDS element for reading by the secondary circuit structure). Therefore, no values stored by the circuitry of the asynchronous clock domain during any clock cycle of the asynchronous clock domain are not sampled, even though the debug clock 5105 bears no discernable phase relationship to the asynchronous clock 5110. In other words, every value stored by the selected circuits of the asynchronous clock domain X are read by the secondary circuit structure.

FIG. 51 above describes a methodology of debugging a single clock domain that is asynchronous to the debug clock. However, one skilled in the art would recognize that multiple asynchronous clock domains could be monitored simultaneously using similar methodology. Furthermore, in some embodiments, one or more clock domains to be monitored are synchronous with the debug clock. As mentioned above, in some embodiments, the signals from these clock domains need not be held steady in a UDS element for a user cycle in order to be accurately read. Thusly, some embodiments monitor a combination of clock domains that are both synchronous and asynchronous with the debug clock.

Figure 52:
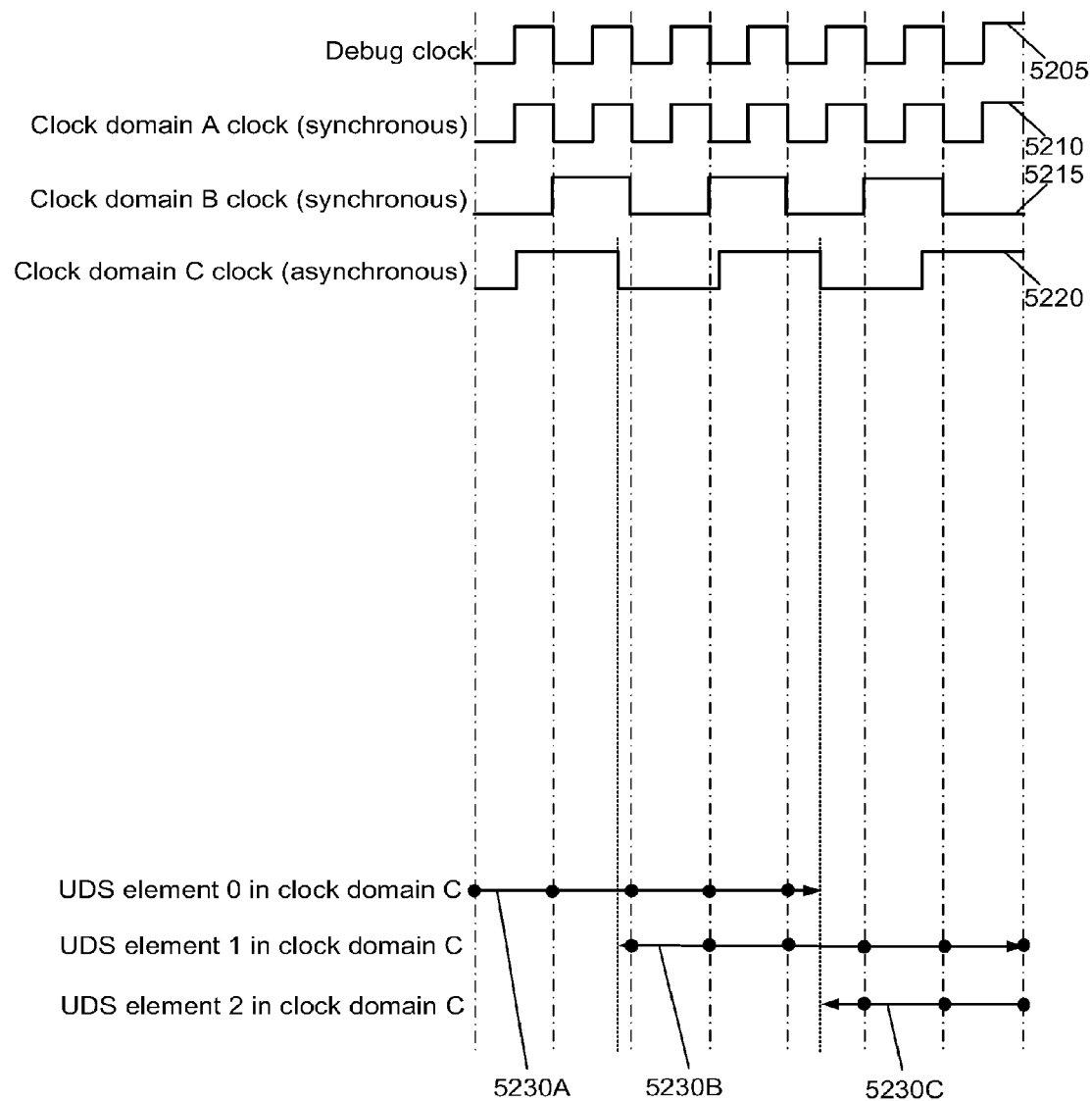

FIG. 52 illustrates some embodiments in which a debug clock is synchronous to multiple clock domains that are to be monitored and asynchronous to another clock domain that is to be monitored. In this figure, four clocks are shown: a debug clock 5205, a clock 5210 corresponding to a first synchronous clock domain A, a clock 5215 corresponding to a second synchronous clock domain B, and a clock 5220 corresponding to a second asynchronous clock domain C. In other words, the clocks 5210 and 5215 of clock domains A and B are synchronous with the debug clock 5205 (and each other), while the clock 5220 is asynchronous with the other three clocks 5205, 5210, and 5220. While clock domain B's clock 5215 is not identical to the debug clock 5205, a value can be applied to domain B's clock 5215 in order to attain a clock that is identical to the debug clock 5205.

Because the debug clock 5205 is synchronized with the clocks 5210 and 5215 of clock domains A and B, the values stored in circuits of clock domains A and B are handled just as in the single clock domain case described above (i.e., they are directly read out from these circuits, and are not held steady in a UDS element). However, clock domain C's clock 5220 is asynchronous to the debug clock 5205 and requires special handling, as described above in FIG. 51. Namely, each data value (e.g., data values 5230A, 5230B, and 5230C) in clock domain C must be demultiplexed and held steady in a UDS element for a user cycle of clock domain C so that the data values 5230A, 5230B, and 5230C can be sampled at the debug clock rate.

VIII. Configurable IC and System

Figure 53:
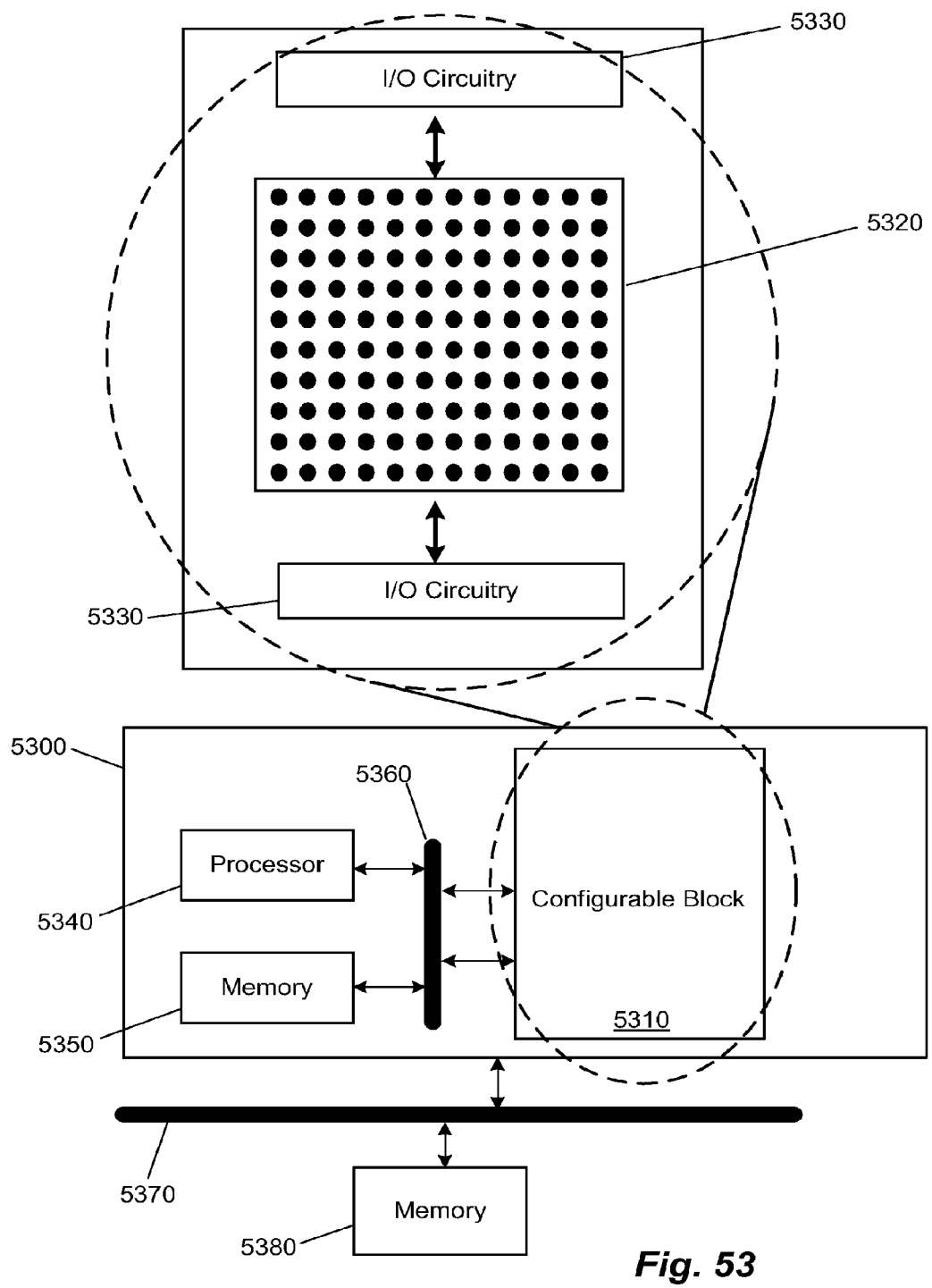
FIG. 53 illustrates a system on a chip IC of some embodiments.

Some embodiments described above are implemented in electronic devices with one or more configurable ICs that can compute configurable combinational digital logic functions on signals that are presented on the inputs of the configurable ICs. A configurable IC of the invention can also include circuits other than a configurable circuit arrangement and I/O circuitry. For instance, FIG. 53 illustrates a system on chip ("SoC") embodiment of a configurable IC 5300. This IC 5300 includes a configurable block 5310, which includes a configurable circuit arrangement 5320 and I/O circuitry 5330 for this arrangement. The IC 5300 also includes a processor 5340 outside of the configurable circuit arrangement, a memory 5350, and a bus 5360, which conceptually represents all conductive paths between the processor 5340, memory 5350, and the configurable block 5310. As shown in FIG. 53, the IC 5300 couples to a bus 5370, which communicatively couples the IC 5300 to other circuits, such as the off-chip memory 5380. Bus 5370 conceptually represents all conductive paths between the system components.

This processor 5340 can read and write instructions and/or data from an on-chip memory (e.g., memory 5350) or an off-chip memory (e.g., memory 5380). The off-chip memory 5380 can be non-volatile memory (e.g., flash memory) that stores the configuration data, which is then loaded onto the IC at power up. The on-chip memory 5350 can also be non-volatile to store the configuration data to load onto the IC at power up. The processor 5340 can also communicate with the configurable block 5310 through memory 5350 and/or 5370 through buses 5310 and/or 5330. Similarly, the configurable block can retrieve data from and supply data to memories 5320 and 5325 through buses 5310 and 5370.

Figure 54:
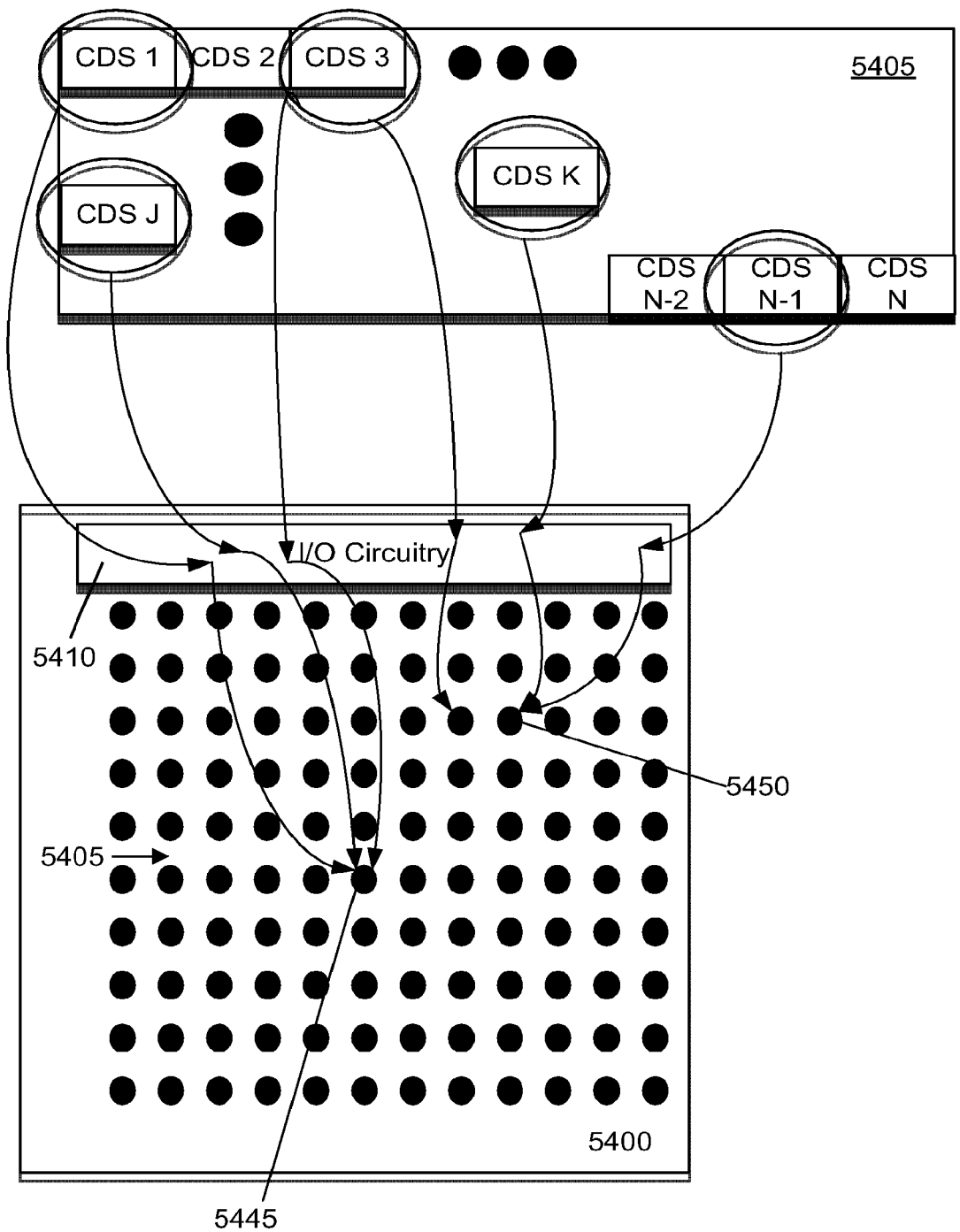
FIG. 54 illustrates the transfer of configuration data from the data pool to the configurable circuits of the IC of some embodiments.

The data also includes in some embodiments configuration data that configure the nodes to perform particular operations. FIG. 54 illustrates a more detailed example of this. Specifically, this figure illustrates a configuration data pool 5405 for the configurable IC 5300. This pool includes N configuration data sets ("CDS"). As shown in FIG. 54, the input/output circuitry 5310 of the configurable IC 5300 routes different configuration data sets to different configurable nodes of the IC 5300. For instance, FIG. 54 illustrates configurable node 5445 receiving configuration data sets 1, 3, and J through the I/O circuitry, while configurable node 5450 receives configuration data sets 3, K, and N−1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 55:
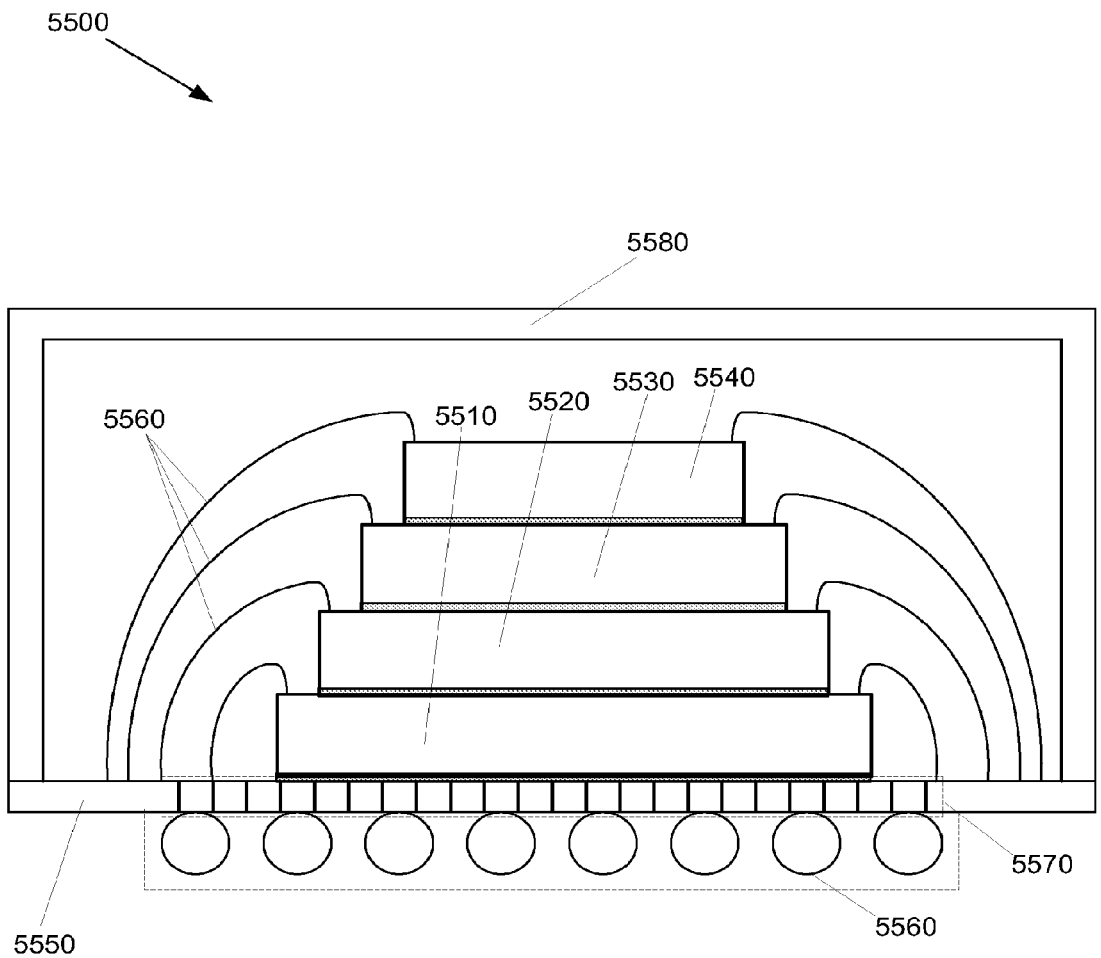
FIG. 55 illustrates a system in a package IC of some embodiments.

Instead of, or in conjunction with, the SoC embodiment for a configurable IC, some embodiments might employ a system in package ("SiP") embodiment for a configurable IC. FIG. 55 illustrates one such SiP 5500. As shown in this figure, SiP 5500 includes four ICs 5510, 5520, 5530, and 5540 that are stacked on top of each other on a substrate 5550. At least one of these ICs is a configurable IC that includes a configurable block, such as the configurable block 5310 of FIG. 54. Other ICs might be other circuits, such as processors, memory, etc.

As shown in FIG. 55, the IC communicatively connects to the substrate 5550 (e.g., through wire bondings 5560). These wire bondings allow the ICs 5510-5540 to communicate with each other without having to go outside of the SiP 5500. In some embodiments, the ICs 5510-5540 might be directly wire-bonded to each other in order to facilitate communication between these ICs. Instead of, or in conjunction with the wire bondings, some embodiments might use other mechanisms to communicatively couple the ICs 5510-5540 to each other.

As further shown in FIG. 55, the SiP includes a ball grid array ("BGA") 5560 and a set of vias 5570. The BGA 5560 is a set of solder balls that allows the SiP 5500 to be attached to a printed circuit board ("PCB"). Each via connects a solder ball in the BGA 5560 on the bottom of the substrate 5550, to a conductor on the top of the substrate.

The conductors on the top of the substrate 5550 are electrically coupled to the ICs 5510-5540 through the wire bondings. Accordingly, the ICs 5510-5540 can send and receive signals to and from circuits outside of the SiP 5500 through the wire bondings, the conductors on the top of the substrate 5550, the set of vias 5570, and the BGA 5560. Instead of a BGA, other embodiments might employ other structures (e.g., a pin grid array) to connect a SiP to circuits outside of the SiP. As shown in FIG. 55, a housing 5580 encapsulates the substrate 5550, the BGA 5560, the set of vias 5570, the ICs 5510-5540, the wire bondings to form the SiP 5500. This and other SiP structures are further described in U.S. patent application Ser. No. 11/081,820 entitled "Programmable System in Package."

Many of the above-described components implement some or all the above described functionality through software processes that are specified as a set of instructions recorded on a machine readable medium (also referred to as computer readable medium). When these instructions are executed by one or more computational element(s) (such as processors or other computational elements like application specific ICs ("ASICs") and field programmable gate arrays ("FPGAs")), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 56:
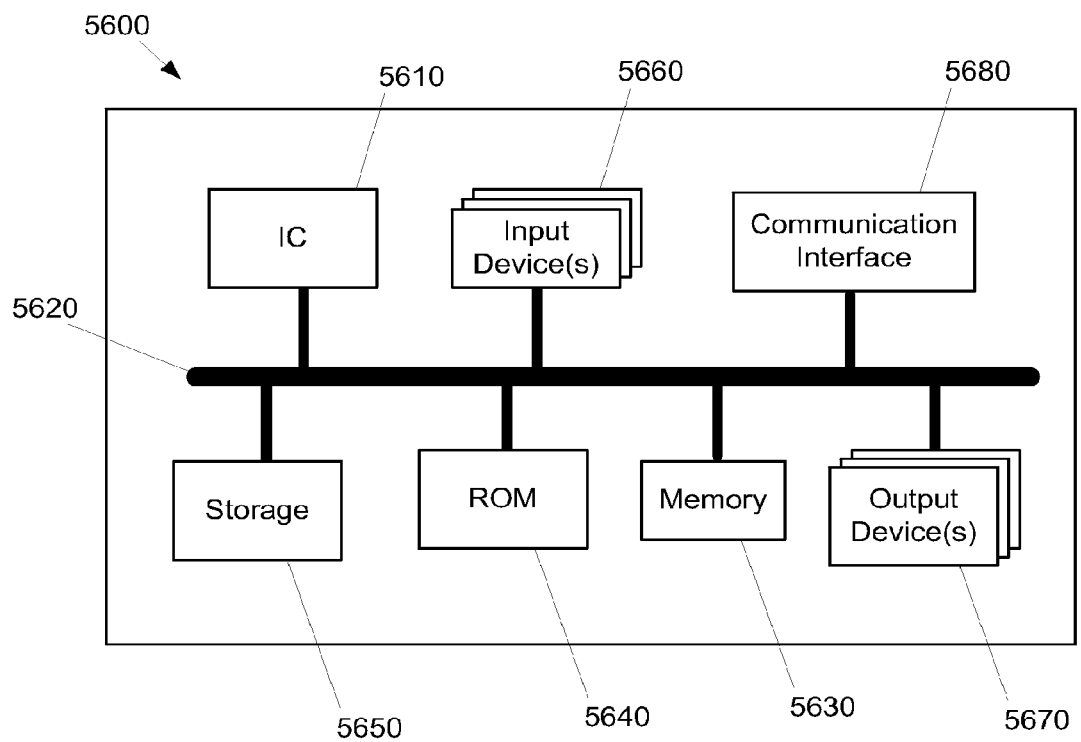
FIG. 56 illustrates a computer system of some embodiments.

FIG. 56 illustrates a computer system with which some embodiments of the invention are implemented. Such a computer system includes various types of computer readable mediums and interfaces for various other types of computer readable mediums. Computer system 5600 includes a bus 5605, a processor 5610, a system memory 5615, a read-only memory 5620, a permanent storage device 5625, input devices 5630, and output devices 5635.

The bus 5605 collectively represents all system, peripheral, and chipset buses that communicatively connect the numerous internal devices of the computer system 5600. For instance, the bus 5605 communicatively connects the processor 5610 with the read-only memory 5620, the system memory 5615, and the permanent storage device 5625. From these various memory units, the processor 5610 retrieves instructions to execute and data to process in order to execute the processes of the invention.

The read-only-memory ("ROM") 5620 stores static data and instructions that are needed by the processor 5610 and other modules of the computer system. The permanent storage device 5625, on the other hand, is a read-and-write memory device. This device is a non-volatile memory unit that stores instructions and data even when the computer system 5600 is off. Some embodiments of the invention use a mass-storage device (such as a magnetic or optical disk and its corresponding disk drive) as the permanent storage device 5625.

Other embodiments use a removable storage device (such as a floppy disk, flash drive, or ZIP® disk, and its corresponding disk drive) as the permanent storage device. Like the permanent storage device 5625, the system memory 5615 is a read-and-write memory device. However, unlike storage device 5625, the system memory is a volatile read-and-write memory, such a random access memory ("RAM"). The system memory stores some of the instructions and data that the processor needs at runtime. In some embodiments, the invention's processes are stored in the system memory 5615, the permanent storage device 5625, and/or the read-only memory 5620.

The bus 5605 also connects to the input and output devices 5630 and 5635. The input devices enable the user to communicate information and select commands to the computer system. The input devices 5630 include alphanumeric keyboards and pointing devices (also called "cursor control devices"). The input devices 5630 also include audio input devices (e.g., microphones, MIDI musical instruments, etc.). The output devices 5635 display images generated by the computer system. For instance, these devices display a GUI. The output devices include printers and display devices, such as cathode ray tubes ("CRT") or liquid crystal displays (LCD).

Finally, as shown in FIG. 56, bus 5605 also couples computer 5600 to a network 5665 through a network adapter (not shown). In this manner, the computer can be a part of a network of computers (such as a local area network ("LAN"), a wide area network ("WAN"), or an intranet, or a network of networks, such as the Internet. For example, the computer 5600 may be coupled to a web server (network 5665) so that a web browser executing on the computer 5600 can interact with the web server as a user interacts with a GUI that operates in the web browser.

As mentioned above, the computer system 5600 may include one or more of a variety of different computer-readable media. Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ZIP® disks, read-only and recordable blu-ray discs, any other optical or magnetic media, and floppy disks.

It should be recognized by one of ordinary skill in the art that any or all of the components of computer system 5600 may be used in conjunction with the invention. Moreover, one of ordinary skill in the art will appreciate that any other system configuration may also be used in conjunction with the invention or components of the invention.

IX. Tracking Data Dynamically

In some embodiments, the IC is provided with two or more tools, one for configuring the operations of the primary circuit structure and one for configuring the monitoring operations of the secondary circuit structure (e.g., monitoring the primary circuit structure). In some embodiments, one or more of these tools are implemented as software. The first of these two tools is a synthesis tool that performs synthesis (e.g., electronic design automation, or "EDA") of a user design. Performing synthesis may include "compiling" code that specifies the user design of the IC. In some embodiments, a user specifies the user design in hardware description language ("HDL"). Compiling the user design may include a mapping of logical user circuits (e.g., logical circuits such as AND gates, OR gates, etc. from the user design to physical circuits of the IC that are physically present on the IC, such as configurable logic circuits, configurable interconnect circuits, etc.).

The other of these two tools is a user interface tool that defines the monitoring functionality performed by the secondary circuit structure. In some embodiments, the tool can also be used to configure one or more of the circuits of the secondary network (e.g., one or more trigger circuits, event counters, etc.) in order to perform the monitoring functions. In some embodiments, the user interface tool includes one or more windows that graphically represent monitored signals within the primary circuit structure. In some embodiments, these signals include inputs of circuits, outputs of circuits, stored values of memories, etc.

The monitoring tool of some embodiments operates differently from and independently of the synthesis tool. In other words, the synthesis tool compiles a user design and generates a configuration bit stream to configure the circuits of the primary circuit structure of the IC to implement the user design. In contrast, the monitoring tool of some embodiments monitors circuits of the IC. In order to perform this monitoring, the monitoring tool of some embodiments generates a configuration bit stream to configure circuits of the secondary circuit structure in order to provide a user interface by which a user may select graphical representations of various signals and circuits of the IC to monitor.

Once the user design has been compiled by the synthesis tool and a configuration bit-stream generated for the circuits of the primary circuit structure, the resulting mapping of user design circuits to physical circuits is stored in a mapping database. The mapping database contains all of the information necessary for the debugging tool to debug the user circuit, including data that links user names (i.e., names of circuits of the user design that are represented as code, such as register transfer language ("RTL")) of user circuits to physical sites on the IC. The monitoring tool accesses this mapping database in order to correctly display signals (e.g., waveform signals, as further discussed below) corresponding to a selected set of user circuits. Once displayed, these signals may be analyzed (e.g., through visual interpretation by a user, statistics collection/analysis by another software tool, etc.). In some embodiments, the monitoring tool displays the selected signals in a display area that displays a waveform representation of the selected signals (e.g., a waveform viewer that is similar to Verdi nWave® by Novas Software).

Figure 57:
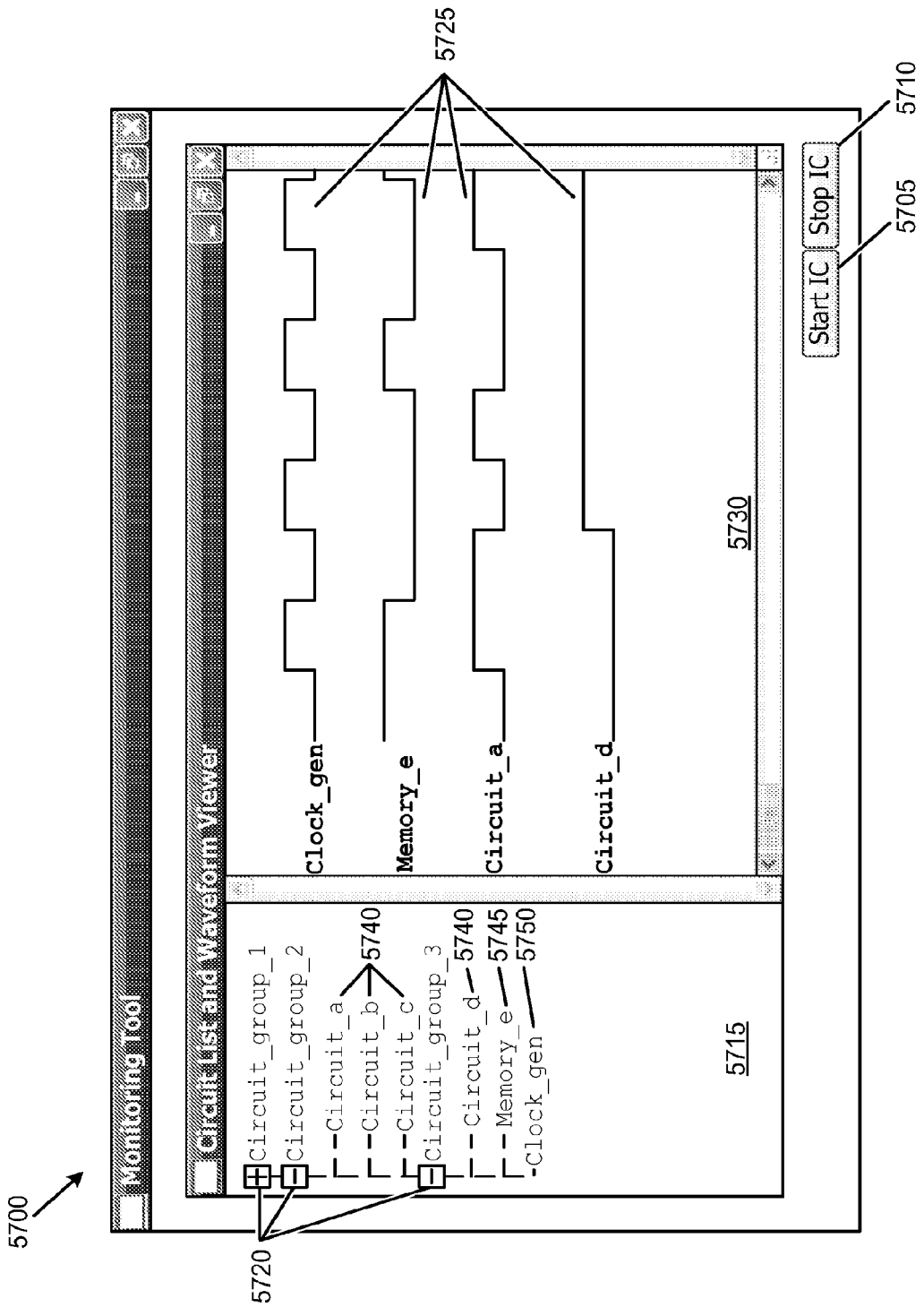
FIG. 57 illustrates a GUI of a monitoring tool of some embodiments.

FIG. 57 illustrates a GUI 5700 of some embodiments of the monitoring tool that enables real-time monitoring of circuits of the IC by allowing a user to select the circuits to monitor. The GUI 5700 includes a start button 5705, a stop button 5710, a first display area for displaying a user circuit list 5715, and a second display area for displaying waveform viewer 5730. The start button 5705 of some embodiments is used to begin operation of the IC, while the stop button 5710 of some embodiments is used to halt operation of the IC.

The start and/or stop buttons 5705 and 5710 of some embodiments control one or more clock control circuits. As mentioned above, multiple clock control circuits of the IC may be chained together, so that multiple clocks are started and/or stopped by the start and/or stop buttons 5705 and 5710. Also as mentioned above, clock control circuits (e.g., chained clock control circuits) may be controlled through an interface, such as JTAG. In addition to, or in lieu of the buttons 5705 and 5710, some embodiments provide other controls (e.g., a menu item, keyboard command, etc., not shown) to start and/or halt operation of the IC. Examples of such controls include menu items, keyboard commands, etc. (not shown).

The circuit list 5715 of some embodiments is a nested list of user design circuits 5740 and groups of user-design circuits 5720. The circuits listed in the circuit list 5715 can be user circuits of the primary circuit structure (e.g., conceptual AND gates, conceptual OR gates, etc.), user memories (e.g., Memory_e 5745), sets of user circuits (e.g., multiple AND gates, etc.), or any other type of circuit or group of circuits. The circuits listed in the circuit list 5715 can also be circuits of the secondary circuit structure (e.g., event counters, trigger circuits etc.). In some embodiments, circuits 5740 or circuit sets 5720 having subcomponents can be expanded or condensed by using controls (e.g., plus and minus symbols) that correspond to the circuit 5740 or circuit group 5720. In some embodiments, the circuit list 5715 is a flat list as opposed to a nested list. The circuit list 5715 also lists a clock circuit 5750 that generates clock signals within the IC. In some embodiments, the IC has more than one clock circuit. While the illustrated circuit list 5715 lists a number of exemplary circuits, the circuit list 5715 of some embodiments is capable of listing more or less circuits than those displayed in the figure.

A user may select one or more of the displayed circuits for monitoring. Selection of a set of user circuits to monitor includes a drag-and-drop operation in some embodiments. This drag-and-drop operation may include dragging a name representation of the set of user circuits from a display area that lists name representations of one or more sets of user circuits to the display area that displays the waveform representation of signals (e.g., the waveform viewer 5730). Some embodiments allow this selection to be performed while the IC runs (i.e., different sets of circuits can be selected and/or deselected for monitoring while the IC runs).

The monitoring tool of some embodiments interacts with a controller (e.g., controller 715 as shown above in FIG. 7) of the secondary circuit structure in order to monitor the various selected sets of circuits through the secondary circuit structure. In some embodiments, this interaction includes instructing the controller to formulate data packets (e.g., data packets addressed to the selected circuits with a "read" instruction, as discussed above in Section IV) that cause values stored by the selected circuits to be read by the secondary circuit structure. In some embodiments, these values are stored by a trace buffer of the secondary network structure (e.g., trace buffer 760 as shown above in FIG. 7), and subsequently read out from the trace buffer.

Once a set of circuits is selected for monitoring through the secondary circuit structure, these circuits are displayed in the waveform viewer in real time, i.e., within a short amount of time (e.g., less than a few minutes, less than a minute, less than ten seconds, less than one hundred milliseconds, etc.). The waveform viewer 5730 displays waveform representations 5725 of signals output by selected user circuits of the IC. In some embodiments, the waveform viewer 5730 may be, or include, a commercially available viewer, such as Verdi nWave® by Novas Software, Inc. In FIG. 57, several user circuits (i.e., Clock_gen 5750, Memory_e 5745, Circuit_a, and Circuit_d) have been selected for monitoring. A waveform 5725 for each is displayed in waveform viewer 5730. In some embodiments, the displayed waveform 5725 is displayed in real time. In other words, the waveform 5725 is updated once every minute, once every second, or even more frequently. In some embodiments, there is some latency between the values being actually present in the IC and the values being displayed in the waveform viewer 5730. In some embodiments, this latency is a fixed, known latency. In some embodiments, this latency is bounded, where the bound is dependent on the size of the IC (i.e., a larger IC would have a larger bound for the latency). In some embodiments, the latency is a small amount of time (e.g., several seconds, less than one hundred milliseconds, etc.) between the activity of a circuit of the IC and the display of that activity in the waveform viewer 5730.

In some embodiments, one or more signals displayed in the waveform viewer 5730 are saved to a log file for later review in some embodiments. Saved signals can be "replayed" in a waveform viewer in real time (i.e., the signals can be played back at the original speed at which they occurred). During replay, saved signals can also be sped up or slowed down. In some embodiments, such "replay" is performed by loading a previously saved set of monitored signals. In some embodiments, this previously saved set of monitored signals includes signals that correspond to a set of user circuits as well as timing information.

In some embodiments, as illustrated in FIG. 57, the circuit list 5715 and the waveform viewer 5730 are displayed in the same window. However, some embodiments provide the circuit list 5715 and waveform viewer 5730 in separate and independent windows of a GUI. In such cases, they may still be referred to collectively as "a GUI," even though they are in separate windows. The circuit list 5715 may be displayed at the same time as the waveform viewer 5730, the circuit list 5715 may be displayed while the waveform viewer 5730 is not displayed, or the waveform viewer 5730 may be displayed while the circuit list 5715 is not displayed in some embodiments. In some embodiments, any other number of GUIs (e.g., GUIs of other computer applications), related or unrelated, may be displayed simultaneously on a display (e.g., a computer screen) with the circuit list 5715 and/or the waveform viewer 5730.

As mentioned above, in addition to allowing selected circuits to be monitored (e.g., configurable circuits of the primary circuit structure, event counters, etc.), the GUI 5700 of the monitoring tool of some embodiments may be used to configure circuits of the secondary circuit structure. For instance, the GUI 5700 of some embodiments includes a set of user interface controls (e.g., menus, buttons, dialog boxes, windows, etc., not shown) that allow a user to specify an event condition that causes a trigger circuit of the IC to fire a trigger signal. As mentioned above, the user-specified event may be a comparison between two values, each of which may be (1) a user signal of the IC or a (2) a constant value. Accordingly, the GUI 5700 of some embodiments allows a user to specify an event by selecting one or more signals and defining one or more conditions that need to occur to define the event.

After receiving this event condition, the monitoring tool generates configuration values for the trigger circuit. Examples of these configuration values are provided above with reference to table 2. The GUI 5700 of some embodiments allows a user to define a trigger condition in terms of one or more defined events. In some such embodiments, the GUI 5700 displays events as selectable items, which the user can select to define a trigger condition. To define a trigger condition, some embodiments further allow the user to select signals to add the definition of the trigger condition. Once the trigger condition is defined, the monitoring tool formulates a configuration bit stream that configures the trigger circuit to fire upon the occurrence of the defined condition.

While this example explains that the GUI 5700 of some embodiments allows a user to specify an event condition of a trigger circuit, the GUI 5700 may be used for any configuration of any circuit of the secondary circuit structure (e.g., any configuration described above with reference to tables 1-4). For instance, the GUI 5700 of some embodiments includes a set of user interface tools (e.g., menus, buttons, etc.) for specifying a trigger mode (e.g., pre-trigger, post-trigger, or multiple capture). In some embodiments, the GUI 5700 includes a set of user interface tools for specifying an event counter mode (e.g., continuous or overall).

In some embodiments, the GUI 5700 is customizable. For instance, a user may define additional display areas for displaying other data (e.g., an additional waveform viewer for displaying archived signals that were previously recorded, etc.). The GUI 5700 may also be customized to represent data in different ways (e.g., sinusoids, oscilloscopes, analog waveforms, etc.). A user may also customize the size of display areas (e.g., increase or decrease the size of the circuit list 5715). These customizations are stored for later use by the same or a different user. In some embodiments, multiple different customizations of the GUI 5700 can be saved and loaded at a later time.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A method of controlling a clock of an integrated circuit ("IC") comprising a plurality of groups of configurable circuits for configurably performing operations of a user design based on configuration data, said method comprising:
commencing operation of said IC based on said clock; and
at a particular clock cycle of said clock:
adjusting a clock control value stored in a storage element located on a same IC die as said groups of configurable circuits;
determining whether the clock control value is equal to a predetermined value; and
upon determining that the clock control value is equal to a predetermined value, halting said clock in order to allow one or more of said groups of configurable circuits to be accessed, wherein said adjusting, determining, and halting are performed by clock control circuitry on the same IC substrate as the configurable circuits, and wherein the clock control circuitry comprises a clock control circuit, a counter, and a logic gate.

2. The method of claim 1 further comprising iteratively performing said adjusting and determining on each of a plurality of clock cycles.

3. The method of claim 1, wherein said halting causes one or more of the groups of configurable circuits to halt operation.

4. The method of claim 1, wherein said halting causes one or more other clocks of the IC to halt operation.

5. The method of claim 1, wherein said accessing comprises at least one of reading and writing.

6. The method of claim 1, wherein the IC comprises (i) a data routing network for routing data between the groups of configurable circuits and (ii) a secondary network through which the groups of configurable circuits can be accessed.

7. A method of controlling a plurality of clocks of an integrated circuit ("IC") comprising a clock control circuit, said method comprising:
operating said IC based on said plurality of clocks;
adjusting a clock counter; and
outputting, from the clock control circuit, a signal that halts a first clock of said plurality of clocks when the clock counter reaches a predetermined value, wherein said halting of the first clock causes one or more other clocks of the plurality of clocks to halt.

8. The method of 7, wherein the IC further comprises a plurality of configurable circuits that each operate based on one of said clocks, wherein halting a particular clock halts the configurable circuits that operate based on the halted particular clock.

9. The method of claim 7, wherein said IC comprises a plurality of configurable circuits for configurably performing operations of a user design, wherein the clock control circuit is on the same IC substrate as the configurable circuits.

10. A method of debugging an integrated circuit ("IC") comprising (i) a user clock, wherein each cycle of said user clock comprises a plurality of sub-cycles, and (ii) a debug clock, wherein said debug clock is asynchronous with said user clock, said method comprising:
receiving a plurality of sets of user design state ("UDS") values, wherein each of said sets of UDS values is received at a different sub-cycle of the user clock;
storing each of said plurality of sets of UDS values for more than one sub-cycle of said user clock;
adjusting a clock counter;
using clock control circuitry to determine when the clock counter has reached a predetermined value to determine edges of the debug clock; and
in response to determining edges of the debug clock, reading each stored set of UDS values.

11. The method of claim 10 further comprising:
concurrently storing two different sets of UDS values for more than one sub-cycle of the user clock; and
reading said two different sets of UDS data at a particular sub-cycle of the user clock.

12. The method of claim 10, wherein the user clock and the debug clock do not have a phase relationship.

13. The method of claim 10, wherein the user clock cannot be obtained by multiplying a constant value to the debug clock.

14. The method of claim 10, wherein said IC further comprises a plurality of user design state ("UDS") elements for storing a plurality of UDS values, wherein a particular set of UDS values is stored at a particular set of UDS elements that operate at the user clock.

* * * * *